(12) United States Patent
Yamaguchi et al.

(10) Patent No.: US 7,598,826 B2
(45) Date of Patent: Oct. 6, 2009

(54) PIEZOELECTRIC THIN FILM DEVICE HAVING A DRIVE SECTION WITH A WEIGHTED PORTION

(75) Inventors: Shoichiro Yamaguchi, Ichinomiya (JP); Yukihisa Osugi, Nagoya (JP); Tomoyoshi Tai, Nagoya (JP); Masahiro Sakai, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 276 days.

(21) Appl. No.: 11/681,346

(22) Filed: Mar. 2, 2007

(65) Prior Publication Data

US 2007/0210878 A1 Sep. 13, 2007

(30) Foreign Application Priority Data

| Mar. 8, 2006 | (JP) | 2006-062267 |
| May 17, 2006 | (JP) | 2006-137280 |
| Jul. 13, 2006 | (JP) | 2006-192743 |
| Nov. 10, 2006 | (JP) | 2006-305037 |

(51) Int. Cl.
*H03H 9/13* (2006.01)
*H03H 9/15* (2006.01)
*H03H 9/54* (2006.01)

(52) U.S. Cl. .................. 333/187; 310/312; 333/189
(58) Field of Classification Search ......... 333/187–189; 310/312, 324, 365
See application file for complete search history.

(56) References Cited

U.S. PATENT DOCUMENTS

| 6,150,703 | A | 11/2000 | Cushman et al. | |
| 6,396,200 | B2 * | 5/2002 | Misu et al. | 310/348 |
| 6,767,749 | B2 * | 7/2004 | Kub et al. | 438/3 |
| 6,788,170 | B1 | 9/2004 | Kaitila et al. | |
| 6,812,619 | B1 | 11/2004 | Kaitila et al. | |
| 6,963,155 | B1 * | 11/2005 | Wadaka et al. | 310/312 |
| 7,180,390 | B2 * | 2/2007 | Umeda et al. | 333/187 |
| 7,474,174 | B2 * | 1/2009 | Milsom et al. | 333/189 |
| 2006/0071736 | A1 | 4/2006 | Ruby et al. | |
| 2007/0200459 | A1 * | 8/2007 | Yoshino et al. | 310/324 |

FOREIGN PATENT DOCUMENTS

| JP | 08-242026 | 9/1996 |
| JP | 3136141 | 12/2000 |
| JP | 2003-133892 | 5/2003 |
| JP | 3735777 | 11/2005 |
| WO | WO 2005/034349 | * 4/2005 |

\* cited by examiner

*Primary Examiner*—Barbara Summons
(74) *Attorney, Agent, or Firm*—Burr & Brown

(57) ABSTRACT

There is provided a piezoelectric thin film device with its frequency impedance characteristic unsusceptible to spuriousness.

A film bulk acoustic resonator has a configuration where an adhesive layer, a lower electrode, a piezoelectric thin film, and an upper electrode are laminated in this order on a support substrate. A drive section of the upper electrode and a drive section of the lower electrode are opposed to each other with the piezoelectric thin film interposed therebetween. The respective drive section has a slender two-dimensional shape, with magnitude in its longitudinal direction being not less than twice, more desirably four times, and further desirably ten times, as large as magnitude in its widthwise direction.

9 Claims, 42 Drawing Sheets

F I G . 1 1
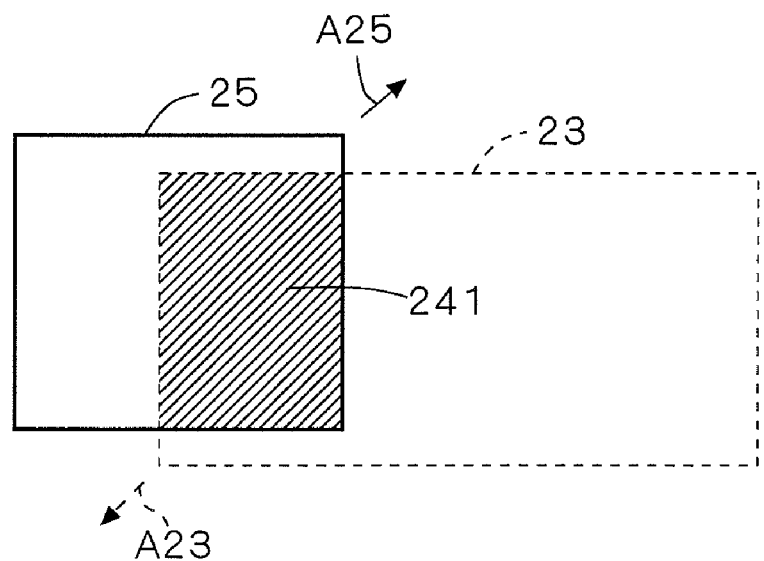
F I G . 1 2
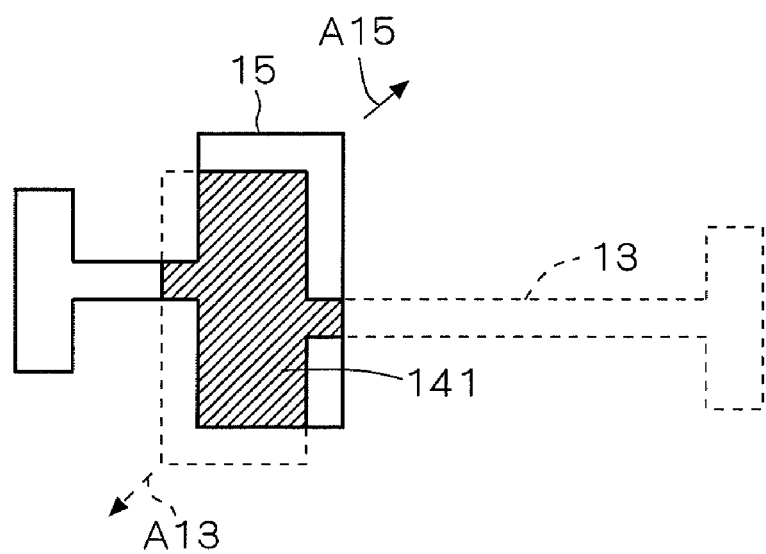

F I G . 1 4
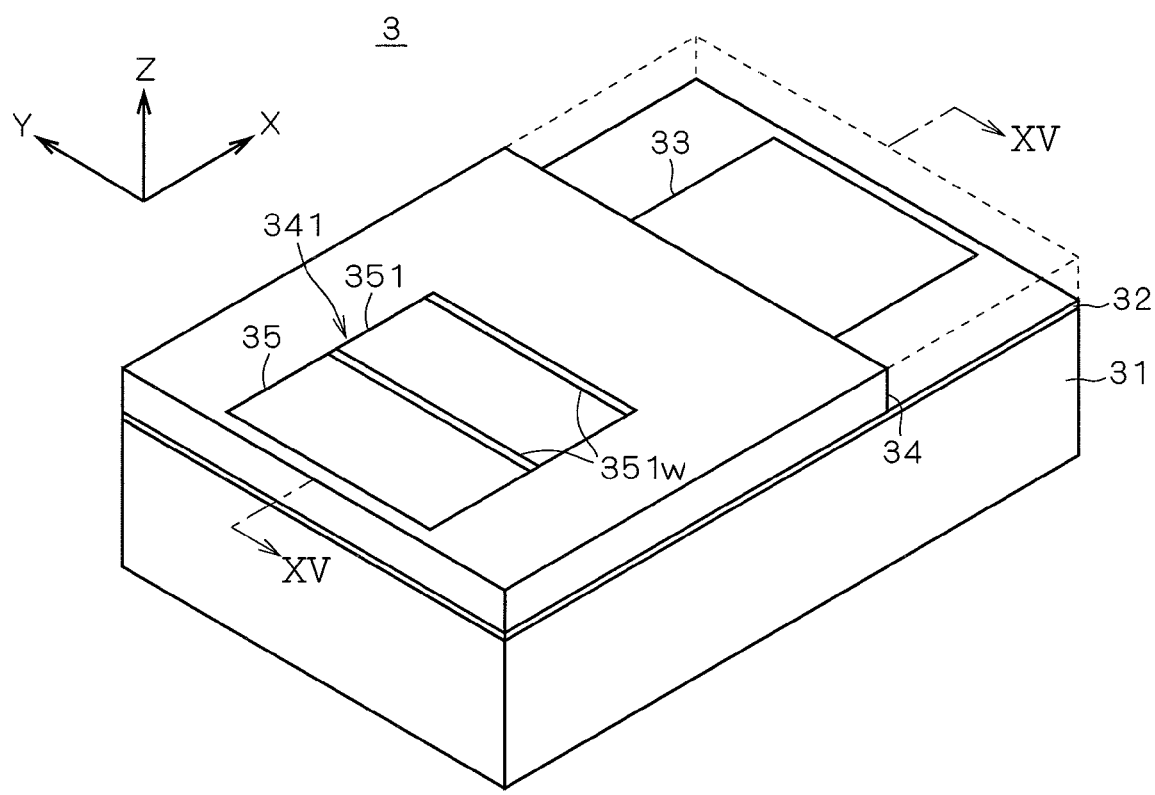

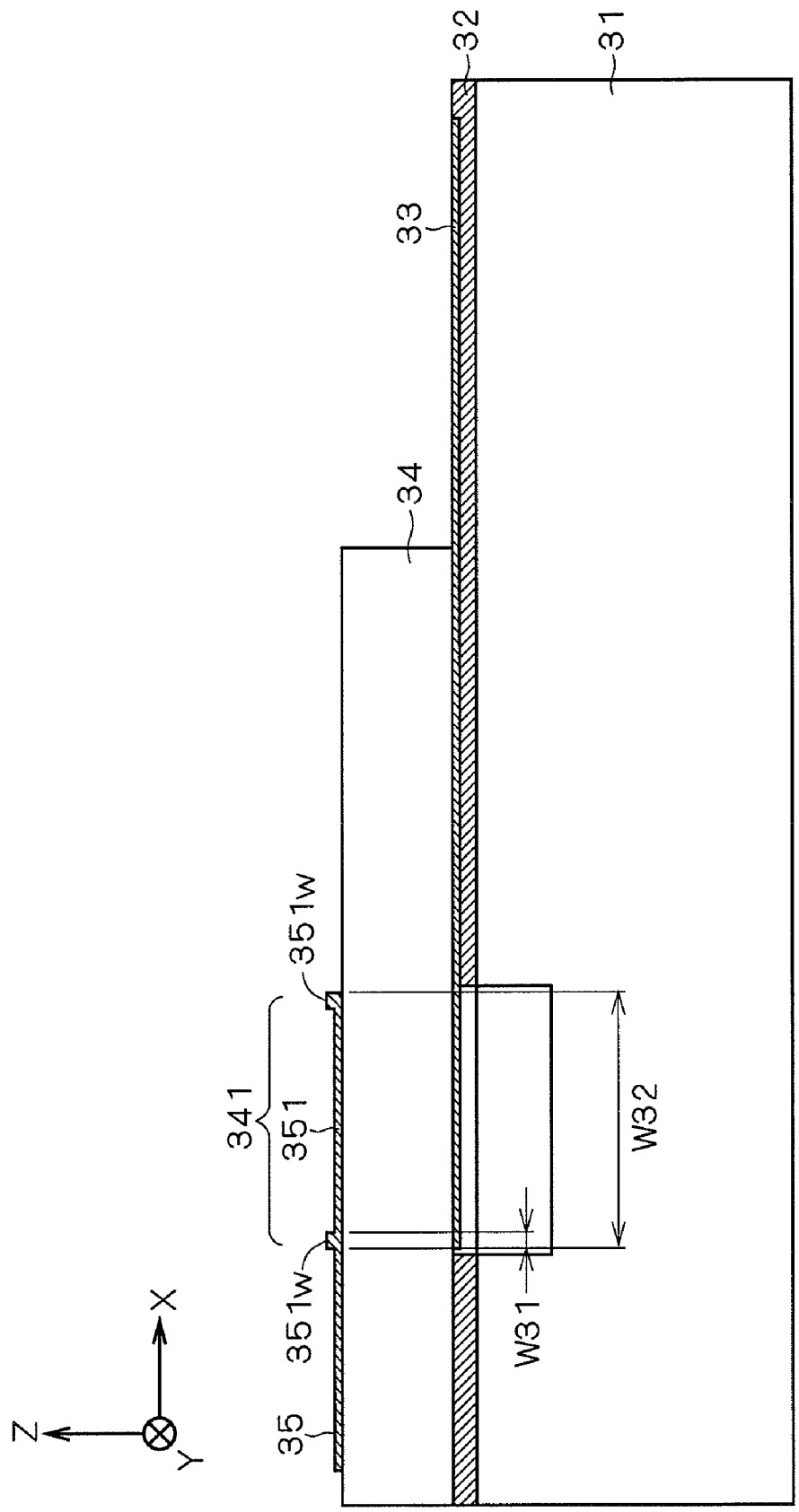

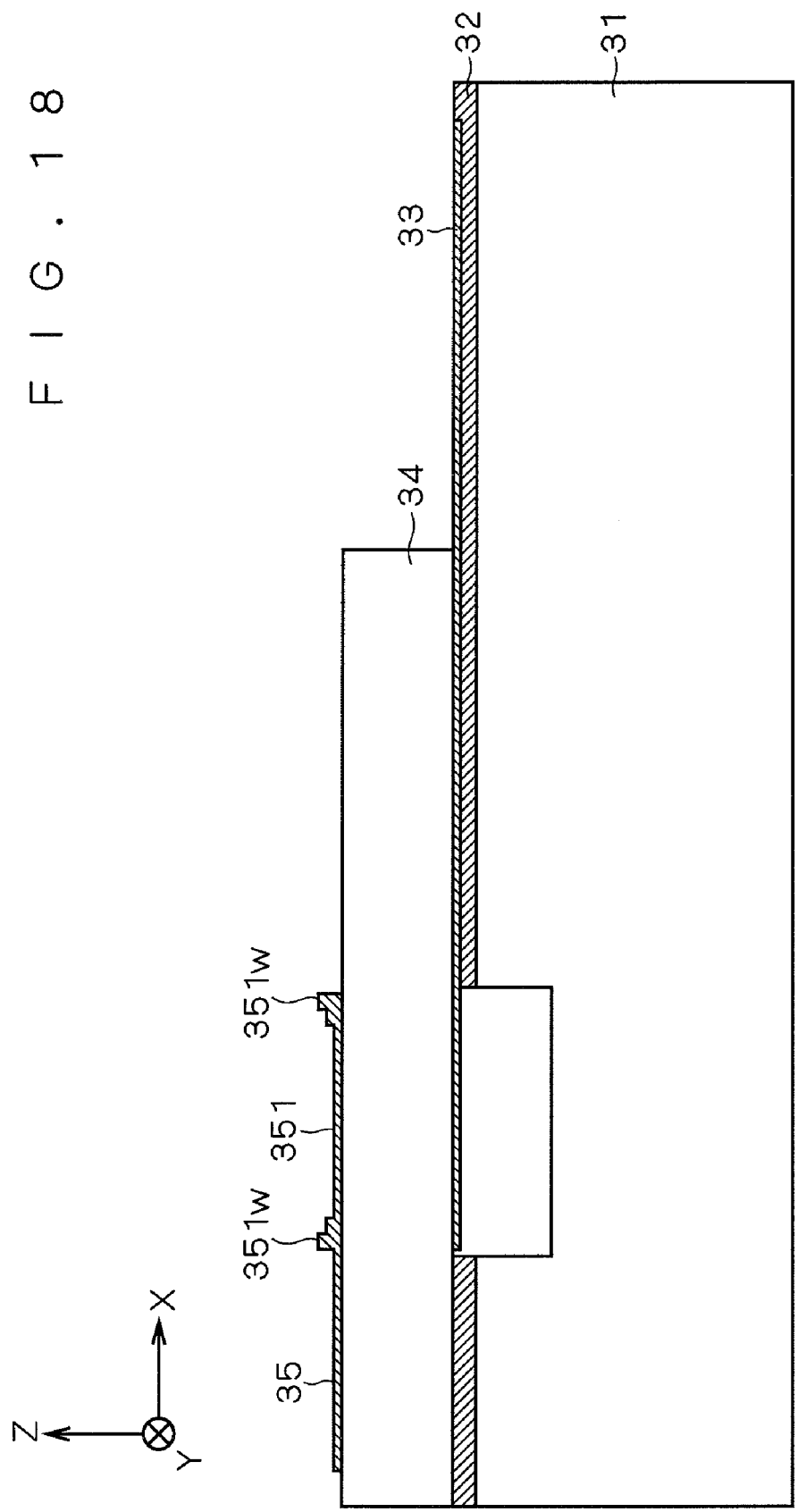

F I G . 2 2
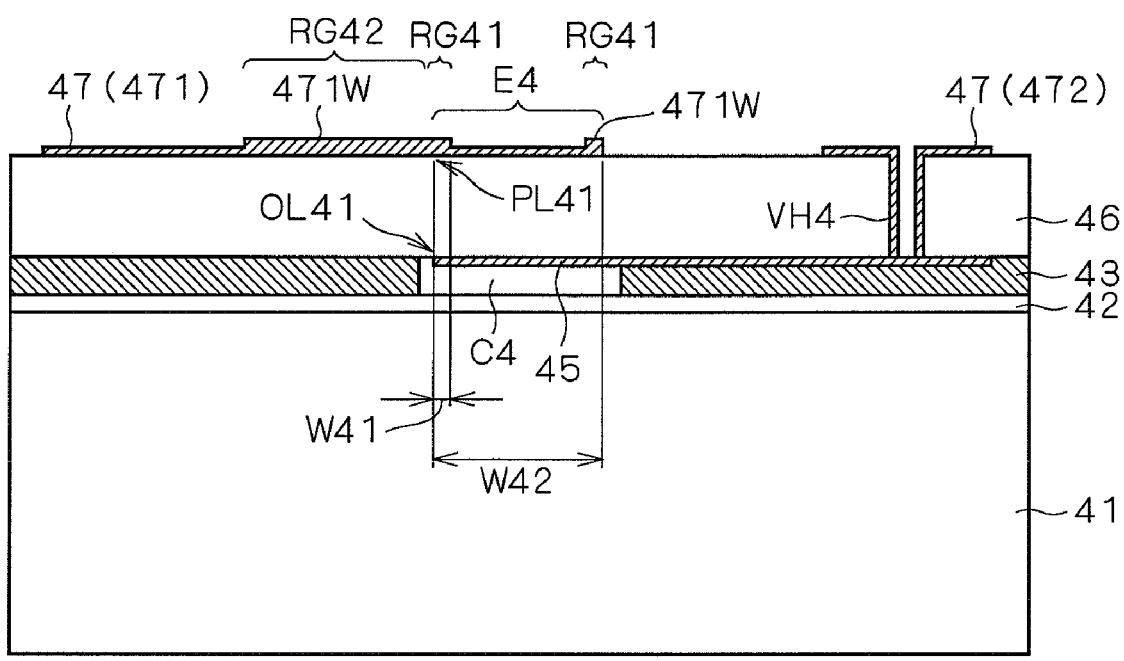

F I G . 2 3
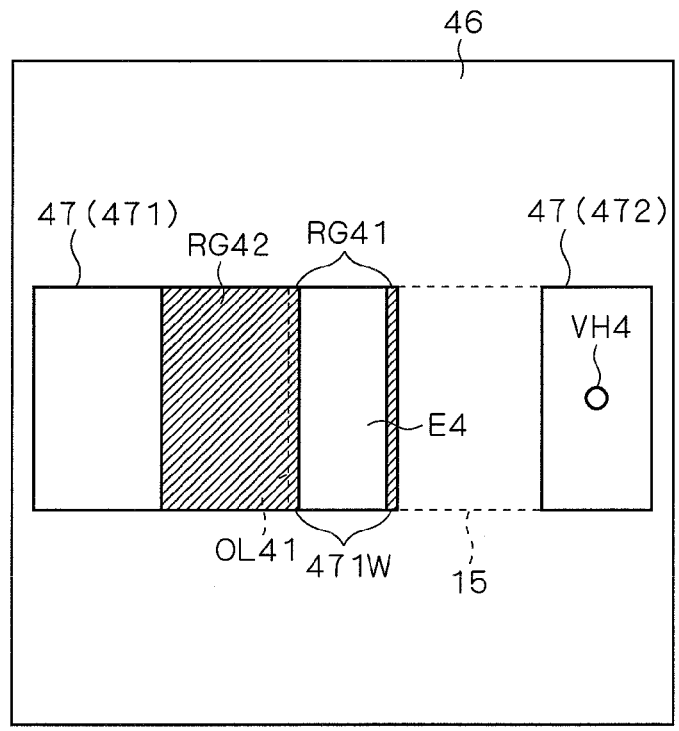
F I G . 2 4
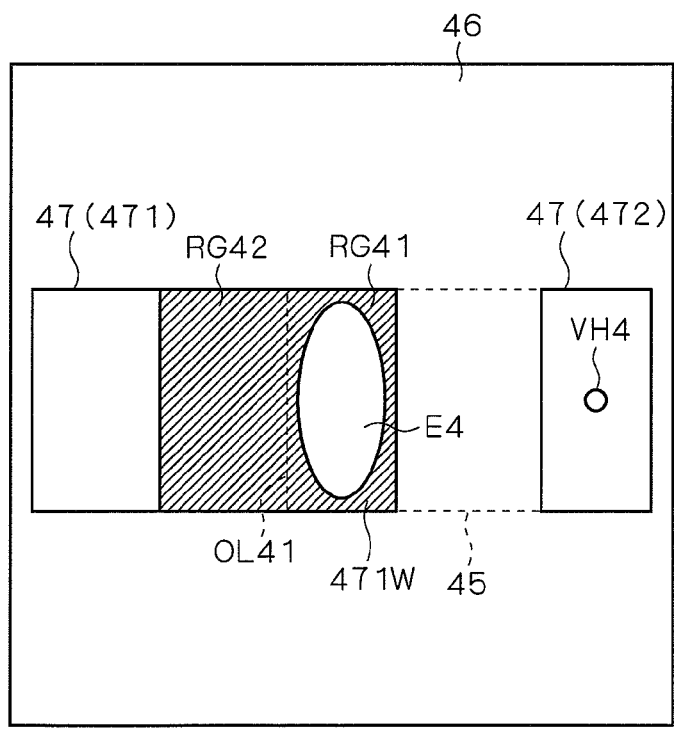

F I G . 3 1
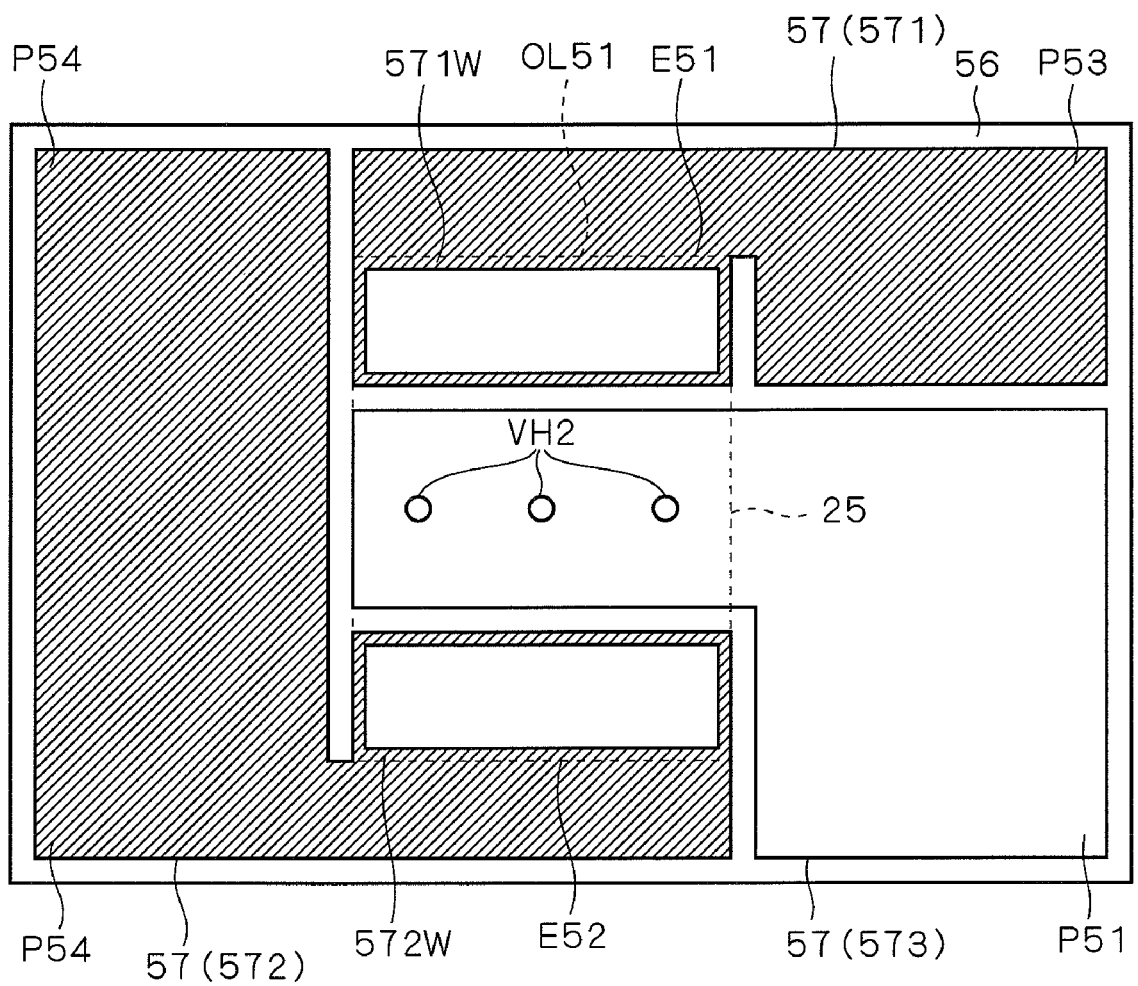

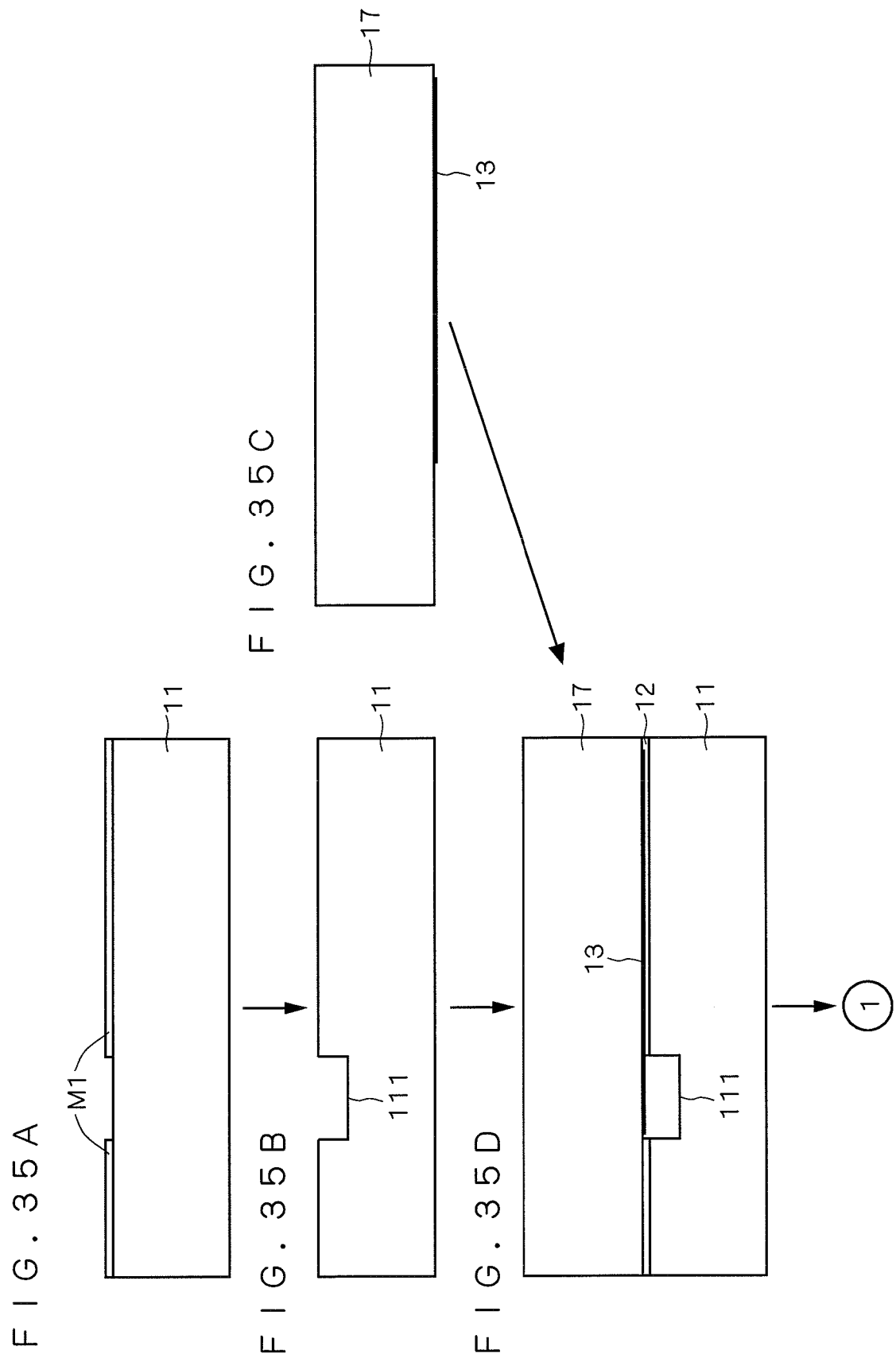

F I G. 4 4
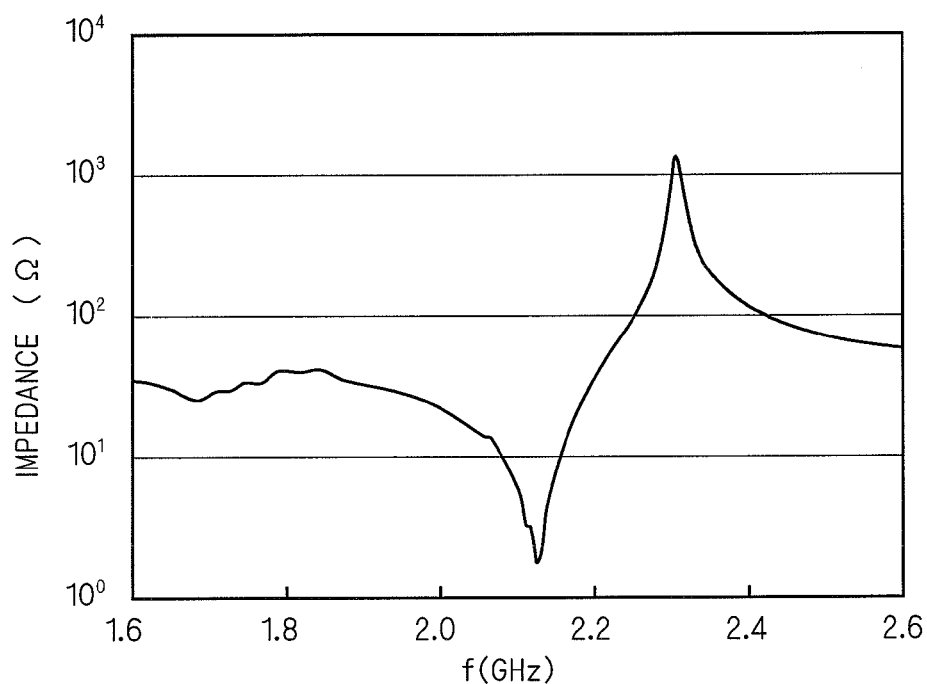
F I G. 4 5
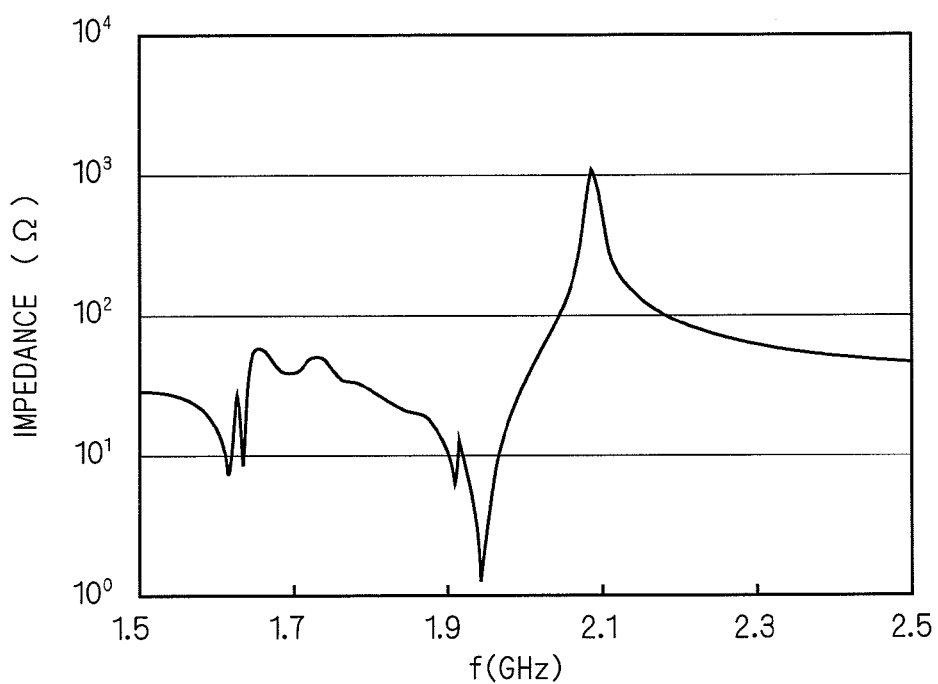

F I G . 5 4
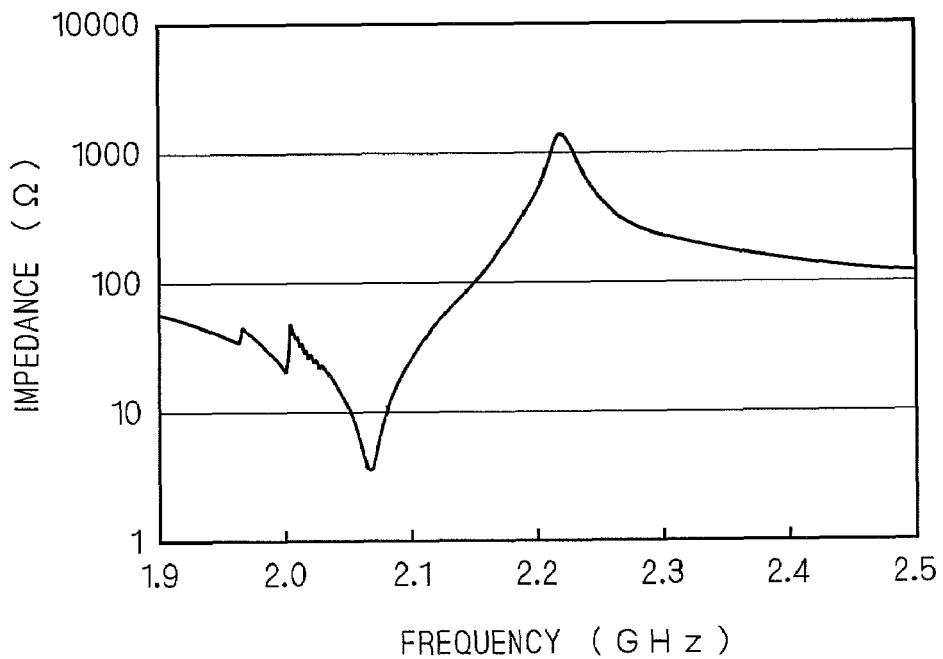
F I G . 5 5
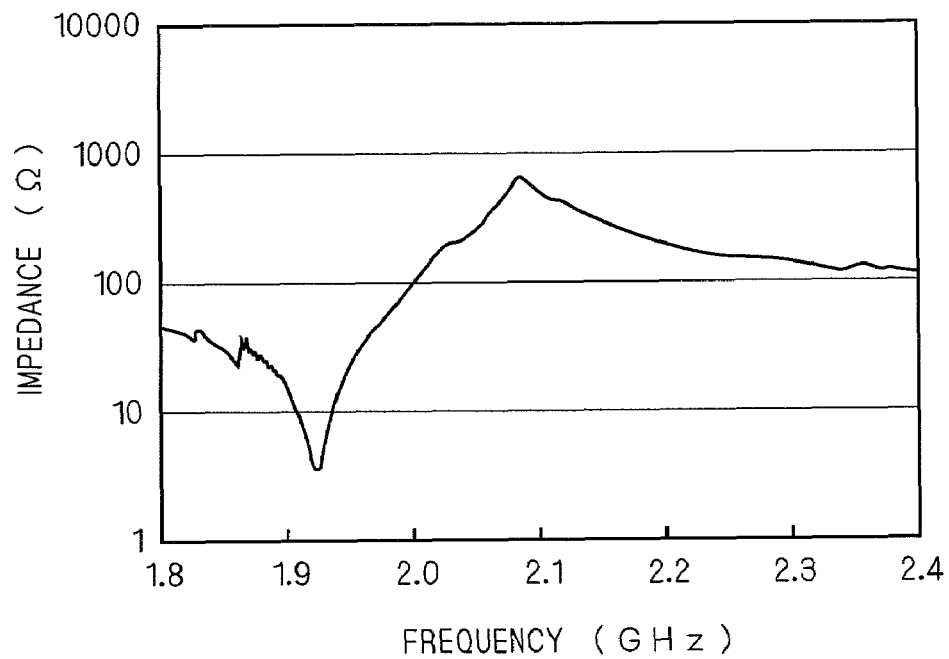

PIEZOELECTRIC THIN FILM DEVICE HAVING A DRIVE SECTION WITH A WEIGHTED PORTION

BACKGROUND OF THE INVENTION

1. Field of the Invention

The present invention relates to a piezoelectric thin film device including a single or a plurality of film bulk acoustic resonators (FBAR).

2. Description of the Background Art

FIG. 59 is an oblique view showing a schematic configuration of a main part of a conventional film bulk acoustic resonator 9.

As shown in FIG. 59, the film bulk acoustic resonator 9 includes a piezoelectric thin film 91, and an upper electrode 92 and a lower electrode 93 formed on respective main surfaces of the piezoelectric thin film 91. In the film bulk acoustic resonator 9, a square drive section 921 of the upper electrode 92 and a square drive section 931 of the lower electrode 93 are opposed to each other with the piezoelectric thin film 91 interposed therebetween, and when an excitation signal is applied to pads 923 and 933 electrically connected to the drive sections 921 and 931, an electric field is generated to excite vibrations inside the piezoelectric thin film 91 in an excitation region 911 where the drive sections 921 and 931 are opposed to each other. It is to be noted that the shapes of the drive sections 921 and 931 may not be square but may alternatively be circular.

In such a film bulk acoustic resonator 9, in order to prevent leakage of the excited vibrations from the excitation region 911 leading to generation of sub-resonance due to the outline of the piezoelectric thin film 91, an energy trapping structure is often adopted in which a cutoff frequency of acoustic waves is displaced by a means for partially changing a film thickness of the piezoelectric thin film 91, to prevent leakage of vibrations from the excitation region 911.

It should be noted that Japanese Patent Application Laid-Open No. 8 (1996)-242026 is a prior art document on the conventional film bulk acoustic resonator.

However, with the conventional film bulk acoustic resonator, there has been a problem in that in the case of using a piezoelectric material having a large electromechanical coupling factor, such as lithium niobate or lithium tantalite, a sufficient energy trapping effect cannot be obtained, and hence a frequency impedance characteristic becomes susceptible to spuriousness.

SUMMARY OF THE INVENTION

The present invention relates to a piezoelectric thin film device including a single or a plurality of film bulk acoustic resonators.

According to the present invention, a piezoelectric thin film device including a single or a plurality of film bulk acoustic resonators, the device includes: a piezoelectric thin film; and electrodes formed on respective main surfaces of the piezoelectric thin film and having drive sections opposed to each other with the piezoelectric thin film interposed therebetween, wherein the respective drive section has a slender two-dimensional shape with magnitude in a longitudinal direction being not less than twice as large as magnitude in a widthwise direction.

Accordingly, a frequency impedance characteristic of the film bulk acoustic resonator becomes insusceptible to spuriousness.

It is preferable that at least one of the drive sections has a weighted portion with a larger mass per unit area than that of a central portion, only along inner sides of a pair of opposite sides extending in the longitudinal direction.

Accordingly, the frequency impedance characteristic of the film bulk acoustic resonator can be unsusceptible to spuriousness while the influence exerted by a resonance waveform of the resonator formed by the weighted portion is avoided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a view of the upper electrode and the lower electrode formed in positions displaced from positions they should be, as seen from above;

FIG. 12 is a view of another upper electrode and another lower electrode formed in positions displaced from positions they should be, as seen from above;

FIG. 14 is an oblique view showing a schematic configuration of a film bulk acoustic resonator according to a third embodiment of the present invention;

FIG. 15 is a sectional view showing a cross section of the film bulk acoustic resonator along a cross plane line XV-XV of FIG. 14;

FIG. 18 is a sectional view showing the film bulk acoustic resonator in which a step-shaped weighted portion is arranged;

FIG. 22 is a sectional view showing a cross section of the film bulk acoustic resonator along a cross plane line XXII-XXII of FIG. 20;

FIG. 23 is a plan view showing the film bulk acoustic resonator in which a weighted portion is arranged across a region along the inner sides of a pair of opposite sides of a rectangular opposing region and a rectangular region of a feeding section adjacent to the opposing region;

FIG. 24 is a plan view showing the film bulk acoustic resonator in which the weighted portion is arranged across a region having an oval opening along the inner side of the rectangular opposing region and the rectangular region of the feeding section adjacent to the opposing region;

FIG. 31 is a plan view of the piezoelectric thin film filter according to the fifth embodiment of the present invention;

FIGS. 35A to 35D is a view for explaining a method for manufacturing the film bulk acoustic resonator;

FIG. 44 is a view showing a frequency impedance characteristic of the film bulk acoustic resonator of Example 3;

FIG. 45 is a view showing a frequency impedance characteristic of a film bulk acoustic resonator of Example 4;

FIG. 54 is a view showing a frequency-impedance characteristic of the film bulk acoustic resonator according to Example 6;

FIG. 55 is a view showing a frequency-impedance characteristic of a film bulk acoustic resonator according to Example 8;

DESCRIPTION OF THE PREFERRED EMBODIMENTS

In the following, desired embodiments of piezoelectric thin film devices of the present invention are described by taking as examples a single film bulk acoustic resonator and a ladder-type filter (hereinafter referred to as "piezoelectric thin film filter") formed by combination of two film bulk acoustic resonators. However, the following embodiments do not mean that the piezoelectric thin film device of the present invention is not limited to the single film bulk acoustic resonator and the piezoelectric thin film filter. Namely, in the present invention, the piezoelectric thin film device typically means piezoelectric thin film devices in general which include a single or a plurality of film bulk acoustic resonators. Such piezoelectric thin film devices include an oscillator, a trap and the like, each including a single film bulk acoustic resonator, and a filter, a duplexer, a triplexer, a trap, and the like, each including a plurality of film bulk acoustic resonators. Here, the film bulk acoustic resonator is a resonator using an electrical response by means of bulk acoustic waves piezoelectrically excited by a thin film that cannot stand up under its own weight without a support.

1. First Embodiment

Figure 1:
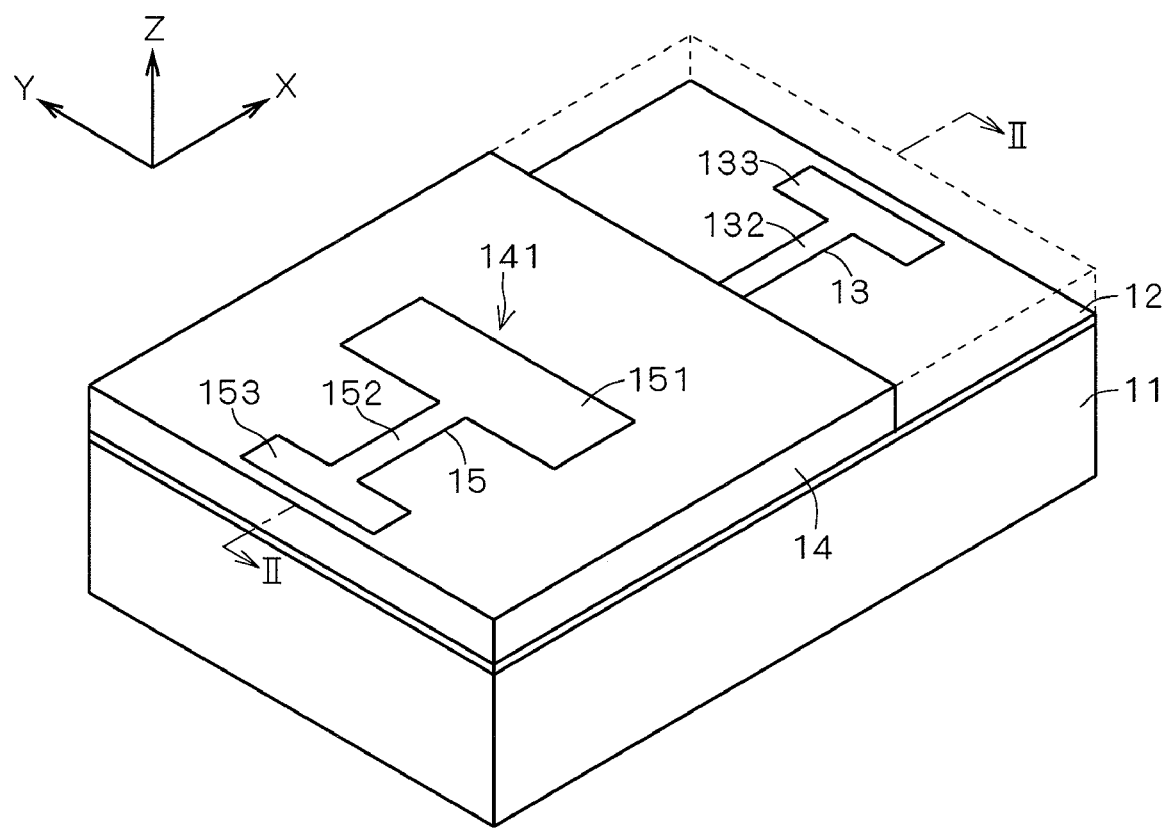
FIG. 1 is an oblique view showing a schematic configuration of a film bulk acoustic resonator according to a first embodiment of the present invention.
Figure 2:
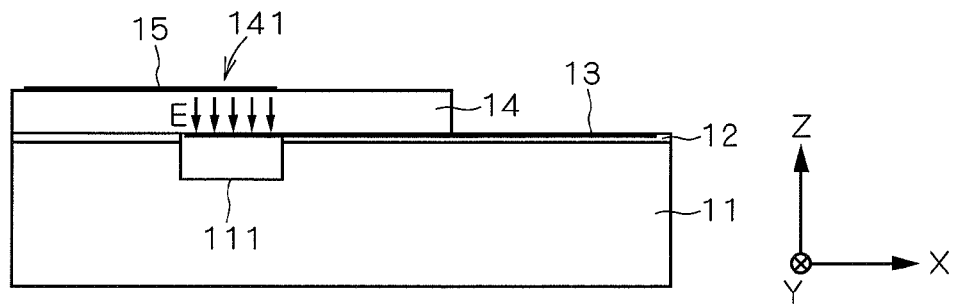
FIG. 2 is a sectional view showing a cross section of the film bulk acoustic resonator along a cutting-plane line II-II of FIG. 1.

FIG. 1 is an oblique view showing a schematic configuration of a film bulk acoustic resonator (FBAR) 1 according to a first embodiment of the present invention. FIG. 2 is a sectional view showing a cross section of the film bulk acoustic resonator 1 along a cutting-plane line II-II of FIG. 1. In FIGS. 1 and 2, an XYZ orthogonal coordinate system is defined for the sake of explanation where the right-and-left direction is the X-axis direction, the front-and-back direction is the Y-axis direction, and the top-and bottom-direction is the Z-axis direction. This also applies to each of later-described figures. The film bulk acoustic resonator 1 is a resonator using an electrical response by means of thickness extension vibrations excited by a piezoelectric thin film 14.

As shown in FIGS. 1 and 2, the film bulk acoustic resonator 1 has a configuration where an adhesive layer 12, a lower electrode 13, the piezoelectric thin film 14, and an upper electrode 15 are laminated in this order on a support substrate 11. In the film bulk acoustic resonator 1, the piezoelectric thin film 14 has a size smaller than that of the support substrate 11, and part of the lower electrode 13 is in the state of being exposed.

In the manufacture of the film bulk acoustic resonator 1, the piezoelectric thin film 14 is obtained by performing removal processing on a piezoelectric substrate that can independently stand up under its own weight, but the piezoelectric thin film 14 obtained by removal processing cannot independently stand up under its own weight. For this reason, prior to removal processing in manufacture of the film bulk acoustic resonator 1, a predetermined member including a piezoelectric substrate is previously bonded to the support substrate 11 as a support.

Support Substrate

When the piezoelectric substrate is subjected to removal processing during manufacture of the film bulk acoustic resonator 1, the support substrate 11 serves as a support to support, via the adhesive layer 12, the piezoelectric substrate with the lower electrode 13 formed on its lower surface. In addition, after the manufacture of the film bulk acoustic resonator 1, the support substrate 11 also serves as a support to support, via the adhesive layer 12, the piezoelectric thin film 14 with the lower electrode 13 formed on its under surface and the upper electrode 15 on its upper surface. Therefore, the support substrate 11 is required to be able to stand force applied at the time of removal processing on the piezoelectric substrate, and also required not to reduce its strength after manufacture of the film bulk acoustic resonator 1.

The material for and the thickness of the support substrate 11 can be selected as appropriate so as to satisfy the above-mentioned requirements. However, if the material for the support substrate 11 is a material having a thermal expansion coefficient close to that of the piezoelectric material constructing the piezoelectric thin film 14, more desirably a material having a thermal expansion coefficient equivalent to that of the piezoelectric material constructing the piezoelectric thin film 14, e.g. the same material as the piezoelectric material constructing the piezoelectric thin film 14, it is possible to suppress warpage and damage caused by a difference in thermal expansion coefficient during manufacture of the film bulk acoustic resonator 1. It is further possible to suppress characteristic variations and damage caused by a difference in thermal expansion coefficient after manufacture of the film bulk acoustic resonator 1. It is to be noted that in the case of using a material having an anisotropic thermal expansion coefficient, it is desirable to see that the thermal expansion coefficients in all different directions are made the same. Moreover, the same material as the piezoelectric material may be used in the same orientation as the piezoelectric material.

A depression (concave portion or groove) 111 is formed in a predetermined region of the support substrate 11 opposed to an excitation region 141 of the piezoelectric thin film 14. The depression 111 forms a cavity below the excitation region 141 of the piezoelectric thin film 14 to separate the excitation region 141 of the piezoelectric thin film 14 from the support substrate 11 so as to prevent vibrations excited by the excitation region 141 from interfering with the support substrate 11.

Adhesive Layer

The adhesive layer 12 serves to bond and fix the piezoelectric substrate with the lower electrode 13 formed on its bottom surface to the support substrate 11 when the piezoelectric substrate is subjected to removal processing during manufacture of the film bulk acoustic resonator 1. Additionally, the adhesive layer 12 also serves to bond and fix the piezoelectric thin film 14 with the lower electrode 13 formed on its lower surface and the upper electrode 15 on its upper surface to the support substrate 11 after manufacture of the film bulk acoustic resonator 1. Therefore, the adhesive layer 12 is required to be able to stand force applied at the time of removal processing on the piezoelectric substrate, and also required not to reduce its adhesive force after manufacture of the film bulk acoustic resonator 1.

A desirable example of the adhesive layer 12 satisfying such requirements may be an adhesive layer 12 formed of an organic adhesive agent, desirably an epoxy adhesive agent (adhesive layer made of an epoxy resin using thermosetting properties) or an acrylic adhesive agent (adhesive layer made of an acrylic resin using both thermosetting and photocuring properties), which has a filling effect and exerts sufficient adhesive force even when an object to be bonded is not completely flat. Adoption of such a resin allows prevention of unexpected formation of an air space between the piezoelectric substrate and the support substrate 11, thereby to prevent occurrence of cracking or the like at the time of removal processing on the piezoelectric substrate due to the air space. However, this does not prevent the piezoelectric thin film 14 and the support substrate 11 from being bonded and fixed to each other by an adhesive layer 12 different from the above-mentioned adhesive layer 12.

Piezoelectric Thin Film

The piezoelectric thin film 14 is obtained by performing removal processing on the piezoelectric substrate. More specifically, the piezoelectric thin film 14 is obtained by reducing the piezoelectric substrate in thickness from a thickness (e.g. not smaller than 50 μm) with which the substrate can independently stand up under its own weight, to a thickness (e.g. not larger than 10 μm) with which the substrate cannot independently stand up under its own weight.

As a piezoelectric material constructing the piezoelectric thin film 14, a piezoelectric material having a desired piezoelectric property can be selected, and it is desirable to select a single crystal material including no grain boundary, such as quartz crystal ($SiO_2$), lithium niobate ($LiNbO_3$), lithium tantalite (LiTaO₃), lithium tetraborate (Li₂B₄O₇), zinc oxide (ZnO), potassium niobate (KNbO₃), or langasite (La₃Ga₅SiO₁₄). This is because the use of the single crystal material as the piezoelectric material constructing the piezoelectric thin film 14 can lead to improvement in electromechanical coupling factor as well as mechanical quality factor of the piezoelectric thin film 14.

Further, a crystal orientation in the piezoelectric thin film 14 can be selected to be a crystal orientation having a desired piezoelectric characteristic. Here, the crystal orientation in the piezoelectric thin film 14 is desirably a crystal orientation that leads to favorable temperature characteristics of a resonance frequency and an antiresonance frequency of the film bulk acoustic resonator 1, and is further desirably a crystal orientation in which a resonance frequency temperature coefficient is "0".

Removal processing on the piezoelectric substrate 15 is performed by mechanical processing such as cutting, grinding or polishing, or chemical processing such as etching. Here, if the piezoelectric substrate is subjected to removal processing where a plurality of removal processing methods are combined and the removal processing method is shifted in stages from one performed at high processing speed to one with small process degradation in an object to be processed, it is possible to improve the quality of the piezoelectric thin film 14 while maintaining high productivity, so as to improve the characteristics of the film bulk acoustic resonator 1. For example, the piezoelectric substrate is subjected to grinding where the substrate is brought into contact with fixed abrasive grains for grinding, and is then subjected to polishing where the substrate is brought into contact with free abrasive grains for grinding. Thereafter, a processing degradation layer generated on the piezoelectric substrate by above-mentioned polishing is removed by finish-polishing. If such processing is executed, the piezoelectric substrate can be ground at faster speed so as to improve productivity of the film bulk acoustic resonator 1, and also, the quality of the piezoelectric thin film 14 is improved so as to improve the characteristics of the film bulk acoustic resonator 1. It is to be noted that more specific methods for removal processing on the piezoelectric substrate is described in later-described examples.

In the film bulk acoustic resonator 1 as thus described, different from the case of forming the piezoelectric thin film 14 by sputtering or the like, since the piezoelectric material constructing the piezoelectric thin film 14 and the crystal orientation in the piezoelectric thin film 14 are free from constraints of the substrate, the degree of flexibility is high in selection of the piezoelectric material constructing the piezoelectric thin film 14 and the crystal orientation in the piezoelectric thin film 14. This facilitates realization of a desired characteristic in the film bulk acoustic resonator 1.

Upper Electrode and Lower Electrode

Figure 3A:
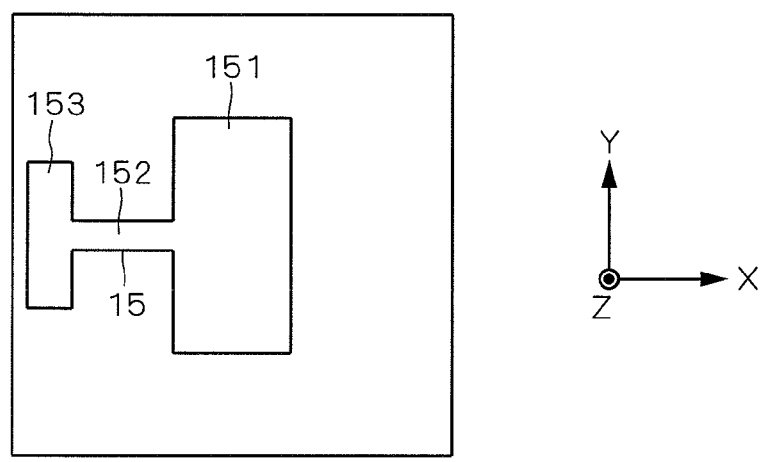
FIG. 3A is a view showing patterns of an upper electrode.
Figure 3B:
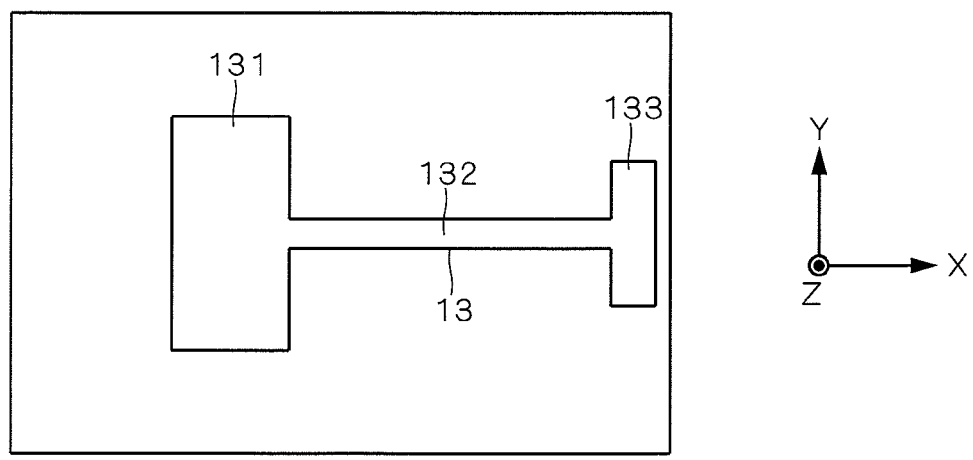
FIG. 3B is a view showing patterns of a lower electrode.

In the following, the upper electrode 15 and the lower electrode 13 are described with reference to FIGS. 3A and 3B. FIGS. 3A and 3B respectively show patterns of the upper electrode 15 and the lower electrode 13 when seen from above.

The upper electrode 15 and the lower electrode 13 are conductive thin films obtained by formation of films of a conductive material.

The thicknesses of the upper electrode 15 and the lower electrode 13 are determined in consideration of adhesiveness to the piezoelectric thin film 14, electric resistance, withstand power, and the like. It is to be noted that in order to suppress variations in resonance frequencies and antiresonance frequencies of the film bulk acoustic resonator 1 caused by variations in acoustic velocity and film thickness of the piezoelectric thin film 14, the thicknesses of the upper electrode 15 and the lower electrode 13 may be adjusted as appropriate.

Although a conductive material constituting the upper electrode 15 and the lower electrode 13 is not particularly limited, the material is desirably selected from metals such as aluminum (Al), silver (Ag), copper (Cu), platinum (Pt), gold (Au), chromium (Cr), nickel (Ni), molybdenum (Mo), tungsten (W), and tantalum (Ta). Naturally, an alloy may be used as the conductive material constituting the upper electrode 15 and the lower electrode 13. Further, a plurality of conductive materials may be laminated to form the upper electrode 15 and the lower electrode 13.

The upper electrode 15 has a drive section 151, a pull-out line 152, and a pad 153. Similarly, the lower electrode 13 has a drive section 131, a pull-out section 132, and a pad 133. The drive section 151 of the upper electrode 15 and the drive section 131 of the lower electrode 13 are opposed to each other with the piezoelectric thin film 14 interposed therebetween.

The upper electrode 15 formed on the upper surface of the piezoelectric thin film 14 is pulled out in the −X direction from the drive section 151 by the pull-out line 152, and the end of the upper electrode 15 is a pad 153 for connection with external wiring electrically connected to the outside of the film bulk acoustic resonator 1.

The lower electrode 13 formed on the lower surface of the piezoelectric thin film 14 is pulled out in the +X direction from the drive section 131 by the pull-out line 132, and the end of the lower electrode 13 is a pad 133 for connection with external wiring electrically connected to the outside of the film bulk acoustic resonator 1.

In the film bulk acoustic resonator 1, in order to make the pad 133 connectable with the external wire, the piezoelectric thin film 14 in the vicinity of the pad 133 (portion indicated by a doffed line in FIG. 1) has been removed, to bring the pad 133 into an exposed state. In the film bulk acoustic resonator 1, with the upper electrode 15 and the lower electrode 13 in the above described state, when the excitation signals are applied to the upper electrode 15 and the lower electrode 13 via the pads 153 and 133, an electric field E is generated inside the piezoelectric thin film 14 in the excitation region 141 where the upper electrode 151 and the lower electrode 131 are opposed to each other, to excite vibrations.

The drive sections 151 and 131 each have a slender two-dimensional shape (rectangular in FIGS. 1, 2, 3A and 3B) with magnitude in its longitudinal direction being not less than twice, more desirably four times, and further desirably ten times, as large as magnitude in its widthwise direction.

Figure 4:
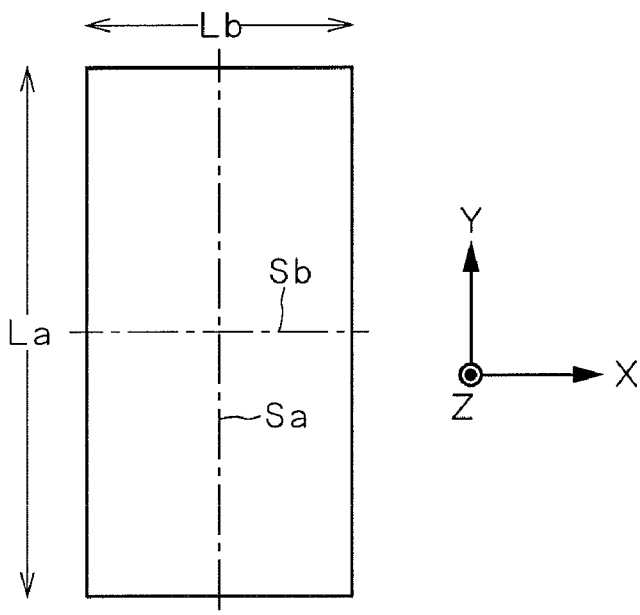
FIG. 4 is a view showing an example of shapes of drive sections.
Figure 5:
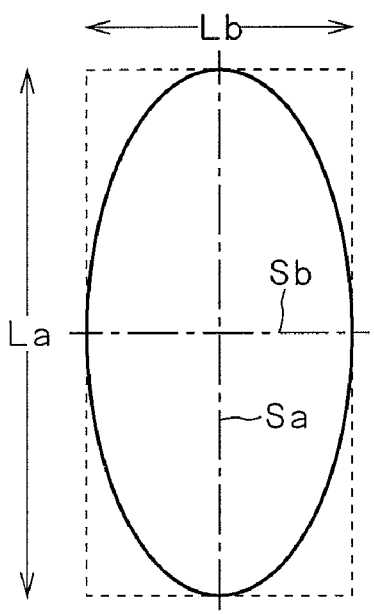
FIG. 5 is a view showing another example of the shapes of the drive sections.

Here, "a slender two-dimensional shape with magnitude in its longitudinal direction being not less than n (n=2, 4, 10) times as large as magnitude in its widthwise direction" typically means a rectangular with its long-side length La as magnitude in its longitudinal direction being larger than its short-side length Lb as magnitude in its widthwise direction, and an aspect ratio La/Lb being not less than n (see a figure drawn with a solid line in FIG. 4), or may mean an oval with its long-axis length La as magnitude in its longitudinal direction being longer than its short-axis length Lb as magnitude in its widthwise direction, and an aspect ratio La/Lb being not less than n (see a figure drawn with a solid line in FIG. 5).

More generally speaking, here, "the slender two-dimensional shape with magnitude in its longitudinal direction being not less than n times as large as magnitude in its widthwise direction" means a two-dimensional shape having a circumscribed rectangle with the smallest area (see a figure drawn by a dotted line in each of FIGS. 5 to 7) with its long-side length La being not less than n times as large as its short-side length Lb, and also a two dimensional shape in which, when the two-dimensional shape is symmetric with respect to both symmetric axes Sa and Sb that are orthogonal to each other, magnitude in the direction of the one symmetric axis Sa in its longitudinal direction is not less than n times as large as magnitude in the direction of the other symmetric axis Sb.

Figure 6:
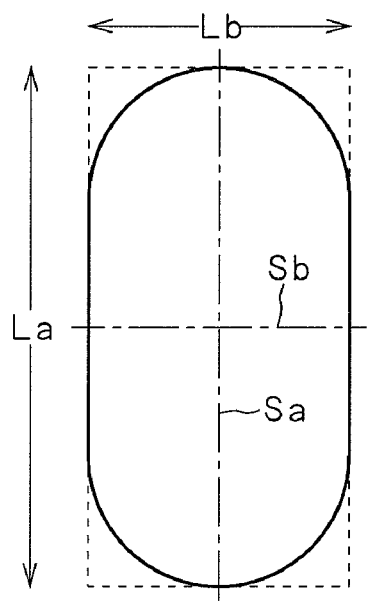
FIG. 6 is a view showing still another example of the shapes of the drive sections.
Figure 7:
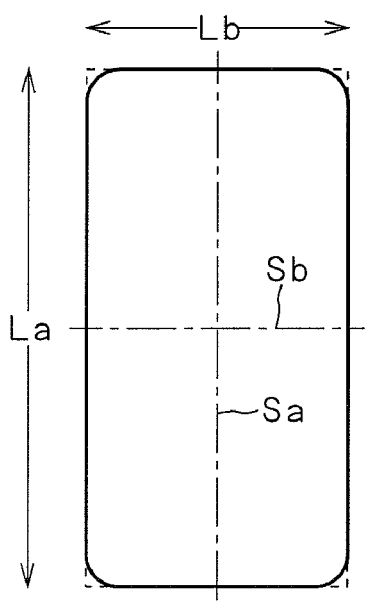
FIG. 7 is a view showing still another example of the shapes of the drive sections.
Figure 8:
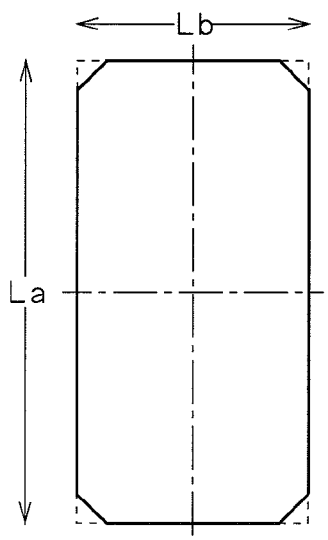
FIG. 8 is a view showing still another example of the shapes of the drive sections.

Therefore, the drive sections 151 and 131 may be in obround shape drawn by a solid line in FIG. 6, or may be a rectangular with its vertexes rounded, drawn by a solid line in FIG. 7, or may be a rectangular with its vertexes cut off to form oblique lines, drawn by a solid line in FIG. 8.

2. Second Embodiment

Figure 9:
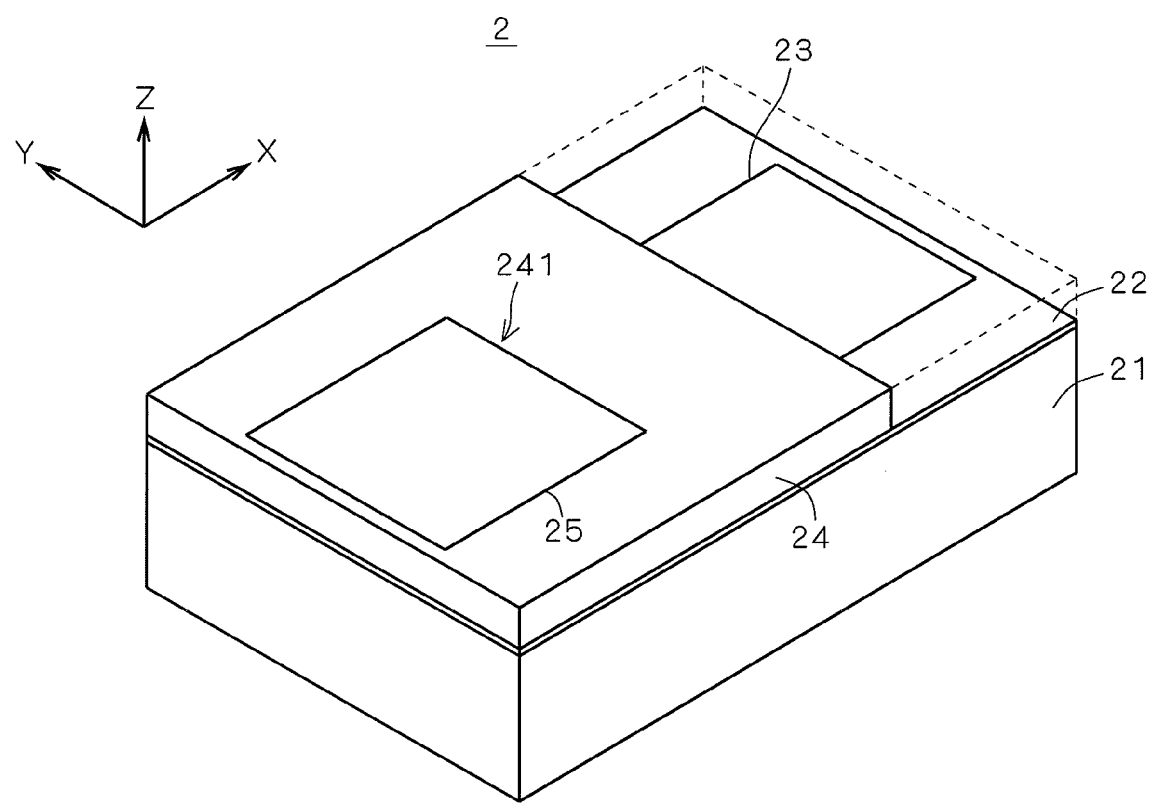
FIG. 9 is an oblique view showing a schematic configuration of a film bulk acoustic resonator according to a second embodiment of the present invention.

FIG. 9 is an oblique view showing a schematic configuration of a film bulk acoustic resonator 2 according to a second embodiment of the present invention. The film bulk acoustic resonator 2 is also a resonator using an electrical response by means of thickness extension vibrations excited by a piezoelectric thin film 24.

As shown in FIG. 9, the film bulk acoustic resonator 2 has a configuration where an adhesive layer 22, a lower electrode 23, the piezoelectric thin film 24, and an upper electrode 25 are laminated in this order on a support substrate 21. The film bulk acoustic resonator 2 of the second embodiment has a similar structure to that of the film bulk acoustic resonator 1 of the first embodiment, and the support substrate 21, the adhesive layer 22, the lower electrode 23, the piezoelectric thin film 24, and the upper electrode 25 of the film bulk acoustic resonator 2 are respectively the same as the support substrate 11, the adhesive layer 12, the lower electrode 13, the piezoelectric thin film 14, and the upper electrode 15 of the film bulk acoustic resonator 1 except for the patterns of the lower electrode 23 and the upper electrode 25. It is to be noted that, in the following, repeated description on the same points as those of the film bulk acoustic resonator 1 is not given, but the patterns of the lower electrode 23 and the upper electrode 25, which are different from those in the film bulk acoustic resonator 1, are particularly described.

Figure 10A:
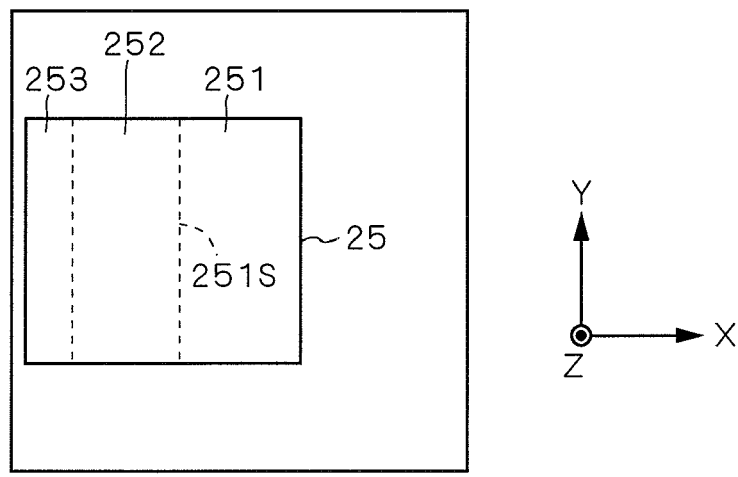
FIG. 10A is a view showing patterns of an upper electrode.
Figure 10B:
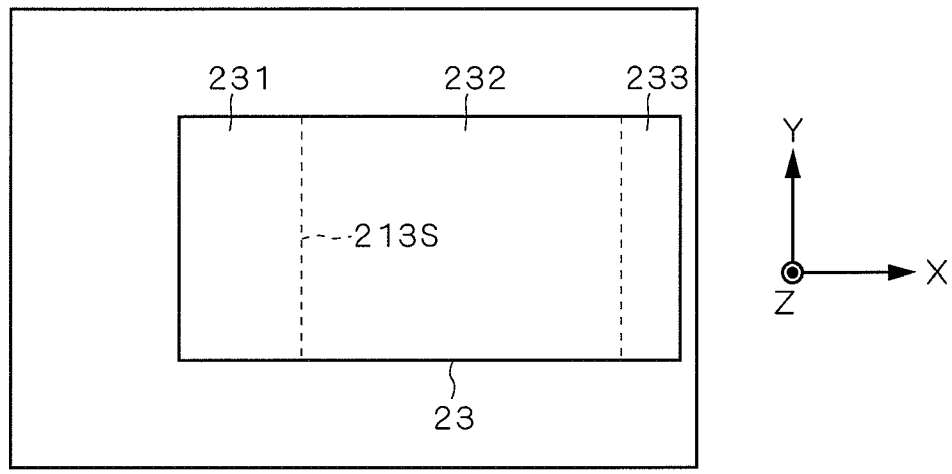
FIG. 10B is a view showing patterns of a lower electrode.

FIGS. 10A and 10B respectively show patterns of the upper electrode 25 and the lower electrode 23 when seen from above.

The upper electrode 25 has a drive section 251, a pull-out line 252, and a pad 253. Similarly, the lower electrode 23 has a drive section 231, a pull-out section 232, and a pad 233. The drive section 251 of the upper electrode 25 and the lower electrode 231 of the lower electrode 23 are opposed to each other with the piezoelectric thin film 24 interposed therebetween.

The upper electrode 25 formed on the upper surface of the piezoelectric thin film 24 is pulled out in the −X direction from the drive section 251 by the pull-out section 252, and the end of the upper electrode 25 is a pad 253 for connection with external wiring electrically connected to the outside of the film bulk acoustic resonator 2.

The lower electrode 23 formed on the lower surface of the piezoelectric thin film 24 is pulled out in the +X direction from the drive section 231 by the pull-out section 232, and the end of the lower electrode 23 is a pad 233 for connection with external wiring electrically connected to the outside of the film bulk acoustic resonator 2.

Also in the film bulk acoustic resonator 2, the drive sections 251 and 231 each have a slender rectangular shape with its long-side length being not less than twice, more desirably four times, and further desirably ten times, as large as its short-side length.

The pull-out section 252 is connected to a long side 251s of the drive section 251, and the width of the upper electrode 25 in the ±Y direction from the drive section 251 to the pad 253 through the pull-out section 252 is kept constant. Similarly, the pull-out section 232 is connected to a long side 213s of the drive section 231, and the width of the lower electrode 23 in the ±Y direction from the drive section 231 to the pad 233 through the pull-out section 232 is kept constant. Namely, in the film bulk acoustic resonator 2, the rectangular band-shaped upper electrode 25 and lower electrode 23, which extend in the same direction (±X direction), are respectively formed on the upper and lower surfaces of the piezoelectric thin film 24, and the ends of the upper electrode 25 and the lower electrode 23 are opposed to each other with the piezoelectric thin film 24 interposed therebetween, to obtain an excitation region 241.

It should be noted that, since an outline of the excitation region 241 where the drive sections 251 and 231 are opposed to each other with the piezoelectric thin film 24 interposed therebetween reflects acoustic waves of a transverse mode propagated in the spreading direction of the piezoelectric thin film 24, the state of the outline of the excitation region 241 has an influence on a spurious characteristic of the film bulk acoustic resonator 2. However, different from the film bulk acoustic resonator 1, in the film bulk acoustic resonator 2, the pull-out section 252 is arranged so as to be connected to the whole of the long side 251s of the drive section 251, and the pull-out section 232 is arranged so as to be connected to the whole of the long side 213s of the drive section 231. For this reason, in the film bulk acoustic resonator 2, uniform reflection of the acoustic waves occurs on the long sides 251s and 213s, and hence generation of a large number of spuriousness caused by nonuniformity of the reflection can be effectively prevented, compared with the film bulk acoustic resonator 1 in which reflection of the acoustic waves occurs nonuniformly in the portions connected with the pull-out lines 152 and 132 and portions not connected with those lines.

Further, if such patterns of the upper electrode 25 and the lower electrode 23 are adopted, as shown in FIG. 11, the shape of the excitation region 241 where the upper electrode 25 and the lower electrode 23 are opposed remains rectangular even when positions where the upper electrode 25 and the lower electrode 23 are displaced in directions indicated by allows A25 and A23 from positions they should be. Namely, in the film bulk acoustic resonator 2, even when the positions where the upper electrode 25 and the lower electrode 23 are formed are displaced from positions they should be, the excitation region 241, the outline of which reflects the acoustic waves of the transverse mode propagating in the spreading direction of the piezoelectric thin film 24, remains simple rectangular. Therefore, even when the positions where the upper electrode 25 and the lower electrode 23 are formed are displaced from positions where they should be, a large number of spuriousness are not generated caused by such displacement. This is apparent by comparison with the case, as shown in FIGS. 1 and 2, in which the shape of the excitation region 141 where the upper electrode 15 and the lower electrode 13 are opposed to each other becomes complicated when the positions where the upper electrode 15 and the lower electrode 13 of the film bulk acoustic resonator 1 of the first embodiment are displaced in directions indicated by arrows A15 and A13 from positions where they should be, which might cause generation of a large number of spuriousness.

Figure 13A:
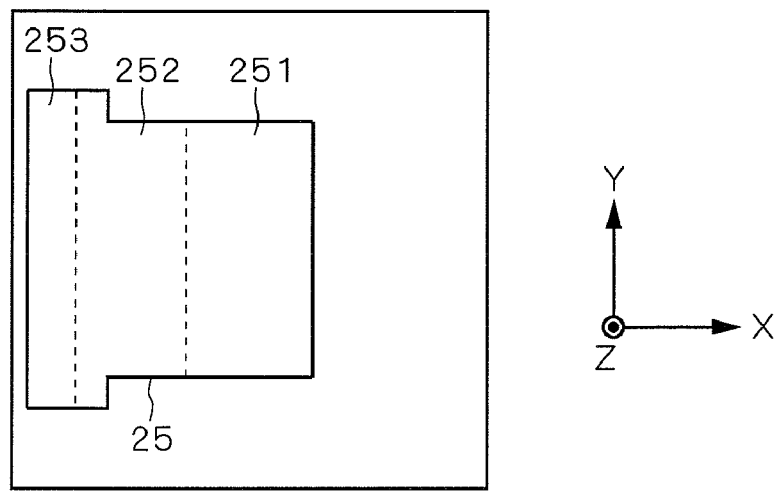
FIG. 13A is a view showing patterns of the upper electrode and the lower electrode in which widths in the ±Y directions of only portions of pull-out sections, which are close to drive sections, are made the same as those of the drive sections.
Figure 13B:
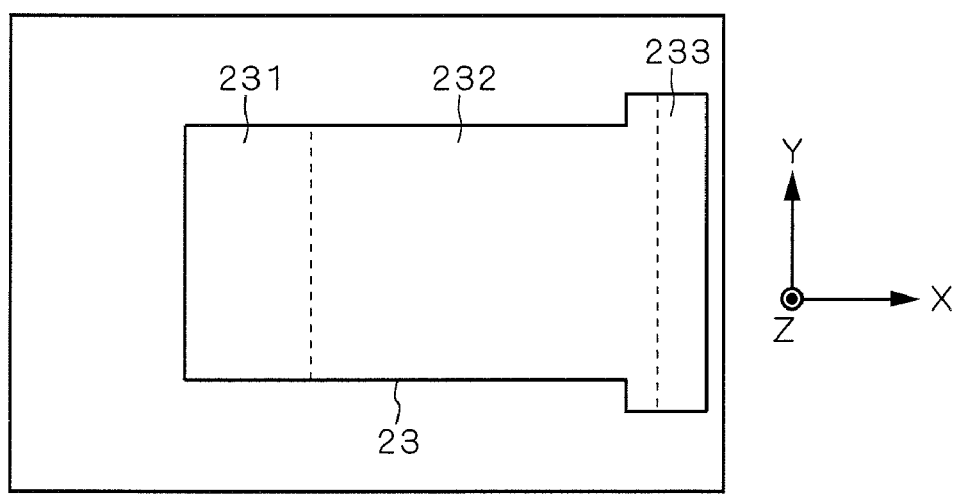
FIG. 13B is a view showing patterns of the lower electrode in which widths in the ±Y directions of only portions of pull-out sections, which are close to drive sections, are made the same as those of the drive sections.

In addition, in the foregoing description, the example was shown as a desirable example in which the width in the ±Y direction from the drive section 251 to the pad 253 through the pull-out section 252 is kept uniform and the width in the ±Y direction from the drive section 231 to the pad 233 through the pull-out section 232 is also kept uniform. However, when energy trapping into the excitation region 241 is sufficiently performed, with distance from the excitation region 241, the influence exerted by the upper electrode 25 and the lower electrode 23 on a frequency impedance characteristic of the film bulk acoustic resonator 2 decreases. Therefore, for example, as shown in FIGS. 13A and 13B, it is allowable to make the width in the ±Y direction of only a portion of the pull-out section 252 which is close to the drive section 251 the same as the width of the drive section 251, and make the width in the ±Y direction of only a portion of the pull-out section 232 which is close to the drive section 231 the same as the width of the drive section 231. Here, FIGS. 13A and 13B show patterns of the upper electrode 25 and the lower electrode 23 when seen from above.

3. Third Embodiment

FIG. 14 is an oblique view showing a schematic configuration of a film bulk acoustic resonator 3 according to a third embodiment of the present invention. Further, FIG. 15 is a sectional view showing a cross section of the film bulk acoustic resonator 3 along a cutting plane line XV-XV of FIG. 14. The film bulk acoustic resonator 3 is also a resonator using an electrical response by means of thickness extension vibrations excited by a piezoelectric thin film 34.

As shown in FIGS. 14 and 15, the film bulk acoustic resonator 3 has a configuration where an adhesive layer 32, a lower electrode 33, the piezoelectric thin film 34, and an upper electrode 35 are laminated in this order on a support substrate 31. The film bulk acoustic resonator 3 of the third embodiment has a similar structure to that of the film bulk acoustic resonator 2 of the second embodiment, and the support substrate 31, the adhesive layer 32, the lower electrode 33, the piezoelectric thin film 34, and the upper electrode 35 of the film bulk acoustic resonator 3 are respectively the same as the support substrate 21, the adhesive layer 22, the lower electrode 23, the piezoelectric thin film 24, and the upper electrode 25 of the film bulk acoustic resonator 2 except that a drive section 351 of the upper electrode 35 has a weighted portion 351W. It is to be noted that, in the following, repeated description on the same points as those of the film bulk acoustic resonator 2 is not given, but the weighted portion 351W, which is an element differentiating from the film bulk acoustic resonator 2, is particularly described.

Figure 16A:
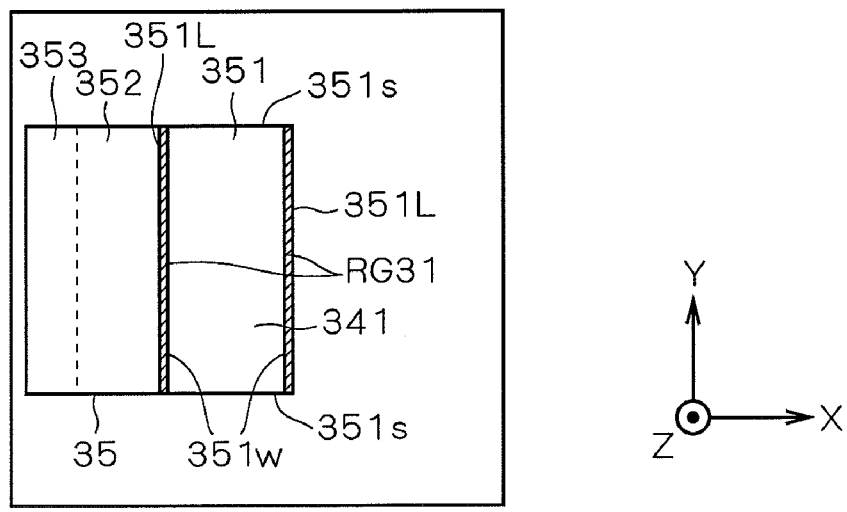
FIG. 16A is a view showing patterns of an upper electrode
Figure 16B:
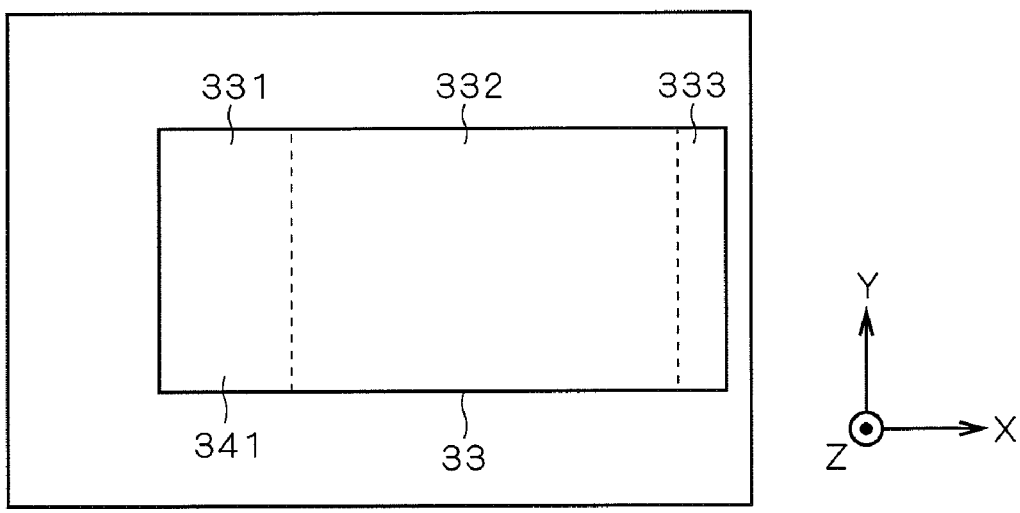
FIG. 16B is a view showing patterns of a lower electrode.

FIGS. 16A and 16B respectively show patterns of the upper electrode 35 and the lower electrode 33 when seen from above.

The upper electrode 35 has a drive section 351, a pull-out section 352, and a pad 353. Similarly, the lower electrode 33 has a drive section 331, a pull-out section 332, and a pad 333. The drive section 351 of the upper electrode 35 and the lower electrode 331 of the lower electrode 33 are opposed to each other with the piezoelectric thin film 34 interposed therebetween. The patterns of the upper electrode 35 and the lower electrode 33 of the film bulk acoustic resonator 3 are the same as those of the upper electrode 25 and the lower electrode 23 of the film bulk acoustic resonator 2 except that the drive section 351 has the weighted portion 351W.

In the film bulk acoustic resonator 3, the lower electrode 33 is a conductive thin film with a substantially uniform film thickness, whereas the upper electrode 35 has a structure where, on the conductive thin film with a substantially uniform film thickness, a conductive thin film is further superposed in regions RG31 along the inner sides of a long sides 351L as a pair of opposite sides extending in the longitudinal direction of the drive section 351. The weighted portion 351W, hatched in FIG. 16A, is formed by partially increasing the thickness of the upper electrode 35 in the region RG31 beyond unavoidable variation.

The weighted portion 351W is larger than the central portion of the drive section 351 with a substantially uniform film thickness in mass per unit area, thereby serving to reduce a cutoff frequency of the acoustic waves in the region RG31. In the film bulk acoustic resonator 3, the reduction in cutoff frequency leads to prevention of leakage of vibration energy of vibrations excited in an opposing region 341 where the drive sections 351 and 331 are opposed to each other with the piezoelectric thin film 34 interposed therebetween, thereby to suppress sub-resonance which depends upon the outline shape of the piezoelectric thin film 34.

It is to be noted that the reason why the weighted portion 351W is provided only along the inner side of the long side 351L whereas the weighted portion 351W is not provided along the inner side of a pair of short sides 351S is because such a configuration makes the frequency impedance characteristic of the film bulk acoustic resonator 3 unsusceptible to spuriousness while avoiding the influence exerted by a resonance waveform of the resonator formed by the weighted portion 351W. Namely, a active reason is that the area of the region RG31, occupied by the weighted portion 351W which forms a resonator with a lower resonance frequency than a resonator formed by the central portion, can be reduced so as to suppress strength of another resonance waveform superposed on the low frequency side of the resonance waveform of the resonator formed by the central portion. Further, a passive reason is that in the case of adopting the drive sections 351 and 331 each having a slender two-dimensional shape, the acoustic waves of the transverse mode are propagated mainly in a direction crossing the long side 351L, thereby allowing sufficient prevention of leakage of vibration energy from the opposing region 341 even without provision of the weighted portion 351W along the inner side of the short side 351S.

A width W31 of the region RG31 is desirably not less than 1% and not more than 30%, further desirably not less than 5% and not more than 20%, of a width W32 of the drive section 351. This is because the width W31 falling out of this range would cause reduction in vibration energy trapping effect. Here, the width W31 of the drive section 351 is a length of the short side 351S when the drive section 351 is formed in rectangular shape.

The film thicknesses of the upper electrode 35 and the lower electrode 33 should be determined according to the conductive material constituting the electrodes, and when tungsten is selected as the conductive material, its thickness is desirably not less than 700 angstroms. This is because, if tungsten has a film thickness below 700 angstroms, its electric resistance increases, to significantly increase resonance resistance of the film bulk acoustic resonator 3. Further, typically, when a difference in film thickness between the weighted portion 351W and a portion other than 351W is about 500 angstroms, sub-resonance of the film bulk acoustic resonator 3 can be favorably suppressed.

The upper electrode 35 can be formed such that a conductive thin film with a substantially uniform film thickness is formed and a conductive thin film is further formed as superposed on the weighted portion 351W, or that a conductive thin film with a substantially uniform film thickness is formed and a portion other than a portion to become the weighted portion 351W is reduced in thickness.

In addition, although the example was shown in FIG. 15 where the weighted portion 351W is arranged in the drive section 351 of the upper electrode 35, the weighted portion may be arranged on the drive section 331 of the lower electrode 33 in place of the drive section 351 of the upper electrode 35, or the weighted portion may be arranged on both the drive section 351 of the upper electrode 35 and the drive section 331 of the lower electrode 33. Further, although the weighted portion 351W can be readily formed by partially increasing the film thickness of the drive section 351 to form the weighted portion 351W, this does not prevent another method of forming the weighted portion 351W by partially increasing a mass of the drive section 351 instead of partially increasing the film thickness of the drive section 351 or in addition to partially increasing the film thickness of the drive section 351.

Further, it is desirable to increase the film thickness of the pull-out section 352 adjacent to the drive section 351 to match the film thickness of the weighted portion 351W, since the electric resistance of the pull-out section 352 can be reduced.

Figure 17A:
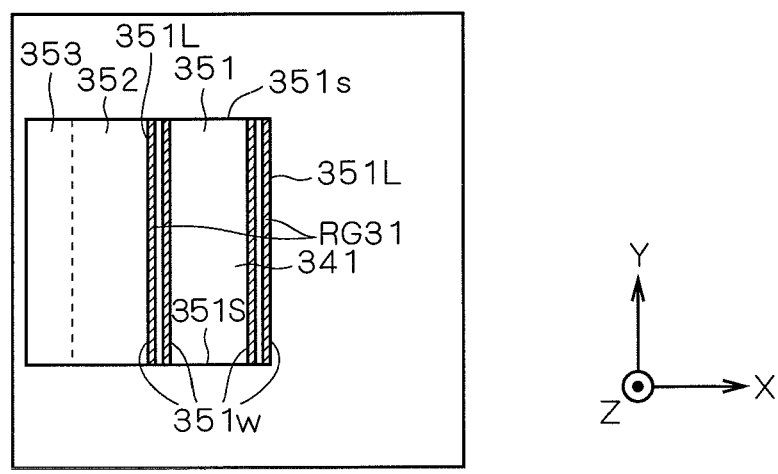
FIG. 17A is a view showing a patter of the upper electrode in which another weighted portion is further formed on the inner side of a weighted portion.
Figure 17B:
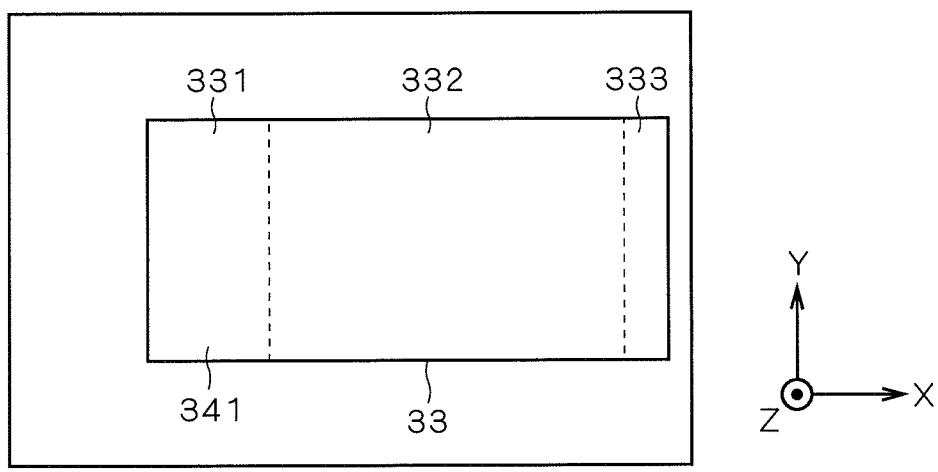
FIG. 17B is a view showing a patter of the lower electrode.

Moreover, as shown in FIGS. 17A and 17B, it is considered that another drive section 351 may be arranged on the inner side of the weighted portion 351W shown in FIGS. 14, 15, 16A and 16B.

In addition to these, it is also possible to favorably suppress sub-resonance of the film bulk acoustic resonator 3 even when it is arranged that the film thickness of the weighted portion 351W increases with distance from the central portion of the drive section 351 so as to increase the mass per unit area of the weighted portion 351W. Further, there is an advantage in that such a weighted portion 351W does not have a large influence on the suppression effect of the sub-resonance even with a slight change in shape of the weighted portion 351W.

Figure 19:
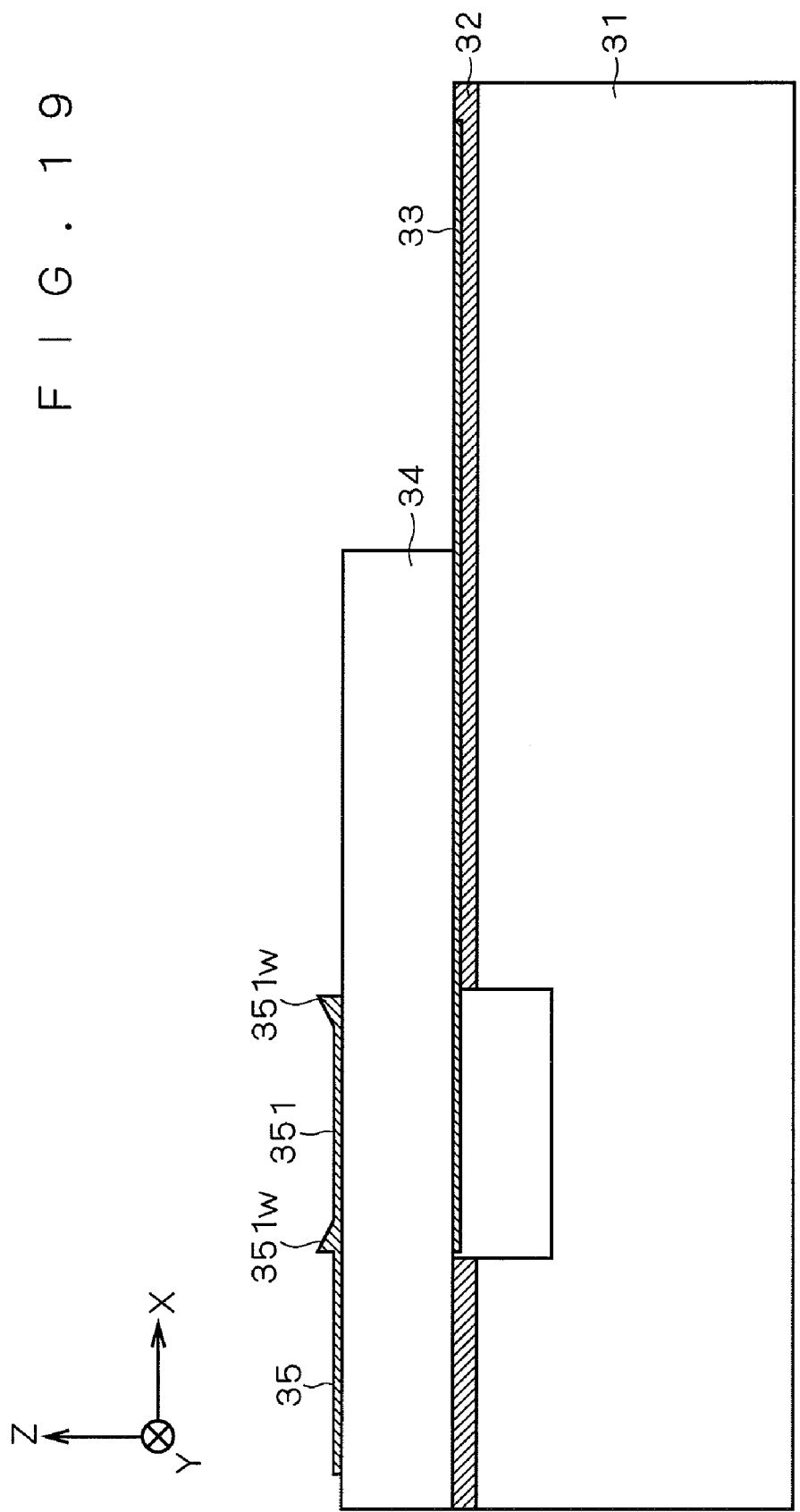
FIG. 19 is a sectional view showing the film bulk acoustic resonator in which a slope-shaped weighted portion is arranged.

For example, in a sectional view of FIG. 18, an example is shown in which the weighted portion 351W is in the shape of steps having a portion with a relatively large film thickness and a portion with a relatively small film thickness. It is to be noted that, although FIG. 18 shows the example where the weighted portion 351W has the shape of a two step staircase, the weighted portion 351W may have the shape of a staircase of three or more steps. Or, as shown in a sectional view of FIG. 19, the weighted portion 371W in slope shape, having a continuously increasing film thickness, may be arranged on the upper electrode 371.

4. Fourth Embodiment

Figure 20:
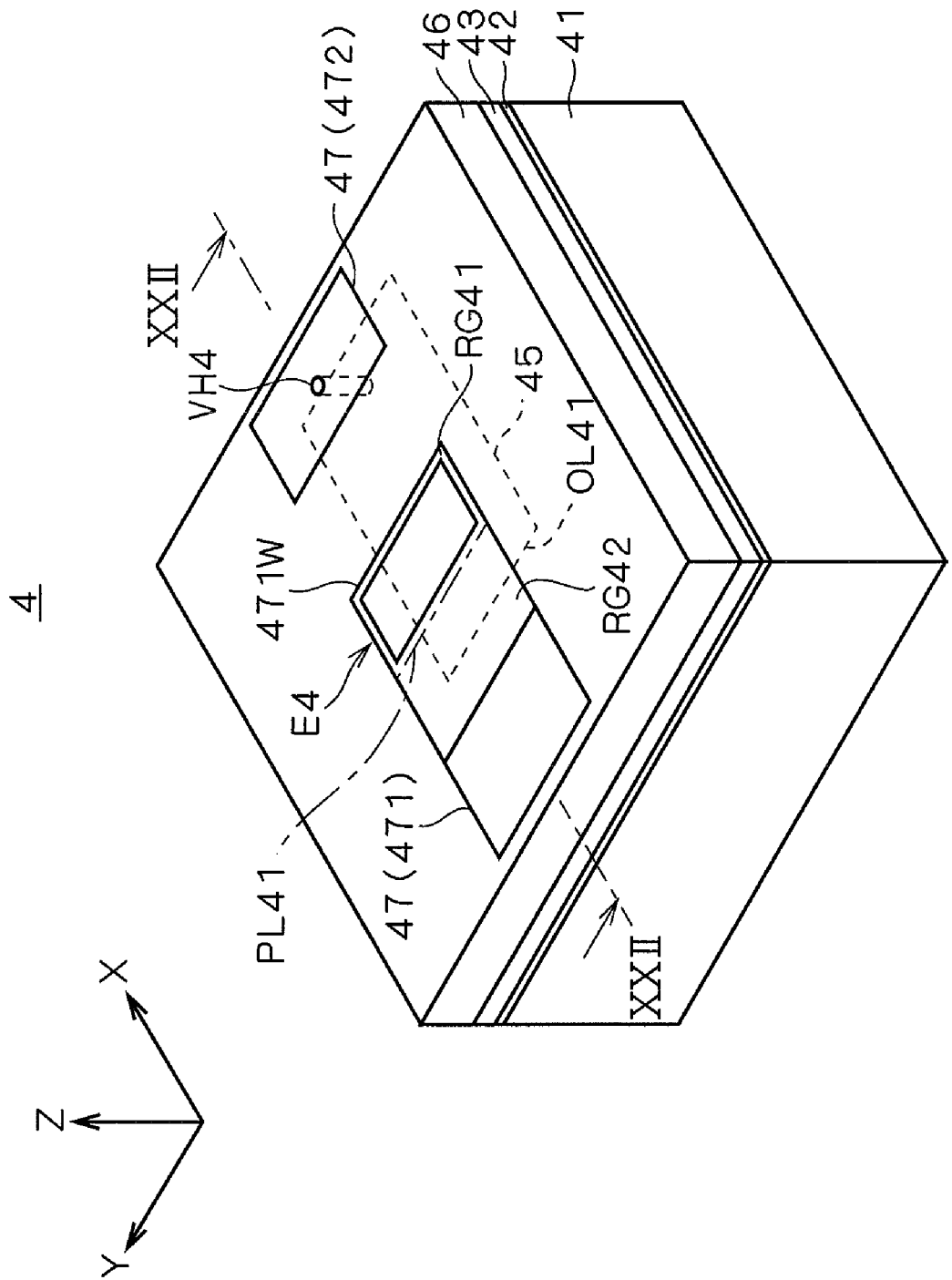
FIG. 20 is an oblique view of a film bulk acoustic resonator according to a fourth embodiment of the present invention.
Figure 21:
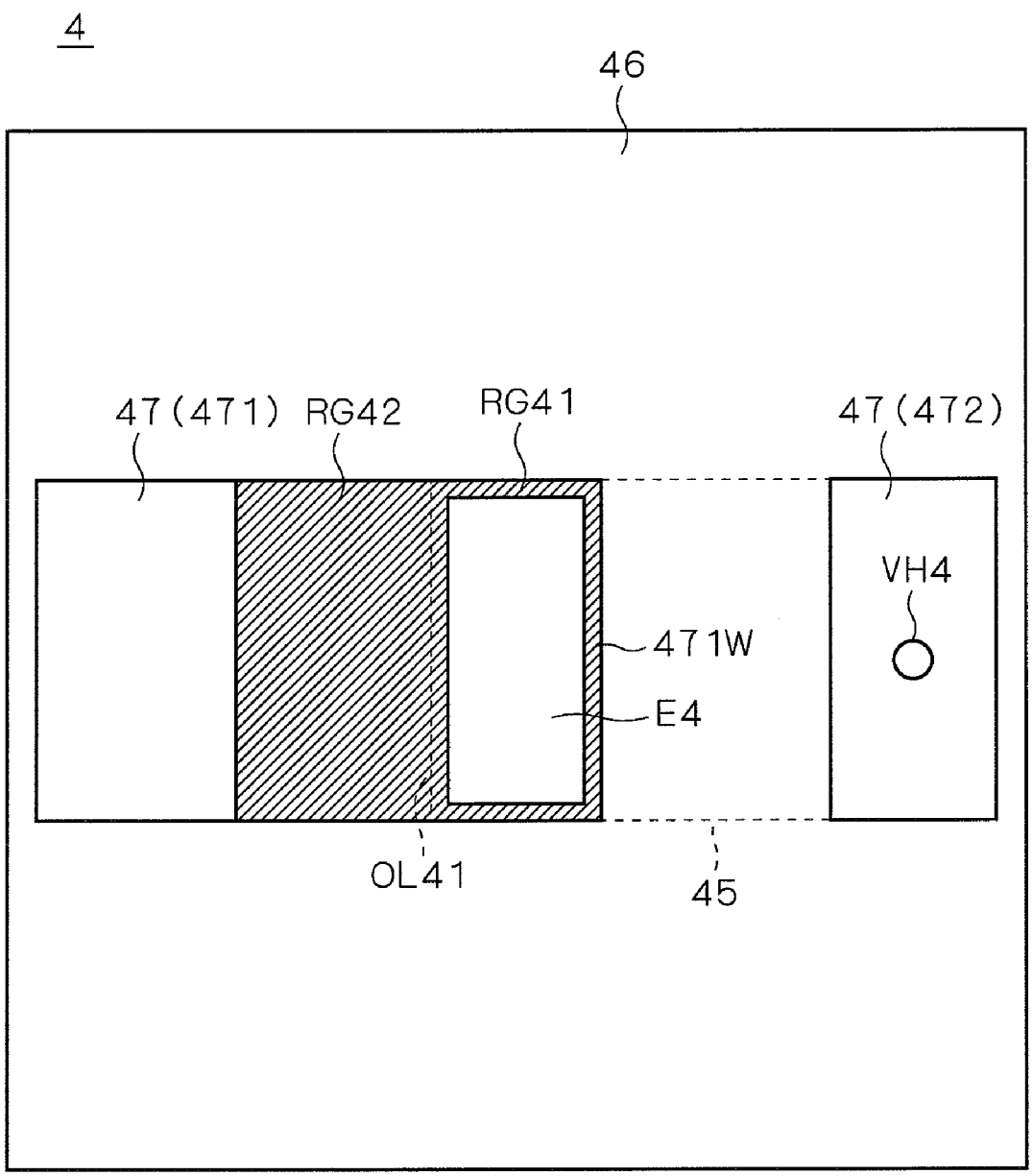
FIG. 21 is a plan view of a film bulk acoustic resonator according to the fourth embodiment of the present invention.

FIGS. 20 to 22 are schematic views showing a configuration of a film bulk acoustic resonator 4 according to a fourth embodiment of the present invention. Further, FIG. 20 is an oblique view of the film bulk acoustic resonator 4 seen obliquely from above, FIG. 21 is a plan view of the film bulk acoustic resonator 4 seen from above, and FIG. 22 is a sectional view showing a cross section of the film bulk acoustic resonator 4 along a cutting plane line XXII-XXII of FIG. 20. In FIG. 20, an XYZ orthogonal coordinate system is defined for the sake of explanation where the right-and-left direction is the X-axis direction, the front-and-back direction is the Y-axis direction, and the top-and bottom-direction is the Z-axis direction.

As shown in FIGS. 20 to 22, the film bulk acoustic resonator 4 has a configuration where an adhesive layer 42, a cavity formation film 43, a lower electrode 45, a piezoelectric thin film 46, and an upper electrode 47 are laminated in this order on a support substrate 41. In manufacture of the film bulk acoustic resonator 4, the piezoelectric thin film 46 is obtained by performing removal processing on a piezoelectric substrate that can independently stand up under its own weight, but the piezoelectric thin film 46 obtained by removal processing cannot independently stand up under its own weight. For this reason, prior to removal processing in manufacture of the film bulk acoustic resonator 4, a piezoelectric substrate on which the lower electrode 45 and the cavity formation film 43 are formed is previously bonded to the support substrate 41 as a support.

Support Substrate

When a piezoelectric substrate is subjected to removal processing during manufacture of the film bulk acoustic resonator 4, the support substrate 41 serves as a support to support, via the adhesive layer 42, the piezoelectric substrate with the lower electrode 45 and the cavity formation film 43 formed on its lower surface. In addition, after manufacture of the film bulk acoustic resonator 4, the support substrate 41 also serves as a support to support, via the adhesive layer 42, the piezoelectric thin film 46 with the lower electrode 45 and the cavity formation film 43 formed on its under surface and the upper electrode 47 on its upper surface. Therefore, the support substrate 41 is required to be able to stand force applied at the time of removal processing on the piezoelectric substrate, and also required not to reduce its strength after manufacture of the film bulk acoustic resonator 4.

The material for and the thickness of the support substrate 41 can be selected as appropriate so as to satisfy the above-mentioned requirements. However, if the material for the support substrate 41 is a material having a thermal expansion coefficient close to that of the piezoelectric material constructing the piezoelectric thin film 46, more desirably a material having a thermal expansion coefficient equivalent to that of the piezoelectric material constructing the piezoelectric thin film 46, e.g. the same material as the piezoelectric material constructing the piezoelectric thin film 46, it is possible to suppress warpage and damage caused by a difference in thermal expansion coefficient during manufacture of the film bulk acoustic resonator 4. It is further possible to suppress characteristic variations and damage caused by a difference in thermal expansion coefficient after manufacture of the film bulk acoustic resonator 4. In addition, in the case of using a material having an anisotropic thermal expansion coefficient, it is desirable to see that the thermal expansion coefficients in all different directions are made the same. Moreover, in the case of using the same material for the support substrate 41 and the piezoelectric thin film 46, it is desirable to match the crystal orientations of the support substrate 41 and the piezoelectric thin film 46.

Adhesive Layer

The adhesive layer 42 serves to bond and fix the piezoelectric substrate with the lower electrode 45 and the cavity formation film 43 formed on its bottom surface to the support substrate 41 when the piezoelectric substrate is subjected to removal processing during manufacture of the film bulk acoustic resonator 4. Additionally, the adhesive layer 42 also serves to bond and fix the piezoelectric thin film 46 with the lower electrode 45 and the cavity formation film 43 formed on its lower surface and the upper electrode 47 on its upper surface to the support substrate 41 after manufacture of the film bulk acoustic resonator 4. Therefore, the adhesive layer 42 is required to be able to stand force applied at the time of removal processing on the piezoelectric substrate, and also required not to reduce its adhesive force after manufacture of the film bulk acoustic resonator 4.

A desirable example of the adhesive layer 42 satisfying such requirements may be an adhesive layer 42 formed of an organic adhesive agent, desirably an epoxy adhesive agent (adhesive layer made of an epoxy resin using thermosetting properties) or an acrylic adhesive agent (adhesive layer made of an acrylic resin using both thermosetting and photocuring properties), which has a filling effect and exerts sufficient adhesive force even when an object to be bonded is not completely flat. Adoption of such a resin allows prevention of unexpected formation of an air space between the piezoelectric substrate and the support substrate 41, thereby to prevent occurrence of cracking or the like at the time of removal processing on the piezoelectric substrate due to the air space. However, this does not prevent the piezoelectric thin film 46 and the support substrate 41 from being bonded and fixed to each other by an adhesive layer 42 different from the above-mentioned adhesive layer 42.

Cavity Formation Film

The cavity formation film 43 is an insulating film obtained by forming a film of an insulating material. The cavity formation film 43 is formed on the lower surface of a region other than an opposing region E4 of the piezoelectric thin film 46, to form a cavity C4 which separates the opposing region E4 of the piezoelectric thin film 46 from the scanner section 41. Arrangement of such a cavity formation film 43 which serves as a spacer allows the opposing region E4 of the piezoelectric thin film 46 not to interfere with the support substrate 41, thereby preventing inhibition of vibrations excited in the opposing region E4.

The insulating material for constituting the cavity formation film 43 is not particularly limited, but desirably selected from insulating materials such as silica dioxide ($SiO_2$).

Piezoelectric Thin Film

The piezoelectric thin film 46 is obtained by performing removal processing on the piezoelectric substrate. More specifically, the piezoelectric thin film 46 is obtained by reducing the piezoelectric substrate in thickness from a thickness (e.g. not smaller than 50 μm) with which the substrate can independently stand up under its own weight, to a thickness (e.g. not larger than 10 μm) with which the substrate cannot independently stand up under its own weight.

As a piezoelectric material constructing the piezoelectric thin film 46, a piezoelectric material having a desired piezoelectric property can be selected, and it is desirable to select a single crystal material including no grain boundary, such as quartz crystal ($SiO_2$), lithium niobate ($LiNbO_3$), lithium tantalite ($LiTaO_3$), lithium tetraborate ($Li_2B_4O_7$), zinc oxide (ZnO), potassium niobate ($KNbO_3$), or langasite ($La_3Ga_5SiO_{14}$). This is because the use of the single crystal material as the piezoelectric material constructing the piezoelectric thin film 46 can lead to improvement in electromechanical coupling factor as well as mechanical quality factor of the piezoelectric thin film 46.

Further, a crystal orientation in the piezoelectric thin film 46 can be selected to be a crystal orientation having a desired piezoelectric characteristic. Here, the crystal orientation in the piezoelectric thin film 46 is desirably a crystal orientation that leads to favorable temperature characteristics of a resonance frequency and an antiresonance frequency of the film bulk acoustic resonator 4, and is further desirably a crystal orientation in which a resonance frequency temperature coefficient is "0".

Removal processing on the piezoelectric substrate is performed by mechanical processing such as cutting, grinding or polishing, or chemical processing such as etching. Here, if the piezoelectric substrate is subjected to removal processing where a plurality of removal processing methods are combined and the removal processing method is shifted in stages from one performed at high processing speed to one with small process degradation in an object to be processed, it is possible to improve the quality of the piezoelectric thin film 46 while maintaining high productivity, so as to improve the characteristics of the film bulk acoustic resonator 4. For example, the piezoelectric substrate is subjected to grinding where the substrate is brought into contact with fixed abrasive grains for grinding, and is then subjected to polishing where the substrate is brought into contact with free abrasive grains for grinding. Thereafter, a processing degradation layer generated on the piezoelectric substrate by above-mentioned polishing is removed by finish-polishing. If such processing is executed, the piezoelectric substrate can be ground at faster speed so as to improve productivity of the film bulk acoustic resonator 4, and also, the quality of the piezoelectric thin film 46 is improved so as to improve the characteristics of the film bulk acoustic resonator 4. It is to be noted that more specific methods for removal processing on the piezoelectric substrate is described in later-described examples.

In the film bulk acoustic resonator 4 as thus described, different from the case of forming the piezoelectric thin film 46 by sputtering or the like, since the piezoelectric material constructing the piezoelectric thin film 46 and the crystal orientation in the piezoelectric thin film 46 are free from constraints of the substrate, the degree of flexibility is high in selection of the piezoelectric material constructing the piezoelectric thin film 46 and the crystal orientation in the piezoelectric thin film 46. This facilitates realization of a desired characteristic in the film bulk acoustic resonator 4.

In a region other than the opposing region E4 of this piezoelectric thin film 46, a via hole VH4 is formed for penetrating through the piezoelectric thin film 46 between its upper and lower surfaces, and conducting an upper electrode 472 and the lower electrode 45 which are opposed to each other with the piezoelectric thin film 46 interposed therebetween. The via hole VH4 short-circuits, by a conductive thin film formed on its inner surface, the upper electrode 472 and the lower electrode 45 for direct conduction.

Upper Electrode and Lower Electrode

The upper electrode 47 and the lower electrode 45 are conductive thin films formed by forming films of a conductive material on the upper and lower surfaces of the piezoelectric thin film 46 which have been polished and flattened. Here, the upper and lower surfaces of the piezoelectric thin film 46 being "flat" means that those surfaces are in the state of not having roughness larger than roughness that unavoidably remains after polishing.

Although the conductive material constituting the upper electrode 47 and the lower electrode 45 is not particularly limited, the material is desirably selected from metals such as aluminum (Al), silver (Ag), copper (Cu), platinum (Pt), gold (Au), chromium (Cr), nickel (Ni), molybdenum (Mo), tungsten (W), and tantalum (Ta). Naturally, an alloy may be used as the conductive material constituting the upper electrode 47 and the lower electrode 45. Further, a plurality of kinds of conductive materials may be laminated to form the upper electrode 47 and the lower electrode 45.

Out of the upper electrode 47, an upper electrode 471 is opposed to the lower electrode 45 with the piezoelectric thin film 46 interposed therebetween in the opposing region E4. The upper electrode 471 is pulled out from the opposing region E4 in the −X direction, and the pulled-out portion serves as a feeding section for feeding the excitation signal to the upper electrode 471.

Meanwhile, in the lower electrode 45, the lower electrode 45 is pulled out from the opposing region E4 in the +X direction, and the pulled-out portion serves as a feeding section for feeding the excitation signal to the lower electrode 45.

Further, out of the upper electrode 47, the upper electrode 472 is opposed to the feeding section of the lower electrode 45 with the piezoelectric thin film 46 interposed therebetween in a region other than the opposing region E4. Since the via hole VH4 conducts the upper electrode 472 and the lower electrode 45, the excitation signal is fed to the lower electrode 45 through the externally exposed upper electrode 472 in the film bulk acoustic resonator 4.

In the film bulk acoustic resonator 4, the upper electrode 472 and the lower electrode 45 are conductive thin films with a substantially uniform film thickness, whereas the upper electrode 471 has a structure where, on the conductive thin film with a substantially uniform film thickness, a conductive thin film is further superposed across a frame-like region RG41 along the inner side of the outer periphery of the opposing region E4 (periphery section of the opposing region) and a rectangular region RG42 of the feeding section adjacent to the opposing region E4. The upper electrode 471 also has a configuration where a weighted portion 471W for adding a mass is arranged across both sides of a portion which is the outer periphery of the opposing region E4 and a projected outline border PL41 drawn by projecting the outline border OL41 of the lower electrode 45 on the upper electrode 471. The weighted portion 471W, hatched in FIG. 21, is formed by partially increasing the thickness of the upper electrode 471 in the regions RG41 and 42 beyond unavoidable variations.

The weighted portion 471W is larger than the central portion of the opposing region E4 with a substantially uniform film thickness in mass per unit area, thereby serving to reduce a cutoff frequency of the acoustic waves in the regions RG41 and RG42. In the film bulk acoustic resonator 4, the reduction in cutoff frequency leads to prevention of leakage of vibration energy of vibrations excited in the opposing region E4, thereby to suppress sub-resonance which depends upon the outline shape of the piezoelectric thin film 46.

Further, in the film bulk acoustic resonator 4, the upper and lower surfaces of the piezoelectric thin film 46 are flat, and the lower electrode 45 is not formed outside the opposing region E4 except for the feeding section. Therefore, in the film bulk acoustic resonator 4, a difference in thickness of a laminated body including the upper electrode 47, the piezoelectric thin film 46 and the lower electrode 45, namely, a difference in mass per unit area, between the periphery of the opposing region E4 and the outside of the opposing region E4 can be made large, thereby to prevent acoustic waves slightly leaked from the opposing region E4 toward the outside of the opposing region E4 from reflecting on the end face of the piezoelectric thin film 46 and returning to the opposing region E4. Further, in the film bulk acoustic resonator 4, since both the upper electrode 471 and the lower electrode 45 are partial electrodes which covers part of the main surface, excitation of vibrations or reflection of acoustic waves on the end surface of the piezoelectric thin film 46 can be prevented. Additionally, that the upper and lower surfaces of the piezoelectric thin film 46 are flat also has the advantage of allowing performance of patterning on the upper electrode 47 and the lower electrode 45 with high accuracy in size.

These advantages of the film bulk acoustic resonator 4 cannot be realized by the conventional film bulk acoustic resonator formed by sequentially film-forming the lower electrode, the piezoelectric thin film and the upper electrode since it is impossible that both the upper and lower electrodes are made to be partial electrodes while both main surfaces of the piezoelectric thin film are made flat.

Meanwhile, in the film bulk acoustic resonator 4, since the weighted portion 471W is part of the upper electrode 471, it is possible to avoid exertion of an influence by the weighted portion 471W on the main resonance and deterioration in its characteristic. Here, the periphery of the film bulk acoustic resonator 4 means a portion in contact with the outer periphery of the opposing region E4, and the central portion of the opposing region E4 means a portion apart from the outer periphery of the opposing region E4 and surrounded by the periphery of the opposing region E4.

The width W41 of the region RG41 which rims the central portion of the opposing region E4 with a substantially uniform film thickness is desirably not less than 1% and not more than 30%, further desirably not less than 5% and not more than 20%, of a width W42 of the opposing region E4. This is because the width W41 falling out of this range causes reduction in vibration energy trapping effect. Here, the width W42 of the opposing region E4 is a short-side length when the opposing region E4 is formed in rectangular shape, and a length of the diameter when formed in circular shape.

Although the film thicknesses of the upper electrode 45 and the upper electrode 47 should be determined according to a conductive material constituting the electrodes, when tungsten is selected as the conductive material, its thickness is desirably not less than 700 angstroms. This is because, if tungsten has a film thickness below 700 angstroms, its electric resistance increases, to significantly increase resonance resistance of the film bulk acoustic resonator, its electric resistance increases, to significantly increase resonance resistance of the film bulk acoustic resonator 4. Further, typically, when a difference in film thickness between the weighted portion 471W and a portion other than 471W is about 500 angstroms, sub-resonance of the film bulk acoustic resonator 4 can be favorably suppressed.

The upper electrode 471 with the portion of the opposing region E4 formed in tray shape can be formed such that a conductive thin film with a substantially uniform film thickness is formed and a conductive thin film is further formed as superposed on the weighted portion 471W, or that a conductive thin film with a substantially uniform film thickness is formed and a portion other than a portion to become the weighted portion 451W is reduced in thickness.

Although as the example was shown in FIGS. 20 to 22, where the weighted portion 471W is arranged on the lower electrode 45 of the upper electrode 45, the weighted portion may be arranged on the lower electrode 45 in place of the upper electrode 471, or the weighted portion may be arranged on both the upper electrode 471 and the lower electrode 45. Further, although the weighted portion 471W can be readily formed by partially increasing the film thickness of the upper electrode 471 to form the weighted portion 471W, this does not prevent formation of the weighted portion 471W by partially increasing a mass of the upper electrode 471 instead of partially increasing the film thickness of the upper electrode 471 or in addition to partially increasing the film thickness of the upper electrode 471.

Another Example of Weighted Portion

Subsequently, another example of the weighted portion 471W is described. However, the weighted portion 471W described below is just an example and thus not aimed at limiting the range of the present invention.

In FIGS. 20 to 22, the weighted portion 471W is arranged to surround the central portion of the opposing region E4 for effectively suppressing sub-resonance of the film bulk acoustic resonator 4. However, this does not prevent arrangement of the weighted portion 471W across the region RG41 along the inner side of part of the outer periphery of the opposing region E4 and the rectangular region RG42 of the feeding portion adjacent to the opposing region E4, for example, arrangement of the weighted portion 471W across the region RG41 along the inner side of one of the opposite sides of the opposing region E4 and the rectangular region RG42 of the feeding portion adjacent to the opposing region E4, as shown in a plan view of FIG. 23.

Further, constant arrangement of a width W41 of the region RG41 in the weighted portion 471W is not essential. For example, as shown in a plan view of FIG. 24, the weighted portion 471W may be arranged across the region RG41 along the inner side of the outer periphery of the opposing region E4, having a circular opening, and the rectangular region RG42 of the feeding section adjacent to the opposing region E4, as shown in a plan view of FIG. 24.

Figure 25:
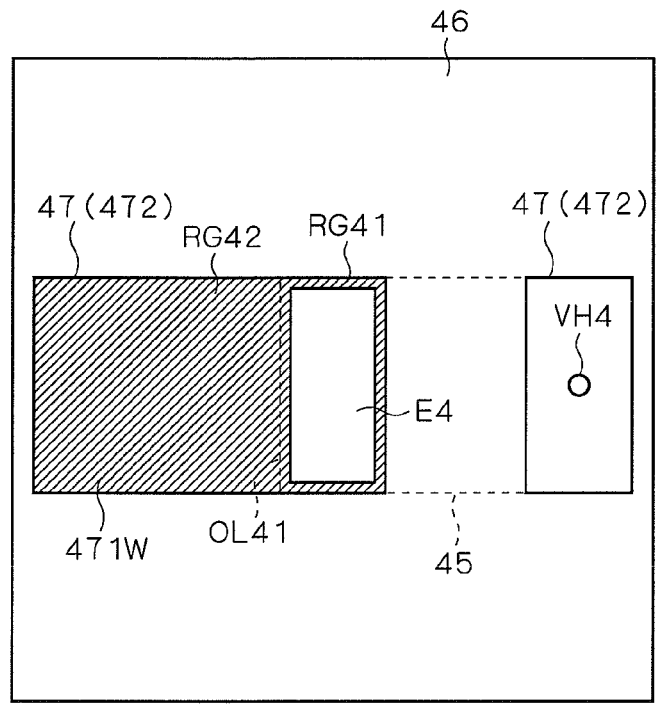
FIG. 25 is a plan view showing the film bulk acoustic resonator in which the weighted portion is arranged across a region along the inner side of the outer periphery of the rectangular opposing region and a rectangular region making up the whole of the feeding section adjacent to the opposing region.

Further, as shown in a plan view of FIG. 25, the weighted portion 471W is located across the region RG41 along the inner side of the outer periphery of the opposing region E4 and the rectangular region RG42 making up the whole of the feeding section adjacent to the opposing region E4.

Figure 26:
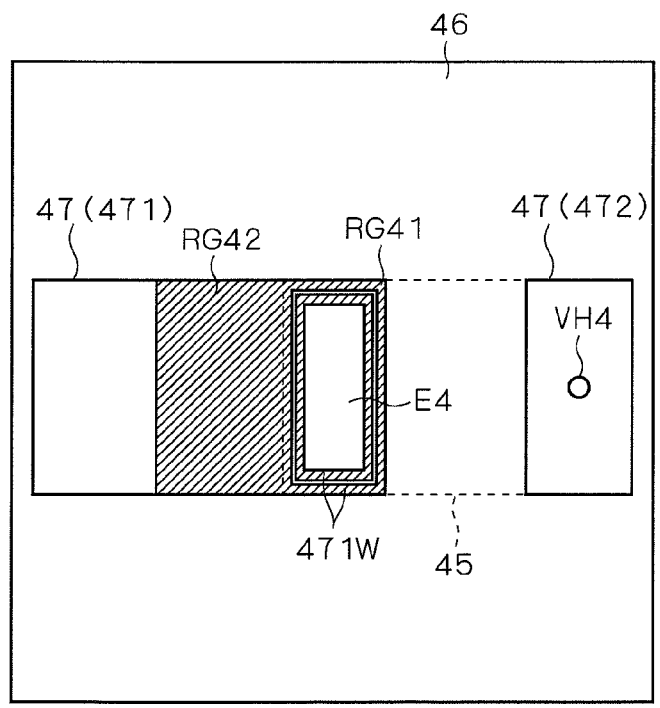
FIG. 26 is a plan view showing the film bulk acoustic resonator in which another weighted portion is further formed on the inner side of the weighted portion.

Further, as shown in FIG. 26, it is considered that another weighted portion 471W may be further arranged on the inner side of the weighted portion 471W shown in FIGS. 20 to 22.

Other than these, even when the weighted portion 471W is arranged such that its film thickness becomes larger and its mass per unit area becomes larger with distance from the central portion of the opposing region E4, sub-resonance of the film bulk acoustic resonator 4 can be favorably suppressed. Further, such a weighted portion 471W has the advantage of not having a large influence on the sub-resonance suppressing effect even when the shape of the weighted portion 471W is slightly changed.

Figure 27:
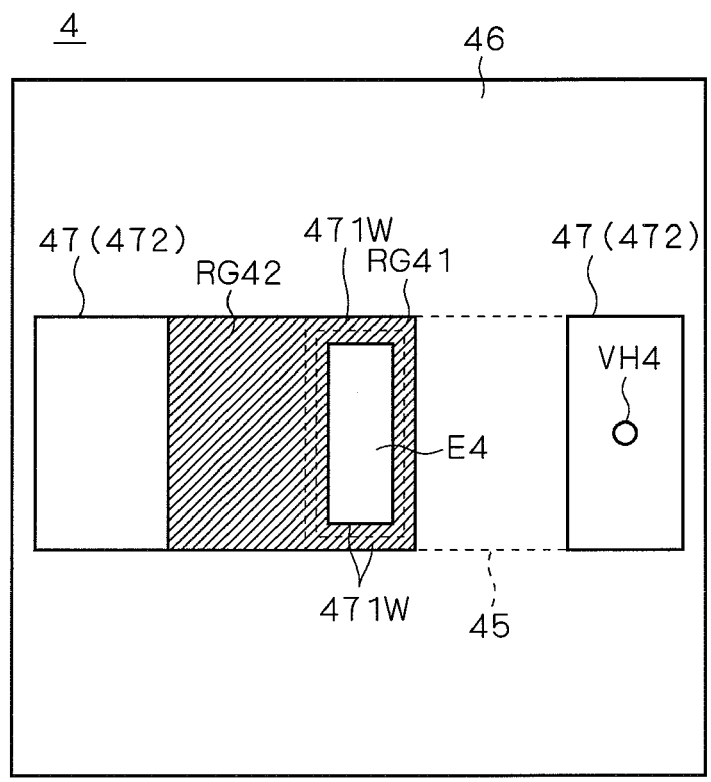
FIG. 27 is a plan view showing the film bulk acoustic resonator in which a step-shaped weighted portion is arranged.
Figure 28:
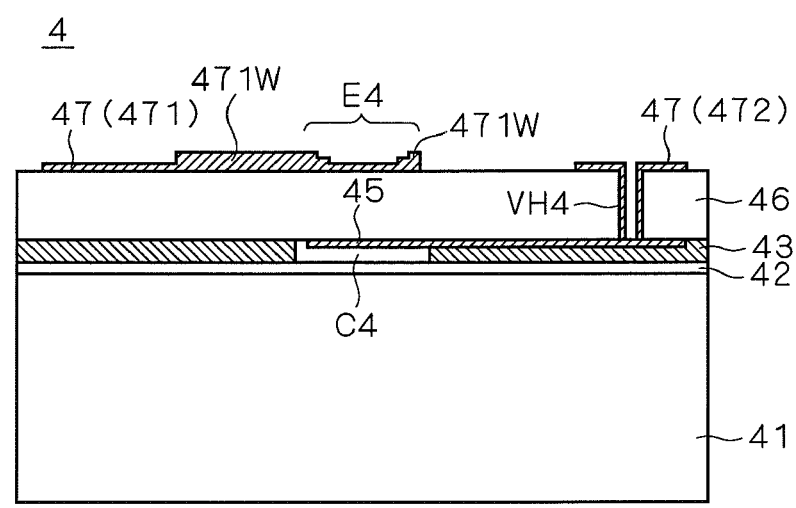
FIG. 28 is a sectional view showing the film bulk acoustic resonator in which a step-shaped weighted portion is arranged.
Figure 29:
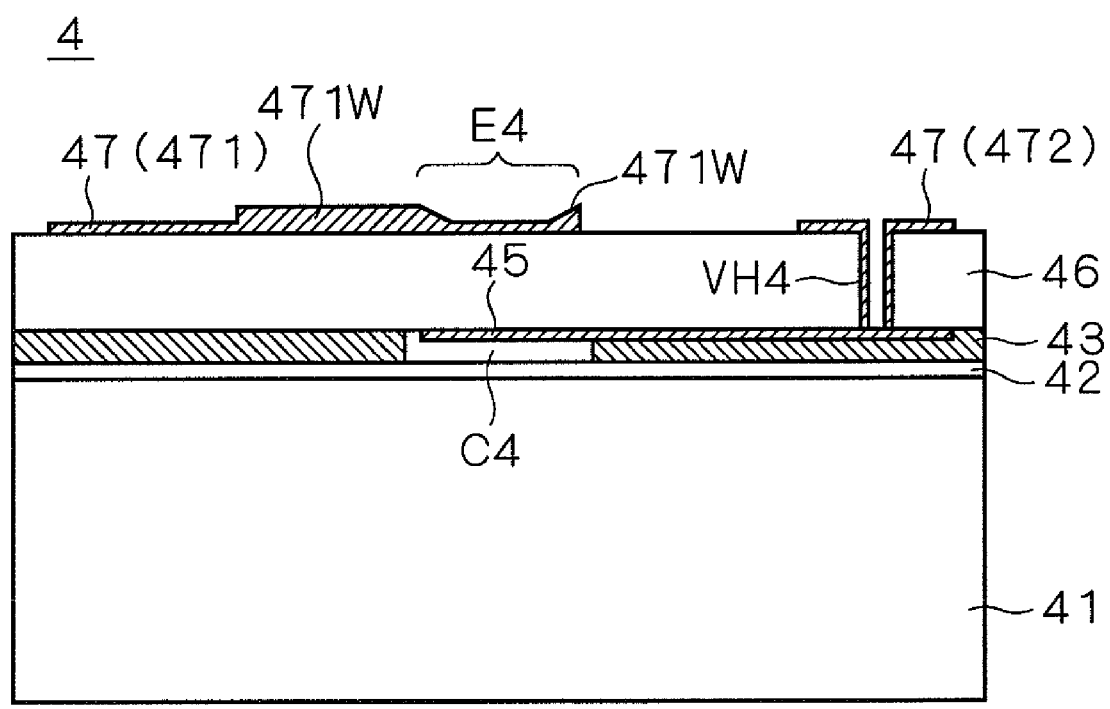
FIG. 29 is a sectional view showing the film bulk acoustic resonator in which a slope-shaped weighted portion is arranged.

For example, a plan view of FIG. 27 and a sectional view of FIG. 28 show an example of the weighted portion 471W in staircase shape having a portion with a relatively small film thickness and a portion with a relatively large film thickness. It should be noted that FIGS. 27 and 28 show the example where the weighted portion 471W has the shape of a two step staircase, the weighted portion 471W may have the shape of a staircase of three or more steps. Or, as shown in a sectional view of FIG. 29, the weighted portion 471W in slope shape, having a continuously increasing film thickness, may be arranged on the upper electrode 471.

5. Fifth Embodiment

Figure 30:
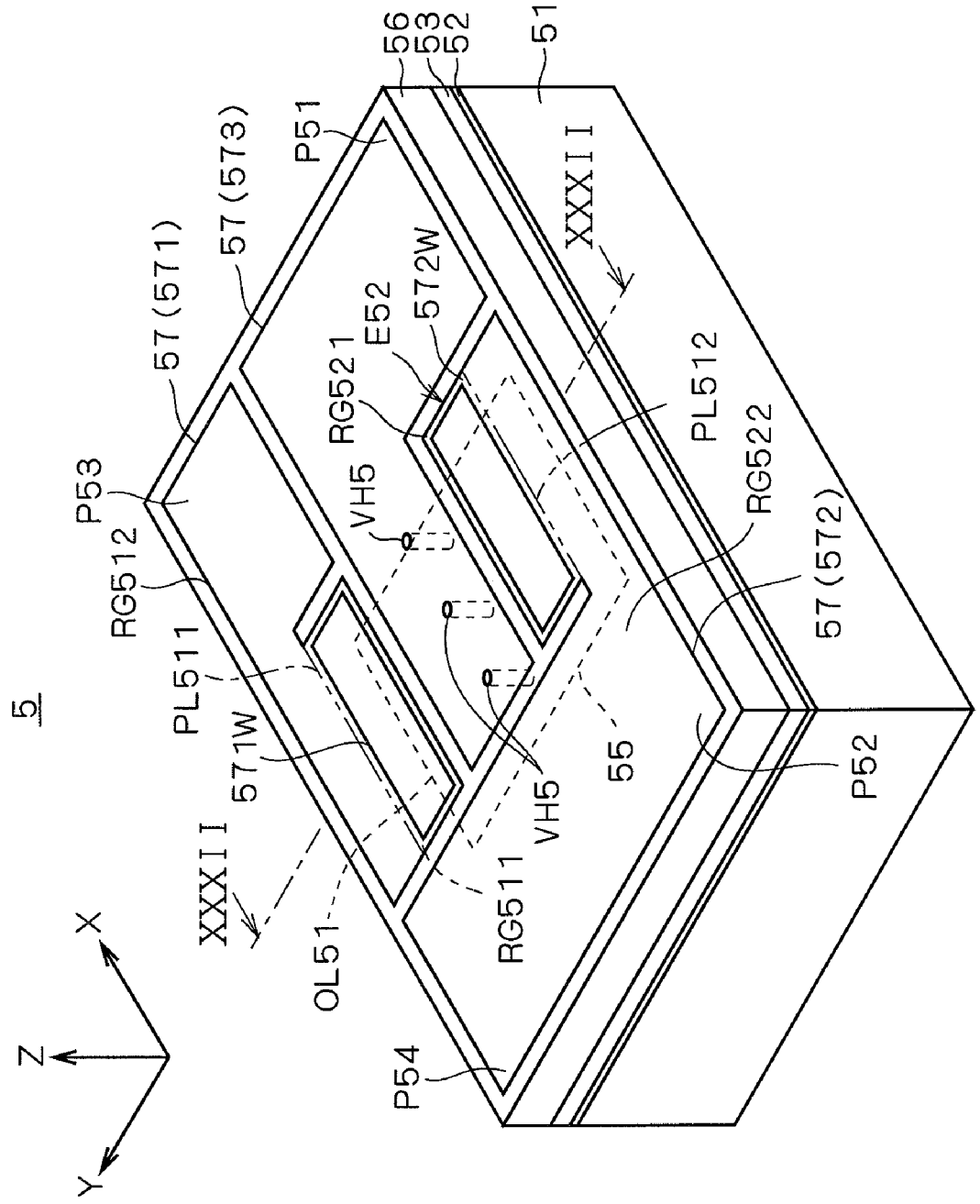
FIG. 30 is an oblique view of a piezoelectric thin film filter according to a fifth embodiment of the present invention.
Figure 32:
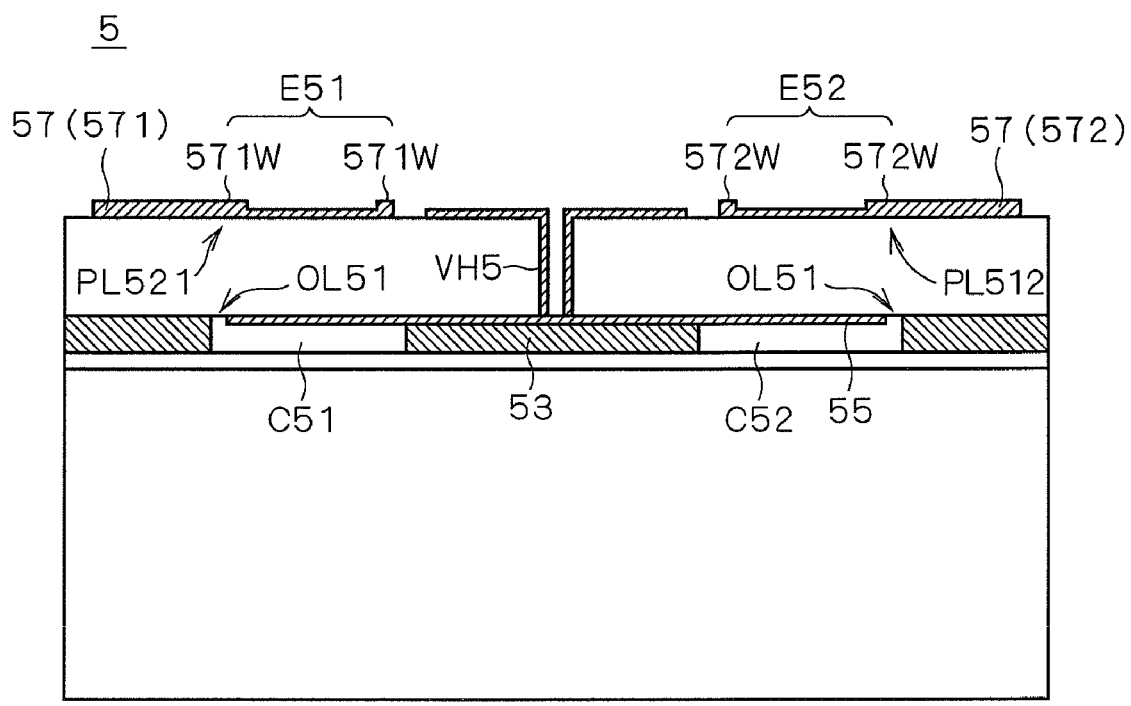
FIG. 32 is a sectional view showing a cross section of the film bulk acoustic resonator along a cross plane line XXXII-XXXII of FIG. 30.
Figure 33:
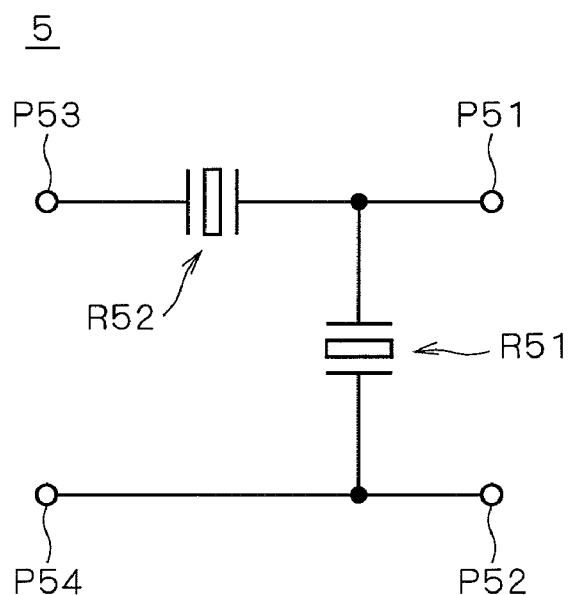
FIG. 33 is a circuit view showing electric connection of two film bulk acoustic resonators included in the piezoelectric thin film filter.

FIGS. 30 to 33 are schematic views showing a configuration of a piezoelectric thin film filter 5 according to a fifth embodiment of the present invention. FIG. 30 is an oblique view of the piezoelectric thin film filter 5 seen obliquely from above, FIG. 31 is a plan view of the piezoelectric thin film filter 5 seen from above, FIG. 32 is a sectional view showing a cross section of the piezoelectric thin film filter 5 along a cutting plane line XXXII-XXXII of FIG. 30, and FIG. 33 is a circuit diagram showing electrical connection between two film bulk acoustic resonators R51 and R52 included in the piezoelectric thin film filter 5. It is to be noted that in FIG. 30, an XYZ orthogonal coordinate system is defined for the sake of explanation where the right-and-left direction is the X-axis direction, the front-and-back direction is the Y-axis direction, and the top-and bottom-direction is the Z-axis direction.

As shown in FIGS. 30 to 33, in the same manner as the case of the film bulk acoustic resonator 4 of the fourth embodiment, the piezoelectric thin film filter 5 has a configuration where an adhesive layer 52, a cavity formation film 53, a lower electrode 55, a piezoelectric thin film 56, and an upper electrode 57 are laminated in this order on a support substrate 51. The support substrate 51, the adhesive layer 52, the cavity formation film 53, the lower electrode 55, the piezoelectric thin film 56 and the upper electrode 57 can be respectively constituted using the same materials of those of the support substrate 41, the adhesive layer 42, the cavity formation film 43, the lower electrode 45, the piezoelectric thin film 46 and the upper electrode 47 of the fourth embodiment.

Here, patterns of the upper electrode 57 and the lower electrode 55 are described, which are different from the case of the film bulk acoustic resonator 4 of the fourth embodiment.

Out of the upper electrode 57, the upper electrode 571 is opposed to the lower electrode 55 with the piezoelectric thin film 56 interposed therebetween in an opposing region E51, to constitute a film bulk acoustic resonator (serial resonator) R52. After pulled out from the opposing region E51 in the +Y direction, the upper electrode 571 is bent in the +X direction and the −Y direction sequentially in its extending direction, and the pulled-out portion is a feeding section for feeding the excitation signal to the upper electrode 571. Part of the feeding portion is a pad 53 connected with external wiring.

The upper electrode 572 is opposed to the lower electrode 55 with the piezoelectric thin film 56 interposed therebetween in an opposing region E52, to constitute a film bulk acoustic resonator (parallel resonator) R51. After pulled out from the opposing region E52 in the −Y direction, the upper electrode 572 is bent in the −X direction and the +Y direction sequentially in its extending direction, and the pulled-out portion is a feeding section for feeding the excitation signal to the upper electrode 572. Parts of the feeding portions are pads P52 and P54 which are connected with external wiring.

The upper electrode 573 is opposed to the lower electrode 55 with the piezoelectric thin film 56 interposed therebetween in a region other than the opposing regions E51 and E52. Since a via hole VH5 conducts the upper electrode 573 and the lower electrode 55, in the piezoelectric thin film filter 5, the excitation signal is fed to the lower electrode 55 via the upper electrode 572 exposed to the outside. Part of the upper electrode 572 is the pad P51 connected with external wiring.

As shown in the sectional view of FIG. 32, cavities C51 and C52 for separating the opposing regions E51 and E52 from the support substrate 51 are formed below the opposing regions E51 and E52.

With the upper electrode 57 and the lower electrode 55 as thus arranged, the piezoelectric thin film filter 5 is a ladder-type band-pass filter obtained by monolithically unifying film bulk acoustic resonators R51 and R52.

In the film bulk acoustic filter 5, as in the case of the film bulk acoustic resonator 4 of the fourth embodiment, the upper electrode 571 has a structure where a conductive thin film is further superposed on the conductive thin film with a substantially uniform film thickness across a frame-like region RG511 along the inner side of the outer periphery of the opposing region E51 and a region RG512 of the feeding section making up the whole of the feeding section adjacent to the opposing region E51. The upper electrode 572 has a structure where a conductive thin film is further superposed on the conductive thin film with a substantially uniform film thickness across a frame-like region RG521 along the inner side of the outer periphery of the opposing region E52 and a region RG522 making up the whole of the feeding section adjacent to the opposing region E52. The upper electrode 571 also has a structure where, due to the presence of the conductive thin films superposed on the regions RG511 and RG512, the weighted portions 571W and 572W for adding a mass are arranged across both sides of a portion which are the outer peripheries of the opposing regions E51 and E52 and projected outline borders PL511 and PL512 drawn by projecting the outline border OL51 of the lower electrode 55 on the upper electrodes 571 and 572. Naturally, the weighted potions 571W and 572W as described in "Another example of weighted potion" in the fourth embodiment may be adopted to the piezoelectric thin film filter 5.

In the piezoelectric thin film filter 5 as thus described, since sub-resonance which depends upon the outline shape of the piezoelectric thin film 56 can be suppressed, a filtering characteristic is unsusceptible to spuriousness.

6. Others

It is to be noted that the present invention includes the following inventions [1] to [5].

[1] A piezoelectric thin film device including a single or a plurality of film bulk acoustic resonators, which includes: a piezoelectric thin film having flat first and second main surfaces; a first portion electrode which covers part of the first main surface; a second portion electrode which covers part of the second main surface, wherein the first potion electrode has a weighted portion with a mass per unit larger than that of the central portion of an opposing region where the first electrode and the second electrode are opposed to each other with the piezoelectric thin film interposed therebetween, across both sides of a portion which is the outer periphery of the opposing region and a projected outline border drawn by projecting the outline border of the second portion electrode on the first portion electrode.

[2] The piezoelectric thin film device according to [1], wherein the weighted portion surrounds the central portion.

[3] The piezoelectric thin film device according to [2], wherein the first portion electrode further has another weighted portion on the inner side of the weighted portion surrounding the central portion.

[4] The piezoelectric thin film device according to any of [1] to [3], wherein the weighted portion is formed by increasing a film thickness of the electrode.

[5] The piezoelectric thin film device according to any of [1] to [4], wherein the weighted portion increases its mass per unit area with distance from the central portion.

EXAMPLES

In the following described are examples according to the desired embodiments of the present invention, and comparative examples out of the range of the present invention.

Example 1

Example 1 is an example regarding the film bulk acoustic resonator 1 where the drive sections 151 and the drive section 131 each have a rectangular shape with its long-side length La being twice as large as its short-side length Lb.

In Example 1, the film bulk acoustic resonator 1 was produced using: a single crystal of lithium niobate as the piezoelectric material constructing the support substrate 11 and the piezoelectric thin film 14; an epoxy adhesive agent as a material constituting the adhesive layer 12; molybdenum and tantalum as the conductive materials constituting the lower electrode 13; and chromium and gold as the conductive materials constituting the upper electrode 15.

Figure 34:
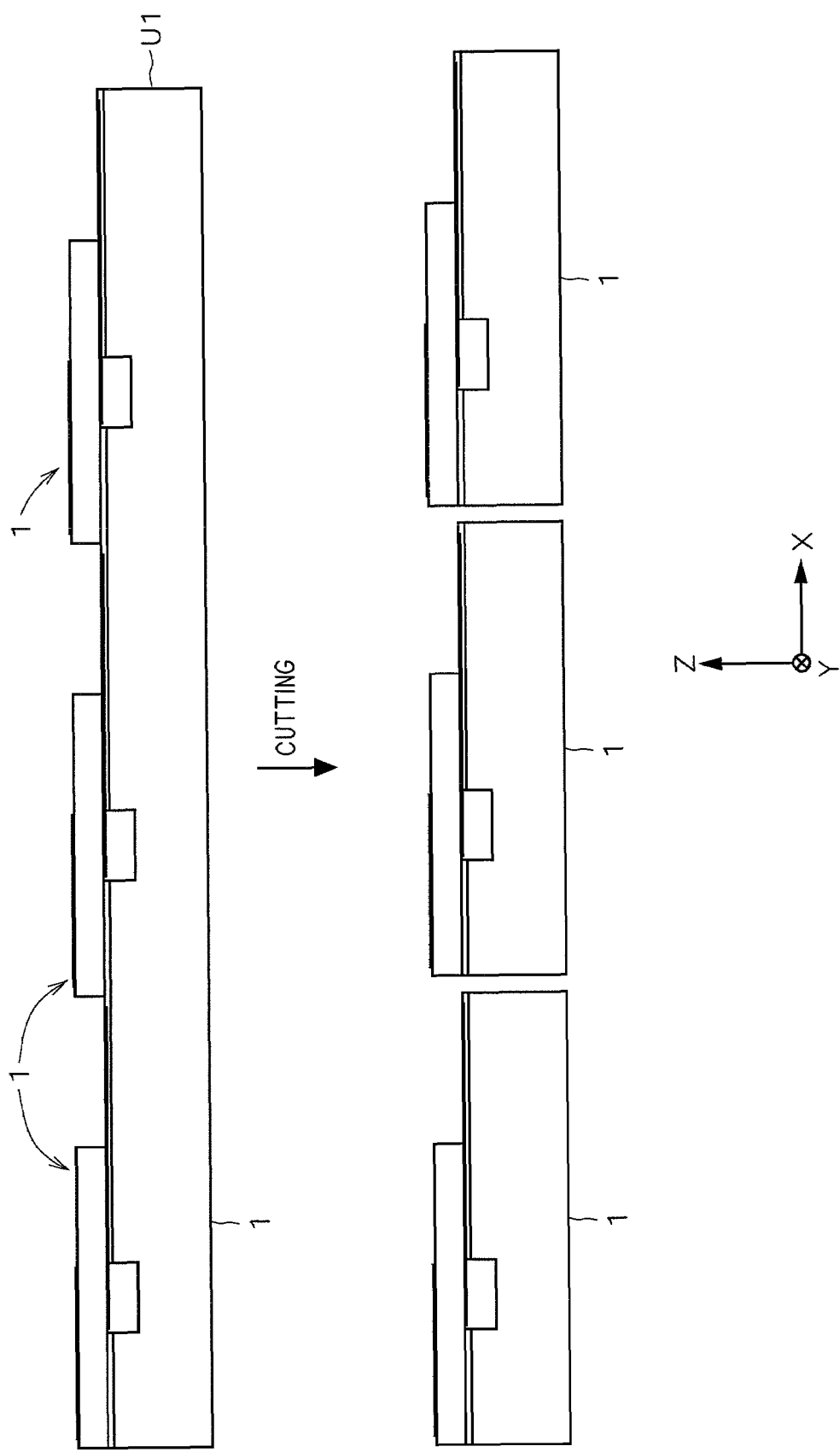
FIG. 34 is a sectional view showing the state of separation of an assembly obtained by integrating a large number of film bulk acoustic resonators, into separate film bulk acoustic resonators.

As shown in a sectional view of FIG. 34, in order to reduce manufacturing cost, the film bulk acoustic resonator 1 of Example 1 is obtained in the following manner. After production of an assembly U1 by integration of a large number of film bulk acoustic resonators 1, the assembly U1 is cut using a dicing saw into individual film bulk acoustic resonators 1. It is to be noted that, although the example of including three film bulk acoustic resonators 1 in the assembly U1 is shown in FIG. 8, the number of film bulk acoustic resonators 1 included in the assembly U1 may be four or larger, and typically, several hundreds to several thousands of film bulk acoustic resonators 1 are included in the assembly U1.

Although description is made with focus on one film bulk acoustic resonator 1 included in the assembly U1 for the sake of simplicity, the other film bulk acoustic resonators 1 included in the assembly are produced simultaneously with the focused film bulk acoustic resonator 1.

Subsequently, the method for manufacturing the film bulk acoustic resonator 1 of Example 1 is described with reference to FIGS. 35A to 35D and 36E to 36G. It is to be noted that FIGS. 35A to 35D and FIG. 36E to 36G are sectional views along the cutting-plane line II-II of FIG. 1 of the film bulk acoustic resonator 1 during manufacture.

In manufacture of the film bulk acoustic resonator 1, first, a circular wafer (36-degree-cut Y plate) of a single crystal of lithium niobate with a film thickness of 0.5 mm and a diameter of 3 inches was prepared as the support substrate 11 and a piezoelectric substrate 17.

Subsequently, a mask (laminated film included of a chromium film and a gold film) M1 in which a region to form the depression 111 is an opening is formed on the upper surface of the support substrate 11 (FIG. 35A), and the support substrate 11 is immersed in a 1:1 buffered hydrofluoric acid aqueous solution at 60° C., to obtain the support substrate 11 with the depression 111 formed therein (FIG. 35B).

Thereafter, a molybdenum film with a film thickness of 0.057 µm and a tantalum film with a film thickness of 0.02 µm were formed on the lower surface of the piezoelectric substrate 17 by sputtering, and the lower electrode 13 having the pattern shown in FIG. 3B was obtained by photolithography (FIG. 35C).

Thereafter, an epoxy adhesive agent to be the adhesive layer 12 was applied to the upper surface of the support substrate 11, to bond the upper surface of the support substrate 11 with the lower surface of the piezoelectric substrate 17. Pressure was then applied to the support substrate 11 and the piezoelectric substrate 17 for press pressure bonding, to make the adhesive layer 12 have a thickness of 0.5 µm. Thereafter, the support substrate 11 and the piezoelectric substrate 17, bonded to each other, were left to stand in a 200° C. environment for one hour for curing the epoxy adhesive agent, so as to bond the support substrate 11 with the piezoelectric substrate 17 (FIG. 35D).

Figure 36E:
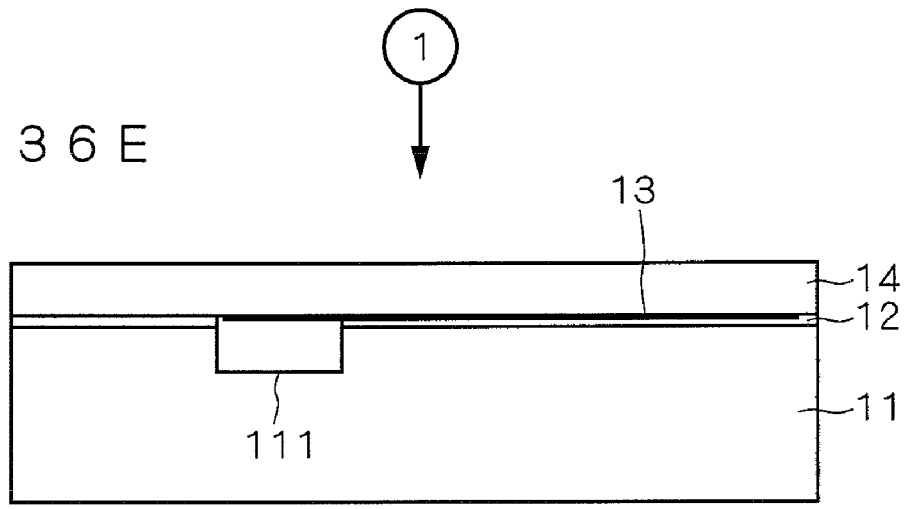
FIGS. 36E to 36G is a view for explaining the method for manufacturing the film bulk acoustic resonator.

After completion of bonding of the support substrate 11 with the piezoelectric substrate 17, while the piezoelectric substrate 17 was kept in the state of being bonded to the support substrate 11, the lower surface of the support substrate 11 was fixed to a polishing jig made of silicon carbide (SiC), and the upper surface of the piezoelectric substrate 17 was subjected to grinding processing using a grinding machine with fixed abrasive grains, to reduce the thickness of the piezoelectric substrate 17 down to 50 µm. Further, the upper surface of the piezoelectric substrate 17 was subjected to polishing processing using diamond abrasive grains, to reduce the thickness of the piezoelectric substrate 17 down to 2 µm. Finally, for removing a process degradation layer generated on the piezoelectric substrate 17 by polishing processing using the diamond abrasive grains, free abrasive grains and a non-woven polishing pad were used to perform finish-polishing on the piezoelectric substrate 17 so as to obtain the piezoelectric thin film 14 with a film thickness of 1 μm (FIG. 36E).

Figure 36F:
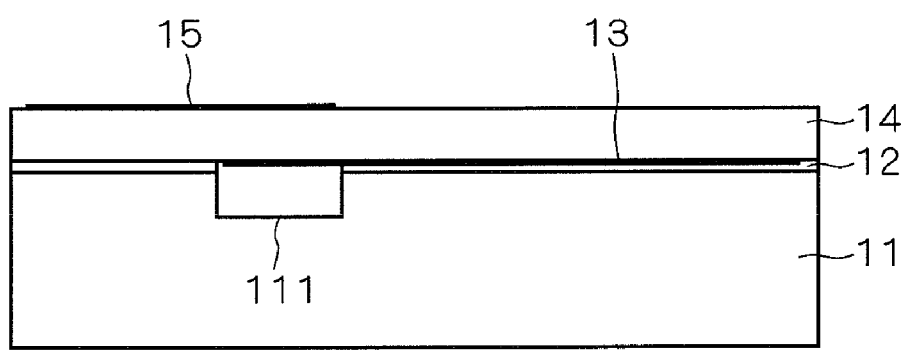

Subsequently, the upper surface (polished surface) of the piezoelectric thin film 14 was washed using an organic solvent, and a chromium film with a film thickness of 0.02 μm and a gold film with a film thickness of 0.0515 μm were formed by sputtering, and the upper electrode 15 having the pattern shown in FIG. 3A was obtained by photolithography (FIG. 36F).

Figure 36G:
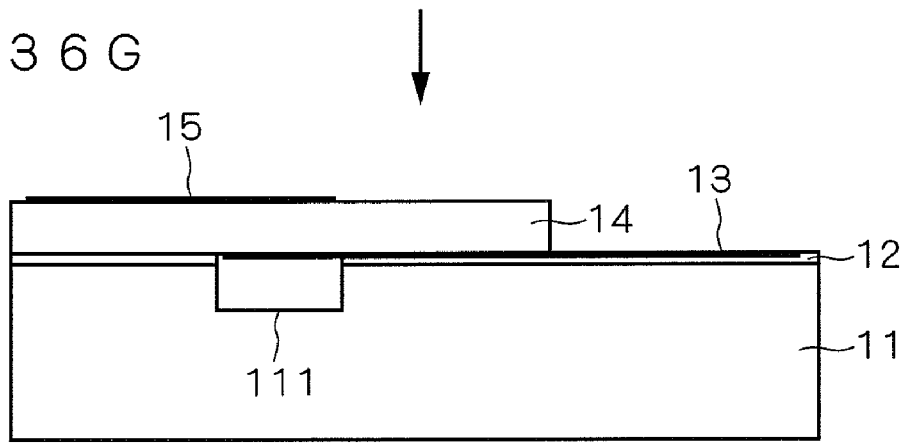

Further, a portion of the piezoelectric thin film 14 which covers the pad 133 of the lower electrode 13 was removed by etching using hydrofluoric acid, to obtain the film bulk acoustic resonator 1 with the pad 133 exposed (FIG. 36G).

Figure 37:
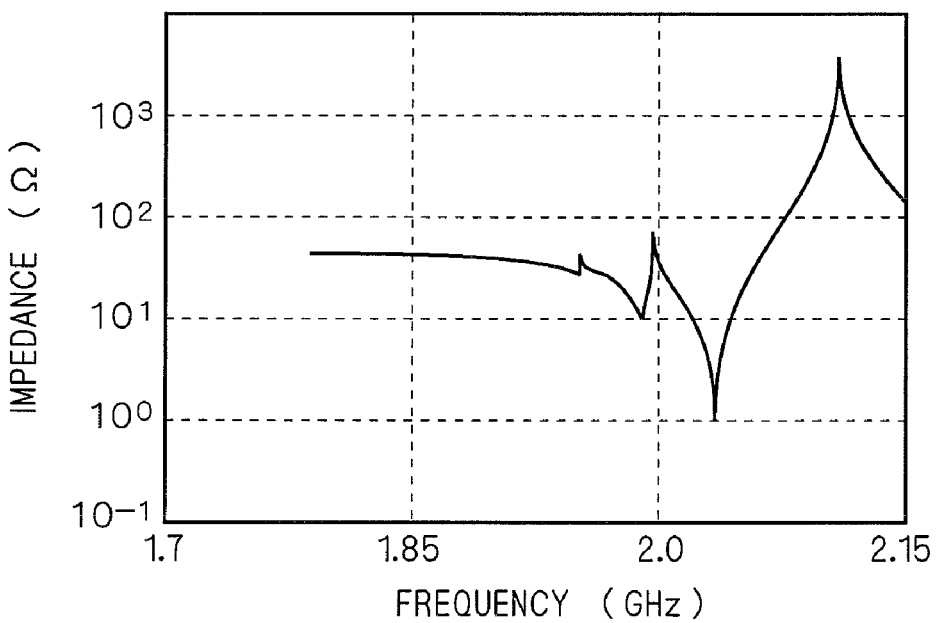
FIG. 37 is a view showing a frequency impedance characteristic of a film bulk acoustic resonator of Example 1.

A frequency impedance characteristic of the film bulk acoustic resonator 1 as thus obtained was estimated using a network analyzer and a prober, to obtain a resonance waveform, on which a small influence is exerted by spuriousness, as shown in FIG. 37.

Figure 40:
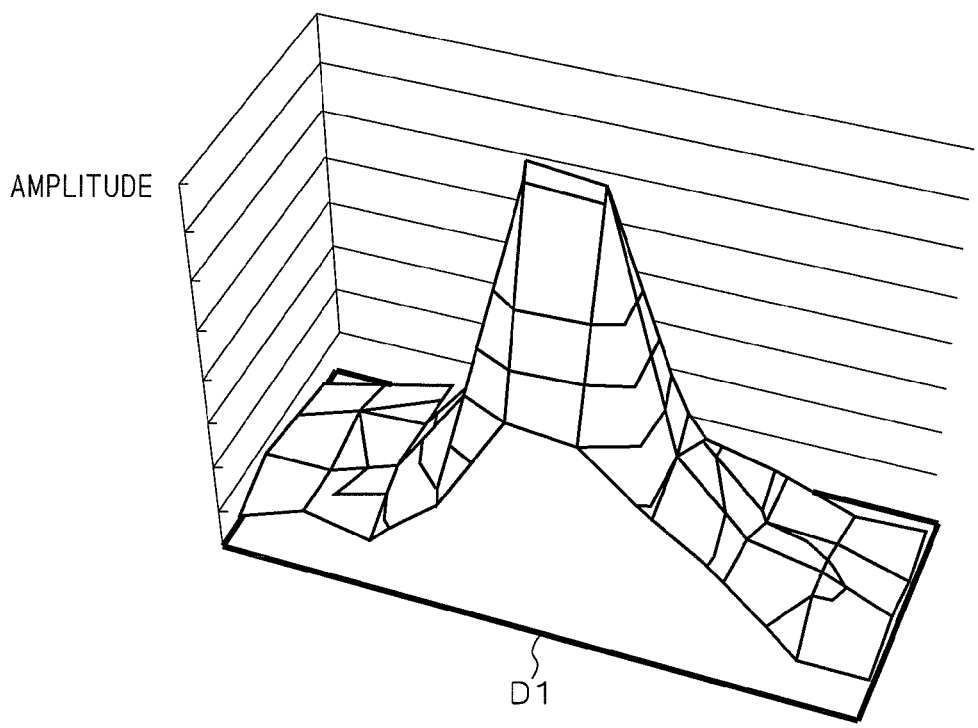
FIG. 40 is a view showing a distribution of amplitude of vibrations in a drive section of the film bulk acoustic resonator of Example 1.

Moreover, a distribution of the amplitude of the vibrations in the drive section was measured using a laser displacement gauge, to find that, as shown in FIG. 40, the amplitude is large in the vicinity of the center of the drive section shown by the range D1, and become smaller with distance from the center of the drive section, and the range of diffusion of vibrations in the long side direction is only about as large as the short side length Lb of the drive section.

It is considered that the amplitude distribution as thus described is obtained such that a two-dimensional wave surface of acoustic waves spread from the center of the drive section is strongly influenced by a distribution of an electric field in the short side direction of the drive section 151, to generate a strong effect of energy trapping into the vicinity of the center of the drive section so as to strongly suppress leakage of the vibrations.

Example 2

Example 2 is an example regarding the film bulk acoustic resonator 1 where the drive sections 151 and the drive section 131 each have a rectangular shape with its long-side length La being four times as large as its short-side length Lb. In Example 2, the film bulk acoustic resonator 1 was manufactured in the same process as in Example 1 except that the patterns of the upper electrode 15 and the lower electrode 13 were changed.

Figure 38:
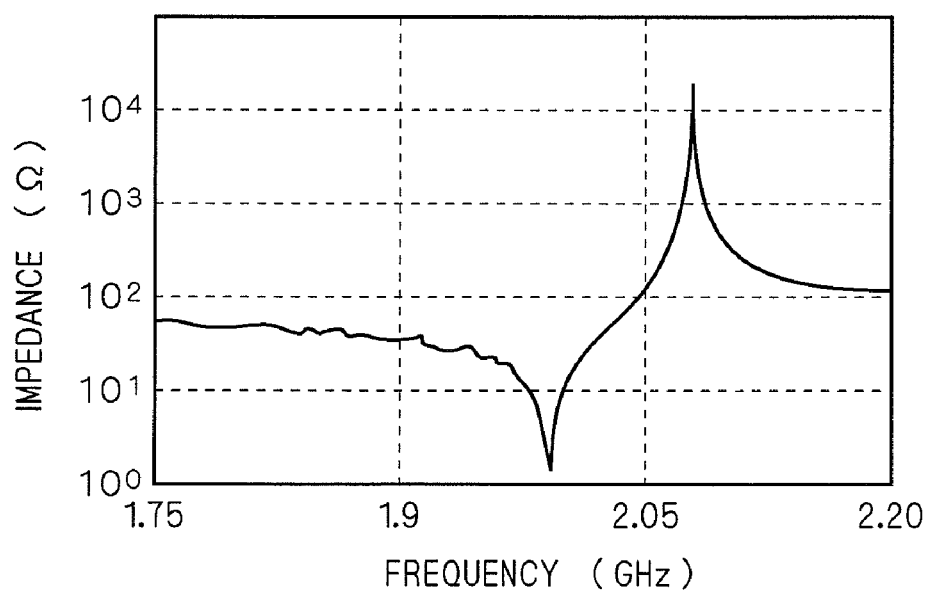
FIG. 38 is a view showing a frequency impedance characteristic of a film bulk acoustic resonator of Example 2.

A frequency impedance characteristic of the film bulk acoustic resonator 1 as thus obtained was estimated using a network analyzer and a prober, and thereby a single resonance waveform could be observed on which almost no influence was exerted by spuriousness, as shown in FIG. 38.

Comparative Example 1

Comparative Example 1 is an example regarding a film bulk acoustic resonator out of the range of the present invention, with the drive sections 151 and the drive section 131 each having a circular shape. In Comparative Example 1, the film bulk acoustic resonator was produced in the same practice as in Example 1 except that the patterns of the upper electrode and the lower electrode were changed.

Figure 39:
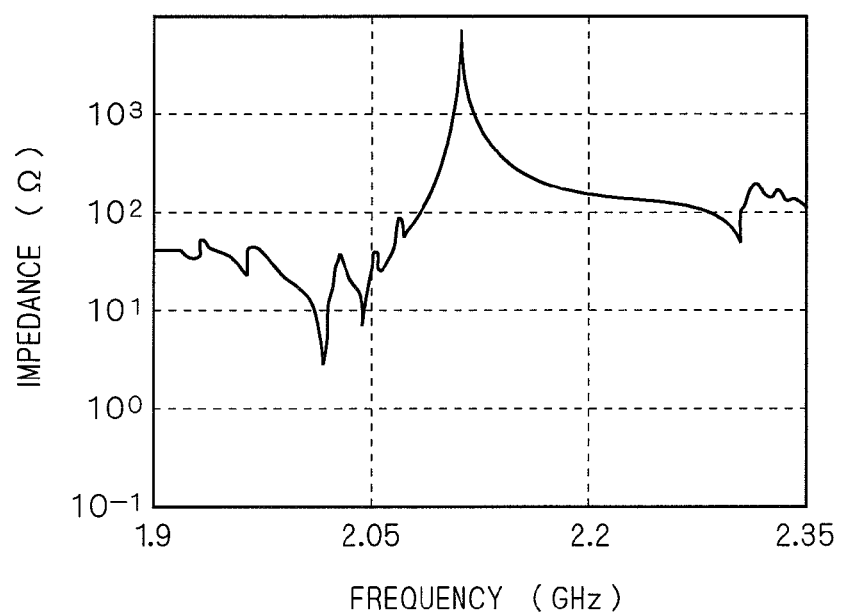
FIG. 39 is a view showing a frequency impedance characteristic of a film bulk acoustic resonator of Comparative Example.

A frequency impedance characteristic of the film bulk acoustic resonator 1 as thus obtained was estimated using the network analyzer and the prober, and thereby only a resonance waveform formed by a large number of laminated spuriousness could be observed. as shown in FIG. 39.

Figure 41:
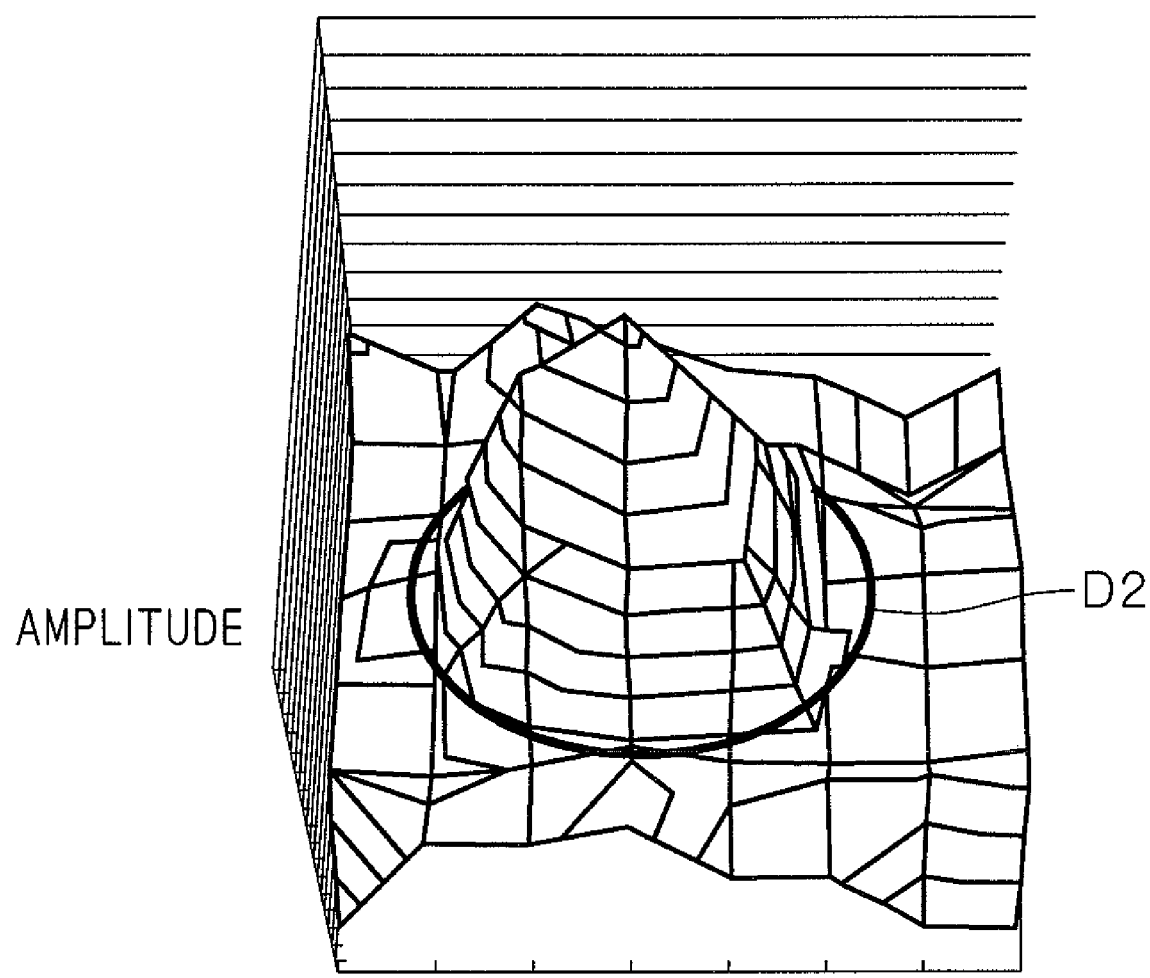
FIG. 41 is a view showing a distribution of amplitudes of vibrations in a drive section of the film bulk acoustic resonator of Comparative Example.

Further, a distribution of the amplitude of the vibrations in the drive section was measured using the laser displacement gauge, to find that the vibrations are distributed broadly throughout the drive section shown by the range D2, as shown in FIG. 41.

Comparison Among Examples 1 to 2 and Comparative Example 1

As apparent from Examples 1 and 2 and Comparative Example 1, making the shape of the drive section slender enables suppression of propagation of vibrations in its longitudinal direction of the drive section so that an energy trapping-type film bulk acoustic resonator can be realized in which most of energy is concentrated on the vicinity of the center of the drive section. Due to such strong energy trapping, in those film bulk acoustic resonators 1, generation of sub-resonance caused by the outline of the piezoelectric thin film 14 is suppressed to make the frequency impedance characteristic unsusceptible to spuriousness despite a disadvantageous condition of the use of piezoelectric material with a large electromechanical coupling factor as lithium niobate and undesirable propagation of acoustic waves to the end of the piezoelectric thin film 14.

It is to be noted that such a spuriousness suppressing effect is obtained so long as the drive section is in slender shape, and adoption of the shape illustrated in FIGS. 4 to 8 is not necessarily essential.

Example 3

Example 3 is an example regarding the film bulk acoustic resonator 3 where the drive sections 351 and 331 each have a rectangular shape with its long-side length La being ten times as large as its short-side length Lb. In Example 3, the weighted portion 351W is formed such that a conductive thin film with a substantially uniform film thickness is formed and then a conductive thin film is further formed as superposed on a portion to become the weighted portion 351W.

In Example 3, the film bulk acoustic resonator 3 was produced using: a single crystal of lithium niobate as the piezoelectric material constructing the piezoelectric thin film 34 and the support substrate 31; an epoxy adhesive agent as a material constituting the adhesive layer 32; and tungsten as the conductive materials constituting the upper electrode 35 and the lower electrode 33.

The film bulk acoustic resonator 3 of Example 3 can be manufactured in a manufacturing method similar to that for the film bulk acoustic resonator 1 of Example 1. However, in manufacture of the film bulk acoustic resonator 3, the film bulk acoustic resonator 3 is different from the film bulk acoustic resonator 1 in that tungsten films are formed as the upper electrode 35 and the lower electrode 33, and the weighted portion 351W is formed on the upper electrode 35.

Figure 42:
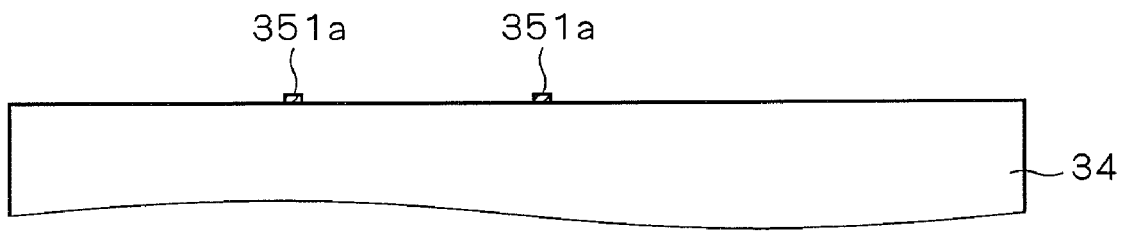
FIG. 42 is a sectional view for explaining a method for manufacturing a film bulk acoustic resonator of Example 3.

In formation of the weighted portion 351W, first, a tungsten film with a film thickness of 500 angstroms was formed all over the upper surface of the piezoelectric thin film 34 by sputtering, and then subjected to patterning by means of a typical photolithography process, to leave a tungsten film 351a only on a portion to become the weighted portion 351W of the upper electrode 35 (FIG. 42).

Figure 43:
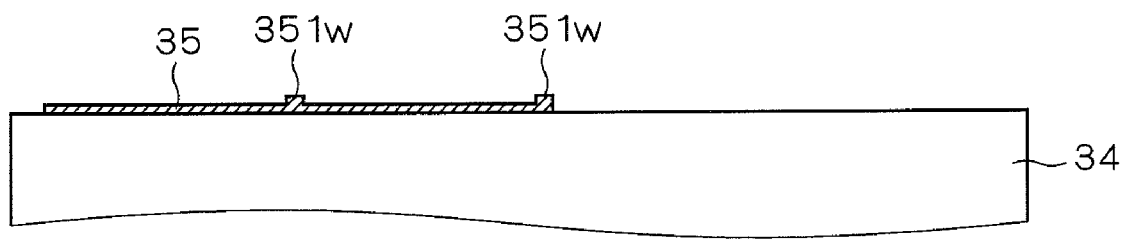
FIG. 43 is a sectional view for explaining a method for manufacturing the film bulk acoustic resonator of Example 3.

Further, a tungsten film with a film thickness of 1000 angstroms was formed all over the upper surface of the piezoelectric thin film 34 by sputtering, and then subjected to patterning by means of the typical photolithography process, to obtain the upper electrode 35 having the pattern shown in FIGS. 14, 15, 16A and 16B and provided with the weighted portion 351W (FIG. 43).

A frequency impedance characteristic of the film bulk acoustic resonator 3 as thus obtained was estimated using the network analyzer and the prober, and thereby a resonance waveform could be observed in proximity to main resonance at about 2.2 GHz, on which a small influence is exerted by spuriousness, as shown in FIG. 44.

Example 4

Example 4 is an example regarding a film bulk acoustic resonator obtained by adding the weighted portion 351W to the film bulk acoustic resonator 3 of Example 3, along the inner side of the short side 351S of the drive section 351.

A frequency impedance characteristic of the film bulk acoustic resonator of Example 4 was estimated using the network analyzer and the prober, and thereby a resonance waveform could be obtained in proximity to main resonance at about 2.0 GHz, on which a small influence is exerted by spuriousness, as shown in FIG. 45. However, in the film bulk acoustic resonator of Example 4, the resonance waveform of the resonator formed by the weighted portion 351W was superposed at about 1.6 GHz.

Example 5

In Example 5, in the film bulk acoustic resonator 3 of Example 3, when a side ratio La/Lb of the long-side length La to the short-side length Lb was changed in the range from 1 to 100, changes were checked in strength (hereinafter referred to as spurious strength) Ia of a resonance waveform of spuriousness in proximity to the main resonance, and in strength (hereinafter referred to as low-frequency resonance waveform strength) Lb of a low-frequency resonance waveform of a resonator formed by the weighted portion 351W. The results are shown in FIGS. 46 and 47.

Figure 47:
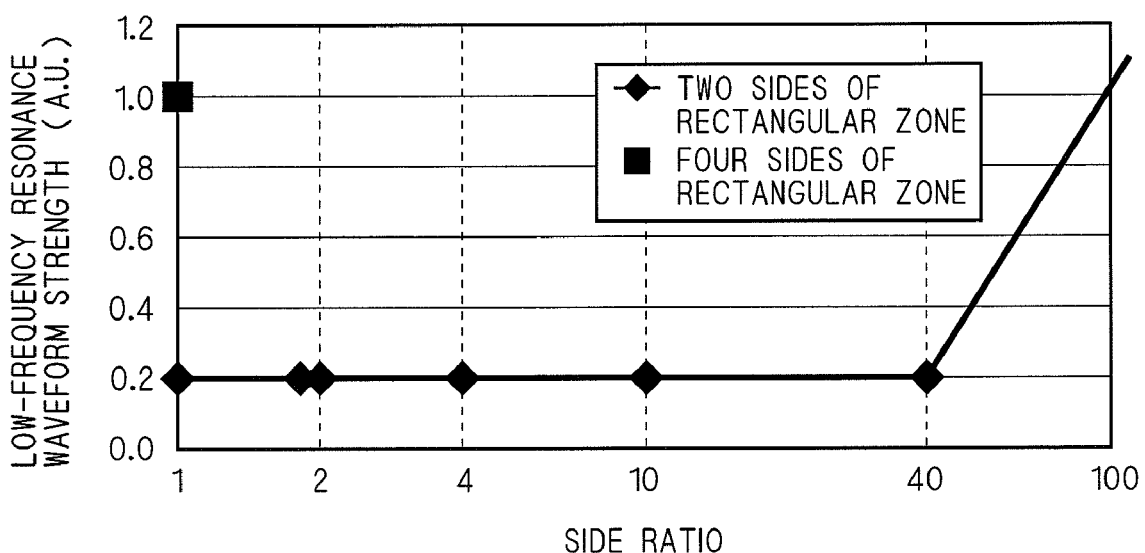
FIG. 47 is a view showing dependency of low-frequency resonant waveform strength upon the side ratio La/Lb.
Figure 48:
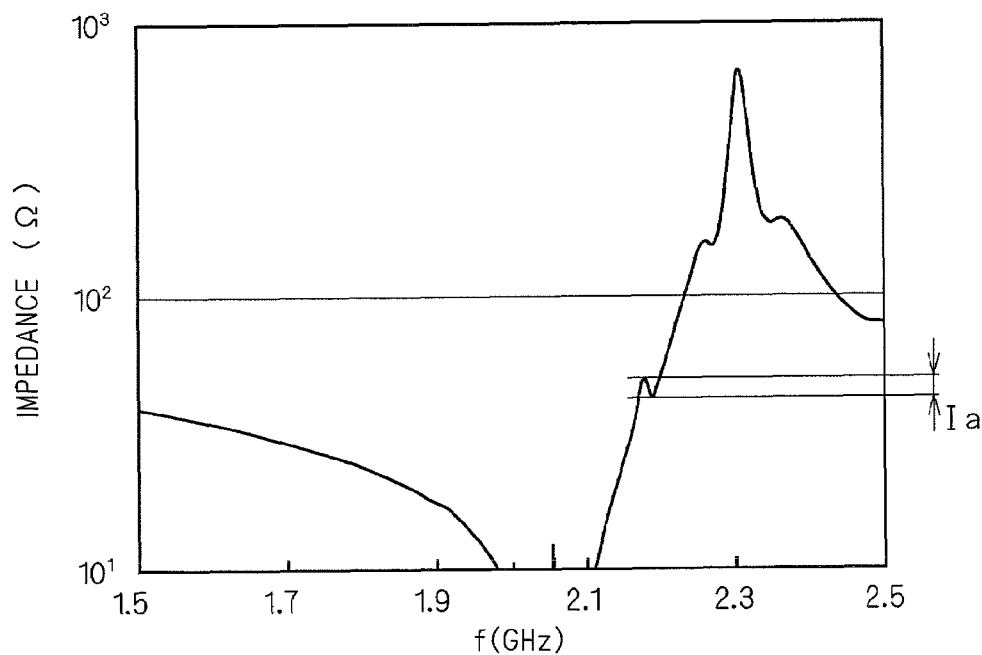
FIG. 48 is a view for explaining a definition of the spurious strength.
Figure 49:
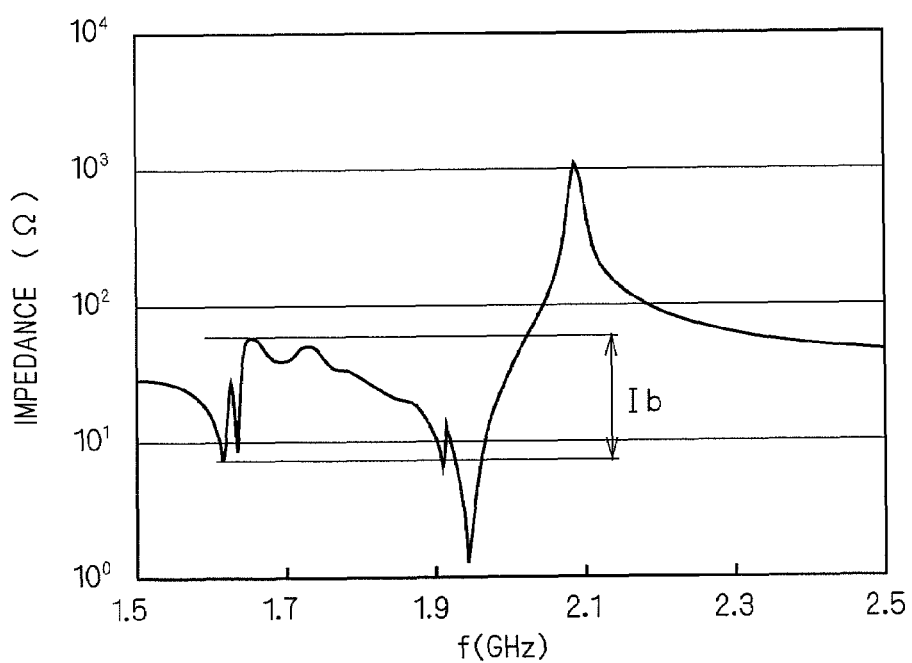
FIG. 49 is a view for explaining a definition of the low-frequency resonant waveform strength.

It is to be noted that as shown in FIG. 48, the "spurious strength Ia" indicates a width between a resonance resistance and an antiresonance resistance of the resonance waveform of spuriousness. As shown in FIG. 49, the "spurious strength Ib" indicates a width between a resonance resistance and an antiresonance resistance of the low-frequency resonance waveform. Further, in FIGS. 46 and 47, in the film bulk acoustic resonator of Example 4 with the side ratio La/Lb of one (four sides of the rectangular zone) as a reference, relative values of the spurious strength Ia and the low-frequency resonance waveform strength Ib are indicated with the side ratio La/Lb changed in the range of 1 to 10 (two sides of the rectangular zone)

Figure 46:
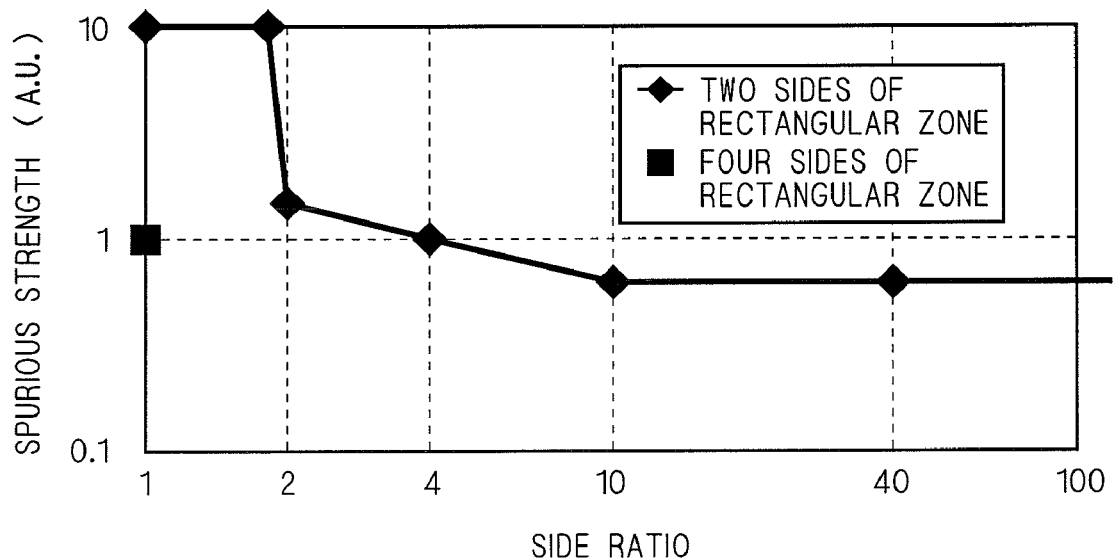
FIG. 46 is a view showing dependency of spurious strength upon a side ratio La/Lb.

As apparent from FIGS. 46 and 47, when the side ratio La/Lb is one, provision of the weighted portion 351W only along the inner side of the long side 351L cannot lead to reduction in spurious strength Ia. However, when the side ratio La/Lb is not less than two, desirably not less than four, and further desirably not less than ten, the provision of the weighted portion 351W only along the inner side of the long side 351L can lead to sufficient reduction in spurious strength Ia. Meanwhile, when the side ratio La/Lb is not less than one and not more than 40, the provision of the weighted portion 351W only along the inner side of the long side 351L can lead to sufficient reduction in low-frequency resonance waveform Ib.

Example 6

In the following described is Example 6 regarding the film bulk acoustic resonator 4 according to the fourth embodiment of the present invention. In Example 6, the weighted portion 471W is formed such that a conductive thin film with a substantially uniform film thickness is formed and then a conductive thin film is further formed as superposed on a portion to become the weighted portion 471W.

In Example 6, the film bulk acoustic resonator 4 was produced using: a single crystal of lithium niobate as the piezoelectric material constructing the piezoelectric thin film 46 and the support substrate 41; tungsten as the conductive material constituting the upper electrode 47 and the lower electrode 45; silicon dioxide as the insulating material constituting the cavity formation film 43; and an epoxy adhesive agent as the material constituting the adhesive layer 42.

Figure 50:
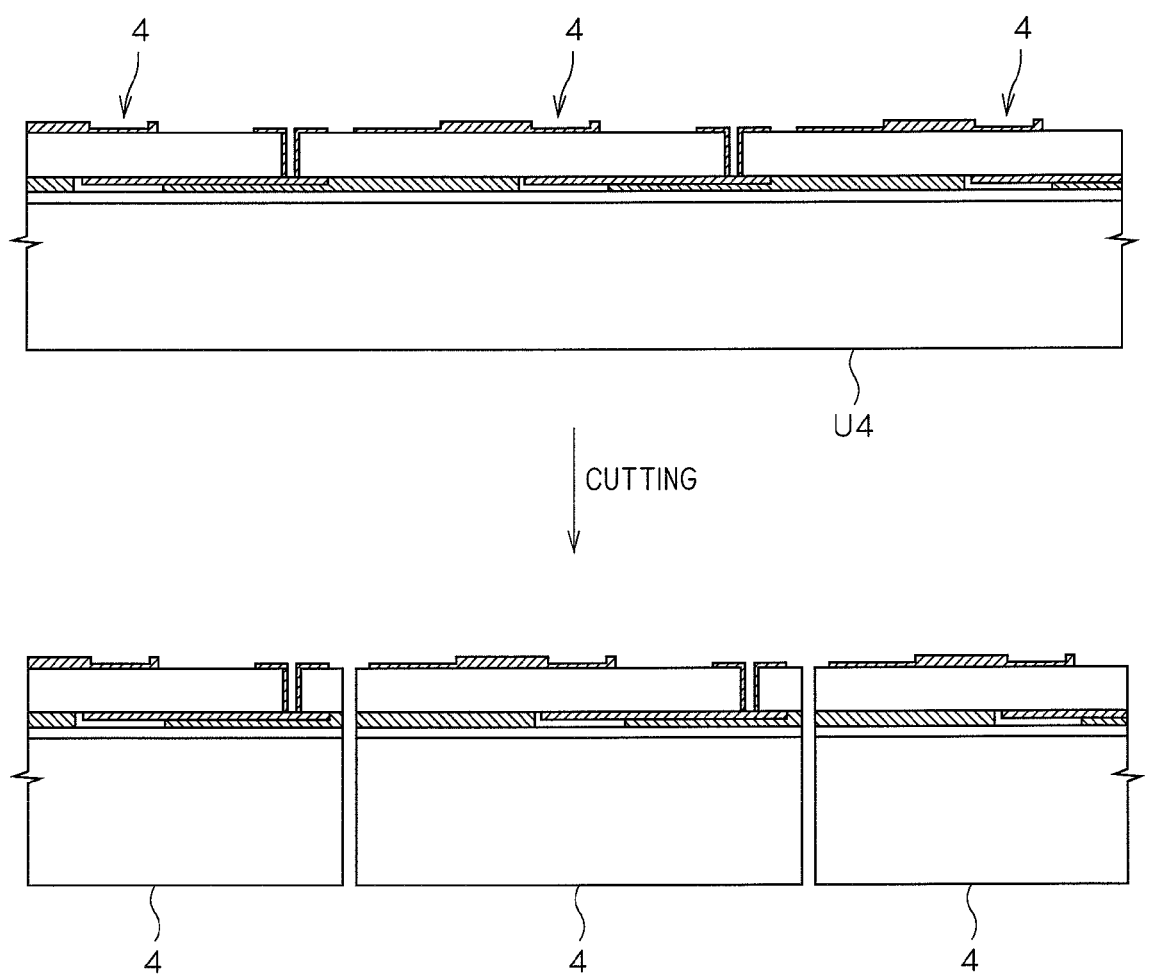
FIG. 50 is a view showing the state of separation of an assembly obtained by integrating a large number of film bulk acoustic resonators, into separate film bulk acoustic resonators.

As shown in FIG. 50, in order to reduce manufacturing cost, the film bulk acoustic resonator 4 of Example 6 is obtained in the following manner. After production of an assembly U4 by integration of a large number (typically, several hundreds to several thousands) of film bulk acoustic resonators 4, the assembly U4 is cut using the dicing saw into individual film bulk acoustic resonators 4.

Although description is made with focus on one film bulk acoustic resonator 4 included in the assembly U4 for the sake of simplicity, the other film bulk acoustic resonators 4 included in the assembly U4 are produced simultaneously with the focused film bulk acoustic resonator 4.

Subsequently, the method for manufacturing the film bulk acoustic resonator 4 of Example 6 is described with reference to FIGS. 51A to 51D and 52E to 52H.

In manufacture of the film bulk acoustic resonator 4, first, a circular wafer (45-degree-cut Y plate) of a single crystal of lithium niobate with a film thickness of 0.5 mm and a diameter of 3 inches was prepared as the piezoelectric substrate 49 and the support substrate 41.

Figure 51A:
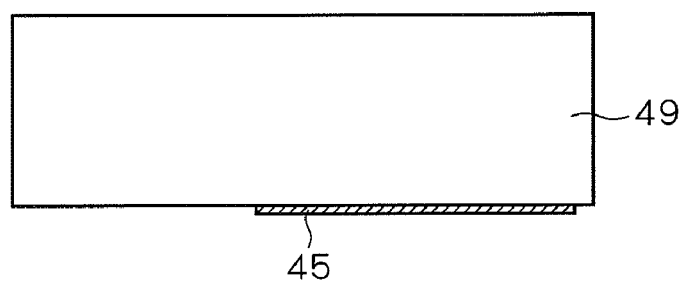
FIGS. 51A to 51D is a view for explaining a method for manufacturing a film bulk acoustic resonator according to Example 6.

Further, a tungsten film with a film thickness of 1000 angstroms was formed all over the lower surface of the piezoelectric substrate 49 by sputtering, and then subjected to patterning by means of the typical photolithography process, to obtain the lower electrode 45 having the pattern shown in FIGS. 20 and 21 (FIG. 51A).

Figure 51B:
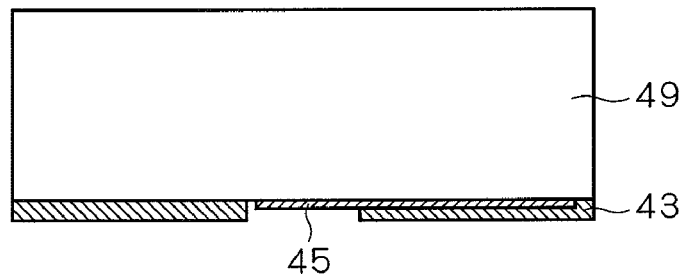

Subsequently, a silicon dioxide film with a film thickness of 0.5 µm all over the lower surface of the piezoelectric substrate 49 by sputtering, and the silicon dioxide film formed in a region to become the opposing region E4 in the piezoelectric thin film 46 obtained by removal processing on the piezoelectric substrate 49 was removed by wet-etching using hydrofluoric acid. Thereby, the cavity formation film 43 was formed in a region other than the region to become the opposing region E4 in the piezoelectric thin film 46 (FIG. 51B).

Figure 51C:
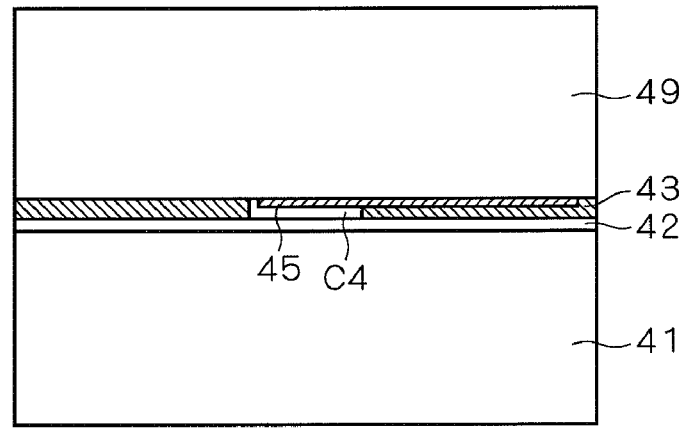

Further, the epoxy adhesive layer to be the adhesive layer 42 was applied to the upper surface of the support substrate 41, to bond the upper surface of the support substrate 41 with the lower surface of the piezoelectric substrate 49 where the lower electrode 45 and the cavity formation film 43 are formed. Pressure was then applied to the support substrate 41 and the piezoelectric substrate 49 for press pressure bonding, to make the adhesive layer 42 have a thickness of 0.5 µm. Thereafter, the support substrate 41 and the piezoelectric substrate 49 were left to stand in a 200° C. environment for one hour for curing the epoxy adhesive agent, so as to bond the support substrate 41 with the piezoelectric substrate 49. Thereby, a cavity C4 with a depth of about 0.5 µm was formed below the region to become the opposing region E4 in the piezoelectric thin film 46 of the piezoelectric thin film device 49 (FIG. 51C).

Figure 51D:
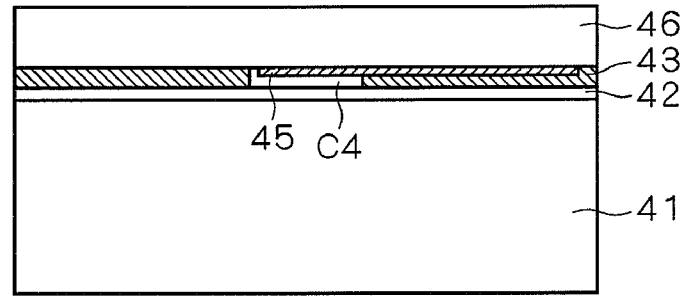

After completion of bonding of the support substrate 41 with the piezoelectric substrate 49, while the piezoelectric substrate 49 was kept in the state of being bonded to the support substrate 41, the lower surface of the support substrate 41 was fixed to a polishing jig, and the upper surface of the piezoelectric substrate 49 was subjected to grinding processing using a grinding machine with fixed abrasive grains, to reduce the thickness of the piezoelectric substrate 49 down to 50 μm. Further, the upper surface of the piezoelectric substrate 49 was subjected to polishing processing using diamond abrasive grains, to reduce the thickness of the piezoelectric substrate 49 down to 2 μm. Finally, for removing a process degradation layer generated on the piezoelectric substrate 49 by polishing processing using the diamond abrasive grains, free abrasive grains and a non-woven polishing pad were used to perform finish-polishing on the piezoelectric substrate 49 so as to obtain the piezoelectric thin film 46 with a film thickness of 1.00 μm (FIG. 51D).

Figure 52E:
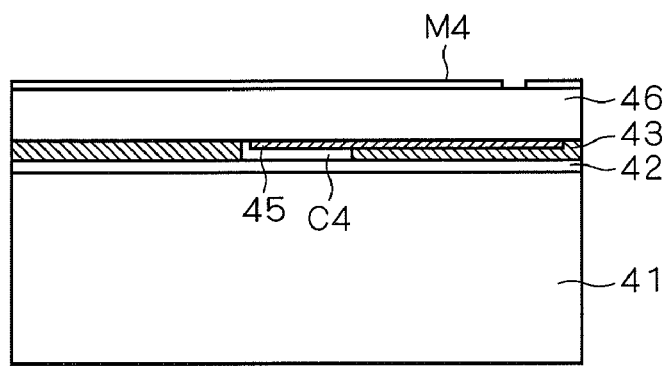
FIGS. 52E to 52H is a view for explaining the method for manufacturing the film bulk acoustic resonator according to Example 6.

Subsequently, the upper surface (polished surface) of the piezoelectric thin film 46 was washed using an organic solvent, and a chromium film with a film thickness of 200 angstroms and a gold film with a film thickness of 2000 angstroms were sequentially formed on the upper surface of the piezoelectric thin film 46, and the obtained laminated films were then patterned by pattering by means of the typical photolithography process, to obtain an etching mask M4 with only a portion to form the via hole VH4 is exposed. (FIG. 52E)

Figure 52F:
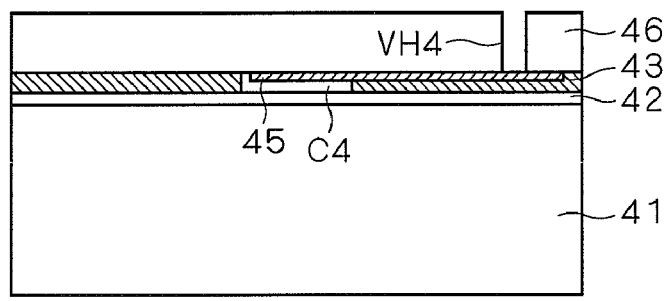

After formation of the etching mask M4, the piezoelectric thin film 46 was etched by buffered hydrofluoric acid heated to 65° C., to form the via hole VH4 which penetrates through the piezoelectric thin film 46 between its upper and lower surfaces, and thereby the lower electrode 45 is exposed and the etching mask M4 was removed by etching (FIG. 52F).

Figure 52G:
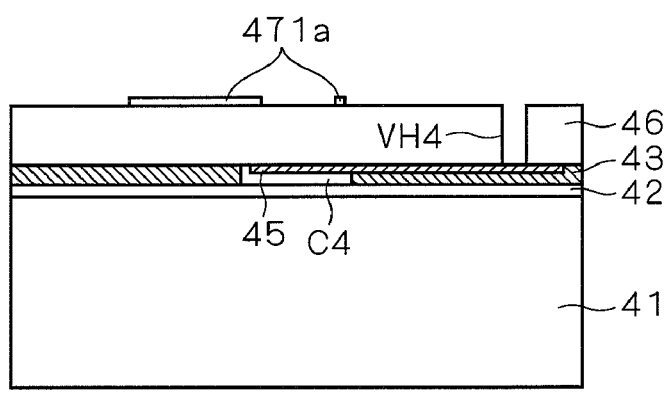

In the subsequent formation process for the upper electrode 47, first, a tungsten film with a film thickness of 500 angstroms was formed all over the upper surface of the piezoelectric thin film 46 by sputtering, and then subjected to patterning by means of the typical photolithography process, to leave a tungsten film 471a only on a portion to become the weighted portion 471W of the upper electrode 47 (FIG. 52G).

Figure 52H:
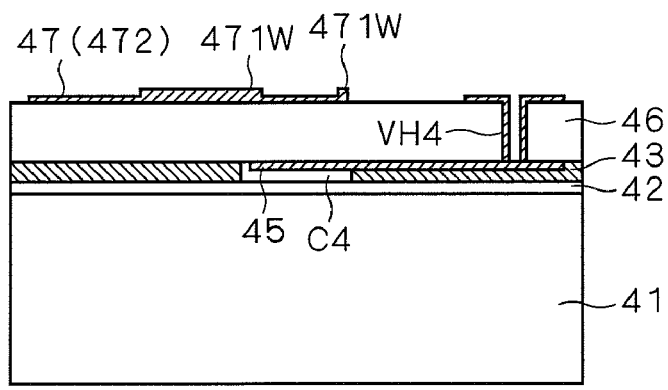

Further, a tungsten film with a film thickness of 1000 angstroms was formed all over the upper surface of the piezoelectric thin film 46 by sputtering, and then subjected to patterning by means of the typical photolithography process, to obtain the upper electrode 47 having the pattern shown in FIGS. 20 and 21 and provided with the weighted portion 471W (FIG. 52H). At this time, the tungsten film was formed also on the inner side surface of the via hole VH4, so as to secure conduction between the upper electrode 472 and the lower electrode 45.

A frequency impedance characteristic of the film bulk acoustic resonator 4 as thus obtained was measured for estimating resonance characteristic of thickness extension vibrations, to observe waveform as shown in FIG. 54, and an antiresonance resistance was 1326 ohms.

Example 7

In the following described is Example 7 regarding the piezoelectric thin film filter 5 according to the fifth embodiment of the present invention. In Example 7, a conductive thin film with a substantially uniform film 6 thickness is formed and then a portion other than the portions to become the weighted portions 571W and 572W are reduced in thickness, to form the weighted potions 571W and 572W. It is to be noted that in Example 7, the piezoelectric thin film filter 5 is produced in the same practice as in Example 6 except for the formation process for the upper electrode 57, and hence the formation process for the upper electrode 57 is described below.

Figure 53A:
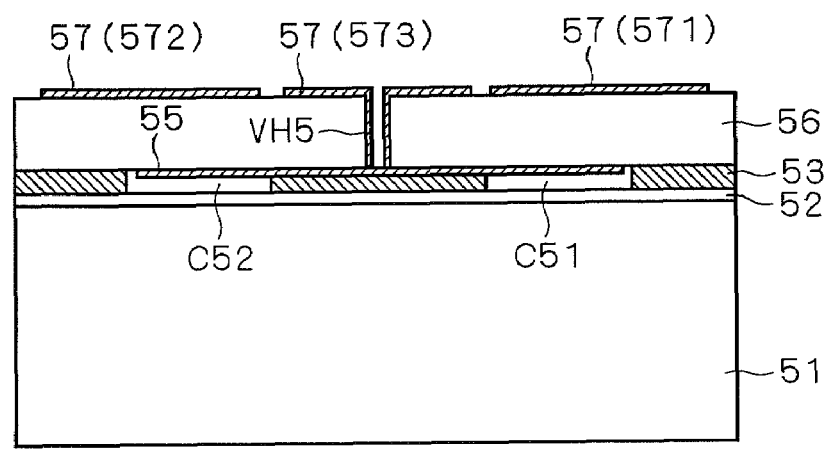
FIGS. 53A and 53B is a view for explaining a formation process for an upper electrode of a piezoelectric thin film filter according to Example 7.
Figure 53B:
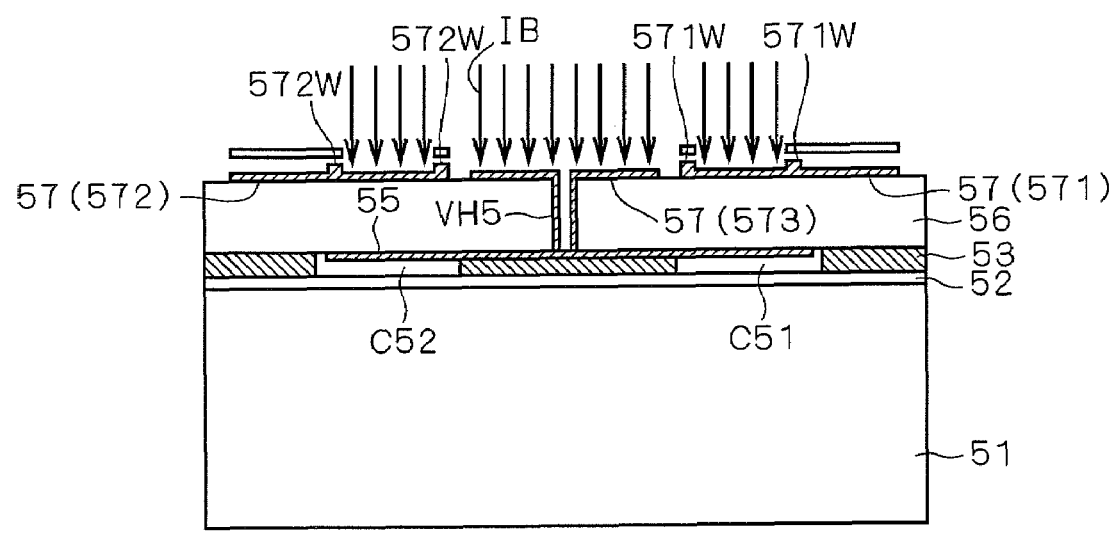

With reference to a sectional view of FIGS. 53A and 53B, the formation process of the upper electrode 57 is described. First, a tungsten film with a film thickness of 1200 angstroms was formed all over the upper surface of the piezoelectric thin film 56 by sputtering, and then subjected to patterning by means of the typical photolithography process, to obtain the upper electrode 57 having the patterns shown in FIGS. 30 and 31 (FIG. 53A). At this time, the tungsten film was formed also on the inner side surface of the via hole VH5, so as to secure conduction between the upper electrode 573 and the lower electrode 55.

Further, portions to become the weighted portions 571W and 572W of the upper electrodes 571 and 572 were protected by a metal mask, and the remnant portion was etched using an ion beam IB, to form the weighted portions 571W and 572W (FIG. 53B).

Figure 56:
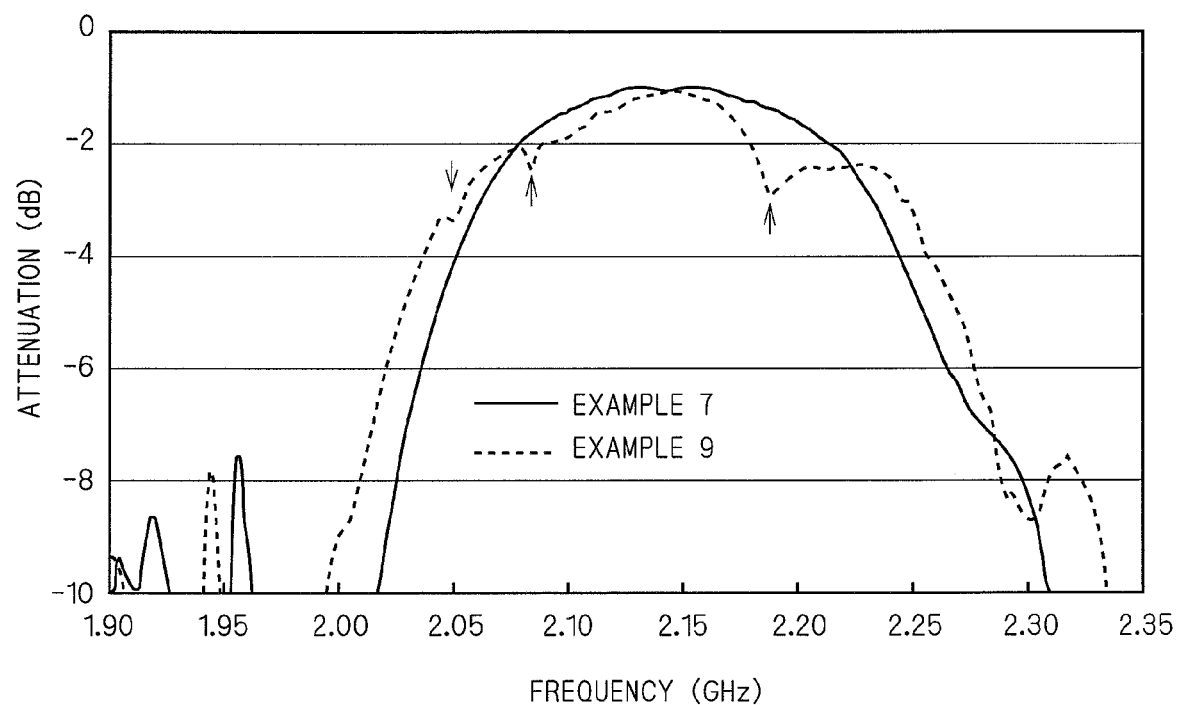
FIG. 56 is a view showing frequency-attenuation characteristics of piezoelectric thin film filters according to Examples 7 and 9.

A frequency-attenuation characteristic of the piezoelectric thin film filter 5 obtained after the formation process for the upper electrode 57 as thus described was measured for estimating a filter wave form, to observe a waveform indicated by a solid line in FIG. 56.

Example 8

In Example 8, the film bulk acoustic resonator was produced in the same practice as in Example 6 except that the weighed portion 471W was not arranged on the upper electrode 471, namely, the film thickness of the upper electrode 471 was made substantially uniform. A frequency impedance characteristic of the film bulk acoustic resonator as thus obtained was measured for estimating a resonance characteristic of the thickness extension vibrations, to observe a waveform as shown in FIG. 55, and an antiresonance resistance was 617 ohms.

Example 9

In Example 9, the piezoelectric thin film filter was produced in the same practice as in Example 7 except that the weighed portions 571W and 572W were not arranged on the upper electrode 571, namely, the film thicknesses of the upper electrodes 571 and 572 are made substantially uniform. A frequency-attenuation characteristic of the piezoelectric thin film filter as thus obtained was measured for estimating a filter waveform, to observe a waveform as indicated by a dotted line in FIG. 56.

Comparison Among Examples 6 to 9

As apparent from FIGS. 54 and 55, arrangement of a weighed portion on an upper electrode of a film bulk acoustic resonator allows reduction in spuriousness superposed on a resonance waveform of the film bulk acoustic resonator and also an increase in an antiresonance resistance to increase a Q value in an antiresonance frequency, while no influence is exerted on main resonance.

Further, as apparent from FIG. 56, arrangement of a weighted portion on the upper electrode of a piezoelectric thin film filter allows reduction in ripples within a band as indicated by arrows in FIG. 56, so as to reduce a passage loss.

Such improvement in characteristics of the piezoelectric thin film device can be obtained in the case of arranging a weighed portion on a lower electrode instead of the upper electrode and also in the case of arranging weighed portions on both the upper and lower electrodes, not to mention in a variety of weighted portions shown in "other examples of weighted portion" and in weighed portions further modified from those.

Moreover, in the fourth embodiment, the film bulk acoustic resonator 4 was described in which the width of the cavity C4 is larger than the width W41 of the opposing region E4, and the outer periphery of the cavity C4 is located outside the opposing region E4, as shown in FIG. 22. However, this does not prevent adoption of a configuration where part or the whole of the outer periphery of the cavity C4 is located inside the opposing region E4 in the film bulk acoustic resonator 4.

Figure 57:
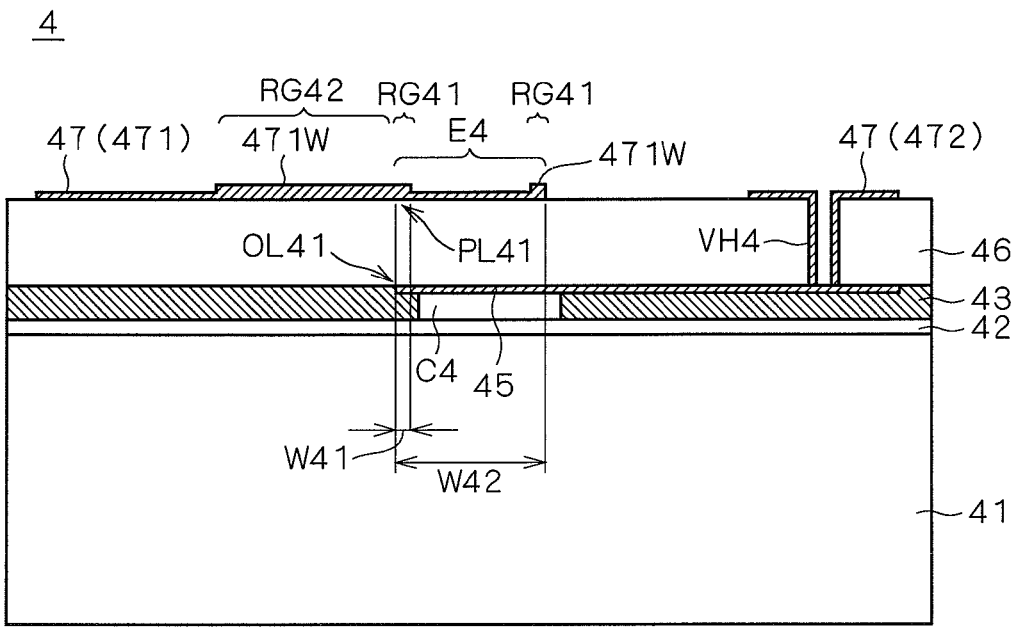
FIG. 57 is a sectional view showing the film bulk acoustic resonator in which one opposite side of a rectangular cavity is located on the inner side of an excitation region.
Figure 58:
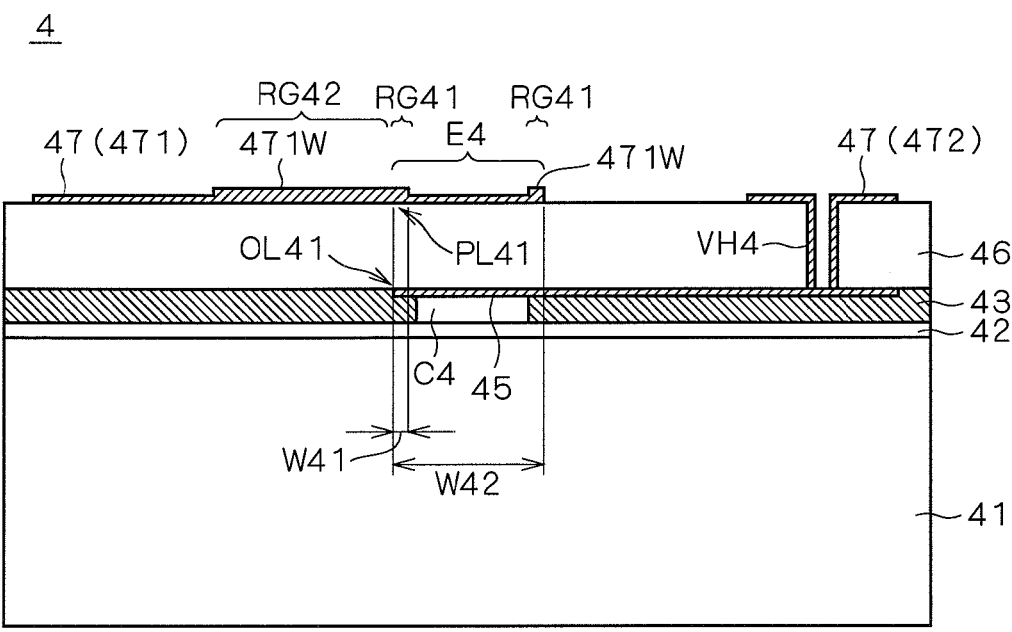
FIG. 58 is a sectional view showing the film bulk acoustic resonator in which both opposite sides of the rectangular cavity are located on the inner side of the excitation region.
Figure 59:
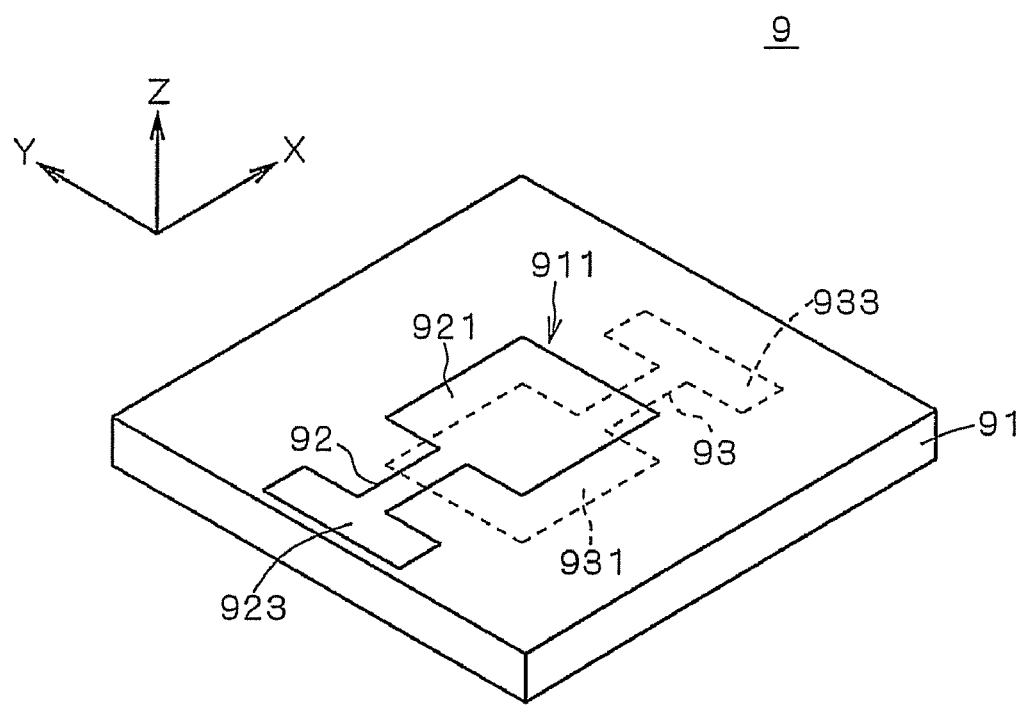
FIG. 59 is a view showing a schematic configuration of a main section of a conventional film bulk acoustic resonator.

For example, as shown in a sectional view of FIG. 57, even when the weighted portion 471W is arranged on the upper electrode 47 in the film bulk acoustic resonator 4 where one of opposite sides of the rectangular cavity C4 is located inside the opposing region E4 or in the film bulk acoustic resonator 4 where both of the opposite sides of the rectangular cavity C4 are located inside the opposing region E4, it is possible to effectively suppress sub resonance.

In the film bulk acoustic resonator 4 where the cavity formation film 43 is formed across both sides of the outer periphery of the opposing region E4, a continuous range from the edge along the inner side of the outer periphery of the opposing region E4 to the outer edge portion along the outer side of the outer periphery of the opposing region E4 is fixed to the support substrate 41 via the cavity formation film 43 and the adhesive layer 42. In the film bulk acoustic resonator 4, in addition to the upper electrode 471, the weight corresponding to film thicknesses of the cavity formation film 43, the adhesive layer 42 and the like is also applied to the lower electrode 45, to allow effective suppression of sub-resonance. It is to be noted that in a case where the end surface of the lower electrode 45 is included in the range, a continuous range from the edge portion along the inner side of the outer periphery of the opposing region E4 to the outer edge portion along the outside of the outer periphery of the opposing region E4 through the end surface of the lower electrode 45 is fixed to the support substrate 41 in a three-dimensional manner, which also contributes to effective suppression of sub resonance in the film bulk acoustic resonator 4.

Modified Examples

Further, although the film bulk acoustic resonator using an electrical response by means of thickness extension vibrations excited by the piezoelectric thin film was described above, a mode other than the thickness extension vibrations, e.g. thickness shear vibrations, is also available.

The technical constitution described in the first to fifth embodiments can be used in combination as appropriate. For example, the pull-out portion of the lower electrode 13 may be replaced by a via hole in the film bulk acoustic resonator 1, or the cavity configuration of the film bulk acoustic resonator 1 may be adopted to the piezoelectric thin film filter 5.

While the invention has been shown and described in detail, the foregoing description is in all aspects illustrative and not restrictive. It is therefore understood that numerous modifications and variations can be devised without departing from the scope of the invention.

What is claimed is:

1. A piezoelectric thin film device including a single or a plurality of film bulk acoustic resonators, the device comprising:
    a piezoelectric thin film; and
    electrodes formed on respective main surfaces of said piezoelectric thin film and having drive sections opposed to each other with said piezoelectric thin film interposed therebetween,
    wherein each respective drive section has a slender two-dimensional shape with magnitude in a longitudinal direction being not less than twice as large as magnitude in a widthwise direction, and
    wherein at least one of said drive sections has a weighted portion with a larger mass per unit area than that of a central portion, only along inner sides of a pair of opposite sides extending in the longitudinal direction.

2. The piezoelectric thin film device according to claim 1, wherein
    said each respective drive section has a slender two-dimensional shape with magnitude in the longitudinal direction being not less than four times as large as magnitude in the widthwise direction.

3. The piezoelectric thin film device according to claim 1, wherein
    said each respective drive section has a slender two-dimensional shape with magnitude in the longitudinal direction being not less than ten times as large as magnitude in the widthwise direction.

4. The piezoelectric thin film device according to claim 1, wherein
    said each respective drive section has a rectangular shape with a long-side length as magnitude in the longitudinal direction being not less than twice as large as a short-side length as magnitude in the widthwise direction.

5. The piezoelectric thin film device according to claim 4, wherein
    each electrode has a pull-out section for pulling out said drive section in a direction perpendicular to a predetermined direction while maintaining a width of said drive section in said predetermined direction.

6. The piezoelectric thin film device according to claim 1, wherein
    said each respective drive section has an oval shape with a long-axis length as magnitude in the longitudinal direction being not less than twice as large as a short-axis length as magnitude in the widthwise direction.

7. The piezoelectric thin film device according to claim 1, wherein
    said each respective drive section has a rectangular shape with the long-side length as magnitude in the longitudinal direction being not less than twice as large as the short-side length as magnitude in the widthwise direction, and
    at least one of said drive sections has said weighted portion only along the inner side of said long side.

8. The piezoelectric thin film device according to claim 1, wherein
    a material for said piezoelectric thin film is any one of lithium niobate and lithium tantalite.

9. The piezoelectric thin film device according to claim 1, further comprising:
    a support for supporting said piezoelectric thin film; and
    an adhesive layer for bonding said piezoelectric thin film to said support.

* * * * *